(12) United States Patent
Sneh

(10) Patent No.: US 6,897,508 B2
(45) Date of Patent: May 24, 2005

(54) INTEGRATED CAPACITOR WITH ENHANCED CAPACITANCE DENSITY AND METHOD OF FABRICATING SAME

(75) Inventor: Ofer Sneh, Broomfield, CO (US)

(73) Assignee: Sundew Technologies, LLC, Broomfield, CO (US)

( * ) Notice: Subject to any disclaimer, the term of this patent is extended or adjusted under 35 U.S.C. 154(b) by 160 days.

(21) Appl. No.: 10/136,490

(22) Filed: Aug. 23, 2002

(65) Prior Publication Data

US 2004/0036051 A1 Feb. 26, 2004

(51) Int. Cl.[7] ............................................. H01L 27/108
(52) U.S. Cl. ......................... 257/301; 438/3; 438/239; 438/680; 438/685; 438/686; 361/311
(58) Field of Search ........................... 438/3, 239, 680, 438/685, 686; 361/311

(56) References Cited

U.S. PATENT DOCUMENTS

| | | | |
|---|---|---|---|
| 4,685,197 A | | 8/1987 | Tigelaar et al. |
| 4,700,457 A | * | 10/1987 | Matsukawa ................ 438/396 |
| 5,021,920 A | * | 6/1991 | Smith ........................ 361/311 |
| 5,047,815 A | | 9/1991 | Yasuhira et al. |
| 5,077,225 A | | 12/1991 | Lee |
| 5,116,776 A | | 5/1992 | Chan et al. |
| 5,223,447 A | | 6/1993 | Lee et al. |
| 6,190,964 B1 | | 2/2001 | Winters |
| 6,660,631 B1 | * | 12/2003 | Marsh ........................ 438/680 |

FOREIGN PATENT DOCUMENTS

| | | |
|---|---|---|
| DE | 100 34 003 A1 | 1/2002 |
| EP | 0 973 201 A1 | 1/2000 |
| JP | 01179443 | 7/1989 |
| JP | 01189949 | 7/1989 |

OTHER PUBLICATIONS

Unknown, "Front End Processes", International Technology Roadmap For Semiconductors, 2001 Edition.

D.E. Kotecki et al., "(Ba, Sr) TiO$_3$ dielectrics for future stacked–capacitor DRAM", IBM Journal of Research and Development, vol. 43, No. 3 (May 1999).

E. Adler et al., "The evolution of IBM CMOS DRAM technology", IBM Journal of Research and Development, vol. 39, No. 12 (1995).

* cited by examiner

Primary Examiner—David Nelms
Assistant Examiner—Mai-Huong Tran
(74) Attorney, Agent, or Firm—Patton Boggs LLP

(57) ABSTRACT

A thin film integrated multilayer capacitor with substantially enhanced capacitance density suitable for Dynamic Random Access Memory (DRAM) and other integrated capacitor applications is formed into a trench or cavity structure with a completely self-aligned atomic layer deposition (ALD) process flow. Each conductor layer is etched with a wet etch to create recesses between the adjacent insulating layers, which recesses are seamlessly filled with dielectric using an ALD process, so that no part of the conductor is ever exposed to ambient atmosphere. Only silicon-based dielectric materials contact the silicon substrate, and the contact area between silicon and the capacitor is minimized both at the top and the bottom. The dielectric layers comprise $Al_2O_3$, $ZrO_2$, or $HfO_2$, which is deposited using an ALD process. Capacitance density is greatly enhanced to a C/∈ of above 1500 fF/$\mu^2$.

65 Claims, 52 Drawing Sheets

US 6,897,508 B2

INTEGRATED CAPACITOR WITH ENHANCED CAPACITANCE DENSITY AND METHOD OF FABRICATING SAME

BACKGROUND OF THE INVENTION

1. Field of the Invention

This invention relates to the area of semiconductor device manufacturing and more specifically to integrated capacitor design and manufacturing and in particular for manufacturing of integrated capacitors for Dynamic Random Access Memory (DRAM) and Radio Frequency (RF) devices.

2. Description of Prior Art

In the manufacture of certain integrated circuits, it is common to use integrated thin film capacitors. In particular, the design of a Dynamic Random Access Memory (DRAM) cell typically includes one transistor and one capacitor per memory cell. In practice, when the capacitor of a particular memory cell has a stored electrical charge, a binary "1" is stored in that memory cell. Conversely, when the capacitor of a particular memory cell does not have a stored charge, a binary "0" is stored in that memory cell. To sustain functionality and dependability of memory devices, fundamental guidelines for memory system and cell design must be observed. The fundamentals of memory system and cell design are generally well established and known in the art. Many good references are available such as DRAM and SRAM, Hisashi Shichijo, ULSI devices, C. Y. Chang and S. M. Sze, Eds., chapter 7, pages 333–375, John Wiley & Sons, New York, N.Y., 2000. Additional insight may be gained from memory design references such as *DRAM Circuit Design, A Tutorial*, Brent Keeth and R. Jacob Baker, IEEE Press, Piscataway, N.J., 2001. Each of the foregoing references are incorporated by reference as though fully disclosed herein. It is well accepted that DRAM capacitors must retain charge in sufficient quantity to allow reliable memory read and write operation. At a minimum, this requires that charge retention time should substantially exceed practical memory refreshing intervals. In addition, storage node (memory cell) capacitance and parasitic leakage current must meet accepted fundamental guidelines. In particular, cell capacitance is generally confined to the range above twenty-five femtoFarads (fF)/cell, and preferably to the range higher than thirty fF/cell, to ensure proper immunity to soft errors and sufficient signal to noise ratio for data readout. In addition, unavoidable leakage of charge from the storage capacitor must generally be maintained on the order of 1 femtoampere (fA) per cell or less. While unavoidable, such leakage must be compensated by periodic charge replenishment, known as "refresh." Accepted specifications for memory cells generally set the refresh interval at 64 msec. By way of example, a thirty fF capacitor is charged with one volt (V), the capacitor holds thirty femtocoulombs (fC) of charge. With approximately one fA of leakage current, such a capacitor loses ~0.064 fC, or, equivalently approximately two millivolts (mV), of charge between successive refresh operations. Accordingly, in the foregoing example, the signal to noise ratio of the capacitor is appropriately retained at all times.

In addition, it is also accepted that cell resistance be kept to below fifty KΩ and preferably below five KΩ to maintain cell RC time constant significantly below two nsec so as to enable approximately ten nanoseconds (nsec) or lower read-write access. Further, guidelines dictate that capacitor design must minimize all sources of parasitic capacitance between the capacitor plates and the bit lines to enable high-Q storage nodes that do not pose practical limitations on overall memory speed and performance.

Early designs of DRAM integrated circuits (ICs) were implemented with planar integrated capacitors. Such simple capacitor designs used a layer of thermally grown silicon dioxide ($SiO_2$) on a layer of doped crystalline silicon that comprised the bottom capacitor electrode, and was known as a bottom capacitor plate. The top capacitor electrodes were implemented typically with a patterned layer of doped polysilicon or metal. In general, the capacitance of such a simple capacitor of this type is given by Equation 1:

$$C = \frac{\varepsilon_r A}{d} \quad (1)$$

where $\varepsilon_r$ is the permitivity of the dielectric layer that separates the capacitor electrodes; $\varepsilon_r = K\varepsilon_0$, where $\varepsilon_0$ is the permitivity of a vacuum; A is the area of the capacitor; and d is the thickness of the dielectric layer.

The evolution of DRAM technology from such simple designs has generally relied upon aggressive increases in the density of memory cells. Historically, such increases in density have led to a ×2–2.5 times reduction in memory cell area every eighteen to twenty-four months. Several approaches have been utilized in attempts to reduce the actual area on the wafer occupied by the memory cell, while maintaining cell capacitance at the required twenty-five to thirty-five fF level. These approaches have included: reducing d, increasing A, and increasing $\varepsilon_r$.

Reducing the thickness (d) of the capacitor dielectric layer, while maintaining the leakage current within acceptable bounds, initially proved useful to attain planar capacitor designs up to the 1 Mb–4 Mb memory generations. Progress up to these levels was enabled by the use of improved dielectric growth techniques which made possible thinner and better insulating $SiO_2$. Beginning with 4 Mb–16 Mb generations of memory technology, further increases in capacitance density (per actual wafer area) was achieved primarily through the advent of three dimensional (3D) capacitor designs.

Area (A) enhancement has been pursued in two primary approaches. The first approach involves constructing the capacitor over the maximized area that could be confined within the memory cell. In this approach, the passing transistor is manufactured on the wafer. The gate electrode and a passing word line are fabricated on the wafer surface with a gap between them allowing contact with the drain region of the transistor. The capacitor is produced over most of the area above the gate word line and the passing word line. The storage plate of the capacitor is interconnected to the transistor drain to complete the cell architecture. This circuit architecture is known as "stacked" capacitor design and has been implemented over the years with a variety of different approaches for the sort and shape of the area enhancement, the makeup of the contact with the drain area, the makeup of the contact with the bit line, etc.

Early stacked capacitor designs attempted to increase capacitance by stacking multiple layers of conducting and insulating films where conducting films are linked to construct multiple parallel capacitors. This approach was popular in the early days of stacked capacitor designs. Many different stacked capacitor designs and fabrication methods were invented to address the inherent difficulties of connecting interleaved conductive layers within the framework of monolithic ICs. Prominent examples of this design may be found within U.S. Pat. Nos. 4,685,197, 4,700,457, 5,021,920, 5,077,225, 5,116,776 and 6,190,964. However, none of these designs and methods were proven to be effective enough to become commercially established. While all of the designs succeeded in stacking multiple layers of alternating conductive and dielectric layers, the problems arose because the alternate conductive layers in such a capacitor must be oppositely charged. No one has yet been able to connect to the alternate layers with a high yield integrated process that results in a capacitor in which significant opposite voltages can be reliably applied to the alternate layers and in which the charge can be applied rapidly enough that the capacitor is useful in a fast memory.

Many derivations on the stacked capacitor design have been implemented with varying degrees of success, such as crown, double crown, fins, etc. Of these designs, the design known as "crown" has become popular in recent years. A crown capacitor is constructed over a hollow cylinder with a typical height of approximately one $\mu$m. The design of the crown capacitor makes use of both the internal and external area of the cylinder to gain an additional factor of area enhancement. For sub-micron memory cells using a crown design, most of the capacitance is gained at the walls of the crown rather than the bottom. Drain contacts for crown design capacitors have transitioned from hollow polysilicon plug designs into simple stud designs.

Additional area enhancement of approximately thirty to one hundred percent has been achieved by roughing the surface of the capacitor plates in a variety of etching or grainy deposition techniques. Of these, the growth of Hemispherical Grained Silicon (HSG) has become common in the industry. The use of HSG is now recognized as a means to extend conventional stacked capacitor technology with silicon electrodes (plates) and silicon based dielectrics into the range of 128 Mb–512 Mb technology nodes.

However, as stated by the 2001 International Roadmap for Semiconductor Technology (ITRS), included here by reference, conventional stacked capacitor technology has reached the limit of extendibility at the 512 Mb technology generation. Further extensions for stacked capacitor technology have been made by increases in permitivity ($\in_r$) and some minor reduction of dielectric layer thickness (d). However, these extensions have been made possible only by replacing traditional dielectric material such as silicon oxynitride, conventionally called "NO" dielectrics, and stacked $SiO_2/Si_3N_4$ or $SiO2/Si_3N_4/SiO_2$, conventionally called "ONO" dielectrics, with higher K metal-oxides. According to the ITRS, further extension of stacked capacitor technology now relies on replacement of dielectric and electrode materials with each new generation of capacitor in an attempt to increase $\in_r$. This development path is highly undesirable and presents challenges unprecedented in the history of semiconductor technology.

The second approach for area enhancement involves producing the capacitor inside a substantially deep trench (DT) that is etched into the silicon wafer. This so called "trench" or "DT" capacitor design places the memory cell transistor and capacitor side by side on the silicon wafer. While trench design was initially viewed as fundamentally less effective than stacked design, trench etch technology has evolved to make the production of trenches with effective area enhancement in excess of ×100 commercially available.

Further improvement of trench memory cell design and isolation technology involves placing a "passing" word line above the trench, thus further improving the efficiency of wafer area utilization. Other advances in trench technology have improved cell design efficiency by implementing vertical transistors manufactured on the wall of the trench. Vertical transistor architectures serve to decouple transistor design from dimensional scaling, permitting the utilization of long channel transistors that are advantageous for improved charge retention times and cell reliability. Further area enhancement has been achieved with bottle shaped trenches and may be further extended by the usage of HSG.

However, the existing techniques for area enhancement, including stack, crown and trench designs are quickly reaching their technical limits. For example, as the surface area utilized by each capacitor decreases, size of the features of the capacitor must also, in many cases, be decreased. In the case of the crown design, as the surface area occupied by each capacitor decreases, the area (A) of the capacitor is maintained only if the features of the capacitor are grown successively higher to compensate for the loss in surface area. As this trend continues, crown capacitor designs are projected to become successively more fragile to the point that additional feature size reduction requires significant height reduction. Accordingly, eventual replacement of existing cylindrical storage nodes with a shallow trench design (known as MSCC) and finally with a pillar design (known as M-Box) is predicted before 1 Gb technology can be achieved. Despite these design changes, height limitations dictate that the height of the storage node will shrink from the currently used 1 $\mu$m to <0.6 $\mu$m. Concurrently, limitations on the conformality of deposition technology on such ever-decreasing surface areas will force phasing out the benefit of using HSG.

Clearly, this trend of area enhancement loss makes advances of stacked capacitor technology highly obstinate. Accordingly, there is a growing concern that stacked capacitor technology may hit a definite dead-end upon transition into 2 Gb technology. While the short-term prospects of trench technology are somewhat better, trench technology is also expected to follow the same path of uncertainty and need for radical changes following the transition into 1 Gb–2 Gb technology. In addition, trench technology is incompatible with any foreseen implementation of paraelectric dielectric materials such as BST and accordingly does not have even a theoretically defined path for extendibility beyond 4 Gb technology.

Accordingly, while stack, crown and trench capacitor technology may be positioned to extend conventional memory manufacturing technology into the 1 Gb technology generations, there is no clear defined path for further extension of such technology up to and beyond the 64 Gb generation.

Given that attempts at area enhancement and dielectric thickness reduction are reaching their technical limits, the industry has, as noted above, been forced to turn to achieving increases in dielectric constant ($\in_r$). Such an aggressive trend to increase $\in_r$ is viewed as necessary to compensate for the limitations being realized with existing area enhancement techniques. However, efforts to achieve substantial increases in $\in_r$ have thus far been unsuccessful. In particular, increasing $\in_r$ is generally achieved by fabricating the films that make up DRAMs from new and different materials. Introducing new film materials necessarily requires introduction of new process steps into the DRAM fabrication process and integration of these new steps into the existing DRAM process flow. DRAM process flow and process integration are composed of literally hundreds of essential processing steps. These processing steps have been developed and perfected over the years to be optimized and compatible with each other. Any introduction of new processing steps must comply with established specifications for process flow and process integration. Accordingly, the introduction of any new film materials into the DRAM design, and the deposition and etching techniques that must be integrated into the DRAM fabrication process to deposit these films, has proven to be an extremely difficult and restrictive process. The enormous cost and development time involved with this process, and the complexity of developing and optimizing the DRAM process flow for these new materials, has thus far generally proven to outweigh any gains realized from this approach.

The ITRS reveals that sustained progress in DRAM evolution will require a different dielectric material, and possibly electrode material, every year. With the evolution of DRAM memory capacitor technology requiring yearly changes to materials and designs, the future prospects for gains using such methods are, in many cases, projected to be outweighed by the technical complexity and financial cost of implementing these methods. In addition, many of the materials on which this evolution is planned to rely are currently impossible to realize for thin films. By way of example, extension beyond 4 Gb technology is predicted to depend upon the availability of ferroelectric materials and respective alloy electrodes. Such materials are unlikely to be appropriate for memory capacitor due to their Dielectric Relaxation (DR) effect. DR accounts for time dependence deterioration of charge storage that could dictate extended read-write and refresh timings, making memory access unacceptably slow. To date, ferroelectric materials, as well as some high dielectric constant materials, often referred to as "high-K" materials, have been shown to be inappropriate for DRAM applications due to severe DR effect.

While such technical and financial barriers are not necessarily insurmountable, they are likely to adversely impact cost and development time and may render the technology unacceptably complex and expensive for commercial implementation. Accordingly, there is a need for DRAM capacitor technology that is extendable to the 64 Gb node and beyond. In particular, there is a fundamental urgent need for a ×4 or more enhancement of capacitance density that can smooth the transition into high-K dielectric technology. There is a further need for a technology that will sustain maximum area enhancement as DRAM technology advances. In addition, there is a need to find a path for capacitor technology that could be realized with conventional high-K dielectric materials with K in the range from eight to thirty avoiding the uncertainty and complexity of implementing paraelectric and ferroelectric dielectrics.

It is also crucial that any technology satisfying these needs also complies with existing process flow and integration, and circumvents thermal budget issues by enabling construction of a thermodynamically stable layer stack. It is also critical that such a method allows materials to be deposited by low temperature processes so as to minimize impact on existing process flow and thermal budget and be compatible with the thermal budget and conventional DRAM process integration.

In addition, it is advantageous that any such method limit selection of electrode and dielectric materials to include elements that are already comprised in the buildup of semiconductor devices, such as Al, W and Ti, as introduction of new elements into semiconductor fabrication environment typically requires costly cross-contamination prevention and resolution. It is crucial that the foregoing be accomplished while maintaining or improving upon fundamental specifications for capacitance/cell, resistance/cell and leakage current/cell.

It is also desirable that such a process provides for self-alignment since lithography steps, and especially front-end lithography steps, are increasingly becoming a major source of increased cost and misalignment-related reduced yield that in turn further increase the cost of production per good die.

While integrated capacitors find great usage within DRAM technology, there are also other implementations of monolithic capacitors in IC technologies, such as for RF applications, analog ICs, decoupling capacitors in the interconnect layers of ICs, etc. It is therefore also advantageous that any such advances in capacitor design be applicable in these and other areas beyond DRAM technology.

SUMMARY OF THE INVENTION

It is the general objective of the present invention to provide a capacitor and method of making such a capacitor with substantially increased capacitance per unit area. It is a further objective of the present invention to provide an integrated circuit and a method of fabricating an integrated circuit which includes such an integrated capacitor. A more specific objective is to produce DRAM capacitors with substantially increased capacitance per area. It is another objective of our method to fabricate the capacitor with self-aligned techniques. It is yet another objective of our method and process to minimize the impact of capacitor manufacturing on the overall thermal budget of the process flow. It is an additional objective of the method to be able to sustain the thermal budget of the entire process flow without or with minimum changes to the process flow. It is yet another objective of the invention to provide seamless integration of capacitor fabrication process flow and capacitor materials with existing conventional integrated circuit manufacturing techniques.

An additional aspect of the preferred embodiment of our invention is preferably implemented without introducing new elements into the fabrication line. It is also the intention of the newly designed capacitor architecture to obtain or overachieve specifications for cell capacitance, leakage current and storage node resistance. It is our objective to sustain these specifications without or with minimized resolve to change of materials or design concepts and to sustain compatibility with conventional memory manufacturing process flow. It is also our objective to provide a path for increased capacitance, capacitance density or charge retention time in multiple IC technologies. It is also the objective of our invention to keep fabrication cost and complexity of next generation capacitors under predictable and reasonable limits. Finally, it is the objective of our invention to extend DRAM capacitor technology to the 64 Gb generation and beyond using moderate high-K dielectric materials with dielectric constant in the range of from eight to thirty.

The invention overcomes the problems of the prior art and obtains the above objectives by providing a multilayer capacitor architecture and process for making such a capacitor. The multilayer capacitor is preferably formed in a chamber such as a deep trench in a semiconducting substrate, a cavity in an insulator, or other enclosure. The alternate electrodes of the capacitor are electrically isolated from one another and excellent ohmic connections are made to the electrodes by judicious use of a highly conformal deposition process, such as atomic layer deposition (ALD), sacrificial layers, in situ deposition of dielectrics immediately after deposition of the conductors, anisotropic etching, and isotropic etching. It should be understood that while the combination of all of these elements leads to capacitors with greatly enhanced capacitance density, in developing the complete process a number of different significant advances in the integrated circuit fabrication art were made, each of which is independently useful and highly inventive in its own right.

The invention provides a method of fabricating an integrated circuit, the method comprising: forming a multilayer capacitor comprising a stack of N+1 conductive electrodes interleaved with N dielectric layers, wherein N is an integer equal to two or greater; wherein the step of forming comprises atomic layer deposition. Preferably, forming comprises forming one of the dielectric layers utilizing the atomic layer deposition. Preferably, forming comprises: etching one of the conductive electrode layers to form a recess having a depth and width substantially equal to the thickness of the one of the conductive electrode layers; and the forming the one of the dielectric layers comprises filling the recess using the atomic layer deposition. Preferably, forming comprises: etching one of the layers to form a recess; and the forming comprises filling the recess using the atomic layer deposition. Preferably, the recess has a depth and width substantially equal to the thickness of the one of the layers. Preferably, the atomic layer deposition comprises depositing a filling layer having a thickness equal to one-half the width of the recess, while filling the recess. Preferably, forming further comprises etching the filling layer to substantially remove it from all of the integrated circuit except the recess. Preferably, forming comprises fabricating each of the N+1 conductive electrode layers and each of the N dielectric layers using a self-aligned process. Preferably, forming comprises fabricating the N+1 conductive electrode layers and the N dielectric layers without using a photolithographic process. Preferably, the method further comprises forming a chamber having an open end, the chamber having a width substantially equal to the width of the open end and a depth extending away from the open end, wherein the ratio of the depth to the width is equal to four or greater; and the step of forming comprises forming the multilayer capacitor in the chamber. Preferably, the ratio is twenty-five or more. More preferably, the ratio is fifty or more. Preferably, the chamber is a trench formed in the integrated circuit. Preferably, the method further comprises providing a semiconductor substrate, and the forming comprises forming the trench in the semiconductor substrate. Preferably, the substrate is silicon and the forming comprises fabricating a silicon dielectric comprising silicon in contact with the silicon semiconductor substrate. Preferably, the silicon dielectric comprises an oxide/nitride/oxide (ONO) structure. Preferably, the only dielectric in contact with the silicon substrate is the silicon dielectric. Preferably, at least one of the N dielectric layers comprises a high dielectric constant material. Preferably, the one of the N dielectric layers comprises an oxide selected from the group consisting of $Al_2O_3$, $ZrO_2$, and $HfO_2$. Preferably, forming comprises fabricating a first of the N+1 conductive electrodes in contact with silicon only in the horizontal area at the bottom of the trench. Preferably, the method further comprises forming an ohmic contact between the first conductive electrode and the silicon semiconductor substrate. Preferably, the method further comprises fabricating a polysilicon element in electrical contact with a second of the conducting electrode layers, and wherein the contact area between the polysilicon layer and the second conducting electrode is limited to a horizontal area near the top of the trench. Preferably, the method further comprises fabricating a transistor and the polysilicon element connects the second conductive electrode with the transistor. Preferably, forming comprises forming the multilayer capacitor in a sufficiently small area of the integrated circuit such that the value of $C/\in$ is greater than or equal to 500 femtoFarads per square micron, where C is the capacitance of the multilayer capacitor and $\in$ is the effective dielectric constant of the dielectric layers, defined as the ratio between the permitivity of the dielectric layer and the permitivitiy of vacuum. More preferably, $C/\in$ is greater than or equal to 1000 femtoFarads per square micron. Most preferably, $C/\in$ is greater than or equal to 1500 femtoFarads per square micron. Preferably, forming a stacked structure comprises forming a stacked structure comprising the following layers in sequence: silicon/silicon oxide/metal/insulator/metal/insulator/metal, wherein the N+1 conductive electrodes comprise the metal layers and the N dielectric layers comprise the insulator layers. Preferably, forming a stacked structure comprises forming a stacked structure comprising the following layers in sequence: silicon/silicon-oxide/metal/insulator/metal/insulator/metal/insulator/metal/insulator/metal. Preferably, forming comprises electrically connecting the odd numbered ones of the N+1 conductive electrodes and electrically connecting the even numbered ones of the N+1 conductive electrodes. Preferably, at least one of the N dielectric layers comprises a high dielectric constant material. Preferably, the one of the N dielectric layers comprises an oxide selected from the group consisting of $Al_2O_3$, $ZrO_2$, and $HfO_2$. Preferably, forming comprises depositing each of the N dielectric layers over the preceding conductive electrode layer without exposing the preceding conductive electrode layer to atmosphere. Preferably, one of the N+1 metal electrodes comprises tungsten. Preferably, all of the N+1 metal electrodes comprise tungsten. Preferably, one of the N dielectric layers comprises an oxide selected from the group consisting of $Al_2O_3$, $ZrO_2$, and $HfO_2$.

The invention also provides a method of fabricating an integrated circuit comprising: forming a recess having an open end; and filling the recess using atomic layer deposition. Preferably, forming comprises forming the recess with the open end facing upwards. Preferably, forming comprises forming the recess with the open end facing in a horizontal direction. Preferably, the recess has a width across the open end and the atomic layer deposition comprises depositing a filling layer having a thickness equal to one-half of the width of the recess, while filling the recess. Preferably, the method further comprises etching the filling layer to substantially remove it from all of the integrated circuit except the recess. Preferably, etching comprises an isotropic etch. Preferably, forming comprises depositing a first layer and a second layer over the first layer; exposing a portion of the first layer; and etching the first layer to form the recess having a depth and width substantially equal to the thickness of the first layer.

In another aspect, the invention provides a method of fabricating an integrated circuit comprising: forming a recess; and depositing atomic layers in the recess until the thickness of the atomic layers is substantially one-half of the width of the recess.

In a further aspect, the invention provides a method of fabricating an integrated circuit, the method comprising: providing a substrate; creating a trench in the substrate; forming in the trench a multilayer capacitor comprising a stack of N+1 conductive electrodes interleaved with N dielectric layers, wherein N is an integer equal to two or greater, wherein the forming is a self-aligned process. Preferably, at least one of the N dielectric layers comprises a high dielectric constant material. Preferably, forming comprises: depositing one or more of the conductive electrode and dielectric layers in the trench while leaving a portion of the trench unfilled; plugging the unfilled portion of the trench with a protective sacrificial material; etching the sacrificial material and the upper portion of the deposited one or more layers; and removing the sacrificial material while leaving the unetched portion of the deposited one or more layers on the walls of the trench. Preferably, plugging comprises filling the unfilled portion of the trench with the protective sacrificial material. Preferably, the deposited one or more layers comprises a first conductive electrode and a second conductive electrode and the Fmethod further comprises encapsulating the first conductive electrode to protect it from the etch. Preferably, forming comprises: depositing one or more of the conductive electrode and dielectric layers in the trench while leaving a portion of the trench unfilled; depositing a protective sacrificial material over the one or more deposited layers; anistropically etching a horizontal portion of the sacrificial material to expose a horizontal portion of the one or more deposited layers while leaving a vertical portion on the walls of the trench protected; removing the exposed horizontal portion of the one or more layers while leaving the unetched portion of the deposited one or more layers on the walls of the trench. Preferably, one of the N+1 metal electrodes comprises tungsten. Preferably, one of the N dielectric layers comprises an oxide selected from the group consisting of $Al_2O_3$, $ZrO_2$, and $HfO_2$.

In yet a further aspect, the invention provides a method of fabricating an integrated circuit, the method comprising: providing a substrate; creating a trench in the substrate; forming in the trench a multilayer capacitor comprising a stack of N+1 conductive electrodes interleaved with N dielectric layers, wherein N is an integer equal to two or greater, wherein the forming comprises fabricating the N+1 conductive electrode layers and the N dielectric layers without using a photolithographic process.

In still a further aspect, the invention provides a method of fabricating an integrated circuit comprising: creating a chamber having an open end, the chamber having a width substantially equal to the width of the open end and a depth extending away from the open end, wherein the ratio of the depth to the width is equal to four or greater; and forming in the chamber a multilayer capacitor comprising a stack of N+1 metal electrodes interleaved with N dielectric layers, wherein N is an integer equal to two or greater. Preferably, the ratio is twenty-five or more. Preferably, the ratio is fifty or more. Preferably, the chamber is a trench formed in the integrated circuit. Preferably, the method further comprises providing a semiconductor substrate, and the creating comprises creating the trench in the semiconductor substrate. Preferably, the substrate is silicon and the forming comprises fabricating a silicon dielectric comprising silicon in contact with the silicon semiconductor substrate. Preferably, the silicon dielectric comprises an oxide/nitride/oxide (ONO) structure. Preferably, the only dielectric in contact with the silicon substrate is the silicon dielectric. Preferably, forming comprises depositing each of the N dielectric layers over the preceding metal electrode layer without exposing the preceding conductive electrode layer to atmosphere. Preferably, forming comprises fabricating a first of the N+1 metal electrodes in contact with silicon only in the horizontal area at the bottom of the trench. Preferably, the method further comprises forming an ohmic contact between the first metal electrode and the silicon semiconductor substrate. Preferably, the method further comprises fabricating a polysilicon element in electrical contact with a second of the metal electrode layers, and wherein the contact area between the polysilicon layer and the second metal electrode is limited to a horizontal area near the top of the trench. Preferably, the method further comprises fabricating a transistor and the polysilicon element connects the second conductive electrode with the transistor. Preferably, forming comprises forming the multilayer capacitor in a sufficiently small area of the integrated circuit such that the value of $C/\in$ is greater than or equal to 500 femtoFarads per square micron, where C is the capacitance of the multilayer capacitor and $\in$ is the effective dielectric constant of the dielectric layers. More preferably, $C/\in$ is greater than or equal to 1000 femtoFarads per square micron. Most preferably, $C/\in$ is greater than or equal to 1500 femtoFarads per square micron. Preferably, forming comprises forming the following layers in sequence: silicon/silicon-oxide/metal/insulator/metal/insulator/metal, wherein the N+1 metal electrodes comprise the metal layers and the N dielectric layers comprise the insulator layers. Preferably, forming comprises forming the following layers in sequence: silicon/silicon-oxide/metal/insulator/metal/insulator/metal/insulator/metal. Preferably, at least one of the N dielectric layers comprises a high dielectric constant material. Preferably, at least one of the N dielectric layers comprises a high dielectric constant material. Preferably, forming comprises electrically connecting the odd numbered ones of the N+1 metal electrodes and electrically connecting the even numbered ones of the N+1 metal electrodes.

In yet a further aspect, the invention provides an integrated circuit comprising: a chamber having an open end, the chamber having a width substantially equal to the width of the open end and a depth extending away from the open end, wherein the ratio of the depth to the width is equal to four or greater; and a multilayer capacitor formed in the chamber, the multilayer capacitor comprising a stack of N+1 metal electrodes interleaved with N dielectric layers, wherein N is an integer equal to two or greater. Preferably, the ratio is twenty-five or more. More preferably, the ratio is fifty or more. Preferably, the chamber is a trench formed in the integrated circuit. Preferably, the integrated circuit further comprises a semiconductor substrate, and wherein the trench is formed in the semiconductor substrate. Preferably, the substrate is silicon and the integrated circuit includes a silicon dielectric comprising silicon in contact with the silicon semiconductor substrate. Preferably, the silicon dielectric comprises an oxide/nitride/oxide (ONO) structure. Preferably, the only dielectric in contact with the silicon substrate is the silicon dielectric. Preferably, a first of the N+1 metal electrodes is in contact with silicon only in the horizontal area at the bottom of the trench. Preferably, the silicon dielectric further comprises an ohmic contact between the first metal electrode and the silicon semiconductor substrate. Preferably, the integrated circuit further comprises a polysilicon element in electrical contact with a second of the metal electrode layers, and wherein the contact area between the polysilicon layer and the second metal electrode is limited to a horizontal area near the top of the trench. Preferably, the integrated circuit further comprises a transistor and the polysilicon element connects the second conductive electrode with the transistor. Preferably, the multilayer capacitor covers a sufficiently small area of the integrated circuit such that the value of $C/\in$ is greater than or equal to 500 femtoFarads per square micron, where C is the capacitance of the multilayer capacitor and $\in$ is the effective dielectric constant of the dielectric layers. Preferably, $C/\in$ is greater than or equal to 1000 femtoFarads per square micron. Most preferably, $C/\in$ is greater than or equal to 1500 femtoFarads per square micron. Preferably, the integrated circuit comprises the following layers in sequence: silicon/silicon-oxide/metal/insulator/metal/insulator/metal, wherein the N+1 metal electrodes comprise the metal layers and the N dielectric layers comprise the insulator layers. Preferably, the sequence comprises silicon/silicon-oxide/metal/insulator/metal/insulator/metal/insulator/metal/insulator/metal. Preferably, at least one of the insulator layers comprises a high dielectric constant material. Preferably, at least one of the N dielectric layers comprises a high dielectric constant material. Preferably, one of the N+1 metal electrodes comprises tungsten. Preferably, all of the N+1 metal electrodes comprise tungsten. Preferably, one of the N dielectric layers comprises an oxide selected from the group consisting of $Al_2O_3$, $ZrO_2$, and $HfO_2$. Preferably, the odd numbered ones of the N+1 metal electrodes are electrically connected and the even numbered ones of the N+1 metal electrodes are electrically connected.

In yet another aspect, the invention provides a method of fabricating an integrated circuit comprising: forming a multilayer capacitor comprising a stack of N+1 conductive electrodes interleaved with N dielectric layers, wherein N is an integer equal to two or greater, wherein the forming comprises depositing each of the N dielectric layers over the preceding conductive electrode layer without exposing the preceding conductive electrode layer to atmosphere. Preferably throughout the process of completing the integrated circuit after deposition of the conductive electrode, the conductive electrode is exposed to atmosphere only during etch steps, and immediately thereafter again encapsulated with a protective layer. Preferably, the conductive electrode comprises a metal.

The invention also provides, in a further aspect, a method of fabricating an integrated circuit comprising forming a multilayer capacitor comprising a stack of N+1 conductive electrodes interleaved with N dielectric layers, wherein N is an integer equal to two or greater, wherein the forming comprises forming the multilayer capacitor in a sufficiently small area of the integrated circuit such that the value of C/∈ is greater than or equal to 500 femtoFarads per square micron, where C is the capacitance of the multilayer capacitor and ∈ is the effective dielectric constant of the dielectric layers. Preferably, C/∈ is greater than or equal to 1000 femtoFarads per square micron. More preferably, C/∈ is greater than or equal to 1500 femtoFarads per square micron.

In still another aspect, the invention provides an integrated circuit comprising a multilayer capacitor comprising a stack of N+1 conductive electrodes interleaved with N dielectric layers, wherein N is an integer equal to two or greater, wherein C/∈ is greater than or equal to 500 femtoFarads per square micron, where C is the capacitance of the multilayer capacitor and ∈ is the effective dielectric constant of the dielectric layers. Preferably, C/∈ is greater than or equal to 1000 femtoFarads per square micron. More preferably C/∈ is greater than or equal to 1500 femtoFarads per square micron. Preferably, one of the N+1 metal electrodes comprises tungsten. Preferably, all of the N+1 metal electrodes comprise tungsten. Preferably, one of the N dielectric layers comprises an oxide selected from the group consisting of $Al_2O_3$, $ZrO_2$, and $HfO_2$. Preferably, all of the N dielectric layers comprise an oxide selected from the group.

In yet an additional aspect, the invention provides a method of fabricating an integrated circuit including a multilayer capacitor comprising a stack of N+1 metal electrodes interleaved with N dielectric layers, wherein N is an integer equal to two or greater, the method comprising forming a stacked structure comprising the following layers in sequence: silicon/silicon-oxide/metal/insulator/metal/insulator/metal, wherein the N+1 metal electrodes comprise the metal layers and the N dielectric layers comprise the insulator layers. Preferably, forming a stacked structure comprises forming a stacked structure comprising the following layers in sequence: silicon/silicon-oxide/metal/insulator/metal/insulator/metal/insulator/metal/insulator/metal. Preferably, the method further comprises electrically connecting one of the metal electrodes and the silicon with an ohmic contact. Preferably, at least one of the N dielectric layers comprises a high dielectric constant material. Preferably, forming comprises electrically connecting the odd numbered ones of the N+1 metal electrodes and electrically connecting the even numbered ones of the N+1 metal electrodes. Preferably, one of the metal electrodes comprises tungsten. Preferably, one of the insulators comprises an oxide selected from the group consisting of $Al_2O_3$, $ZrO_2$, and $HfO_2$.

In still an additional aspect, the invention provides an integrated circuit of the type including a multilayer capacitor comprising a stack of N+1 metal electrodes interleaved with N dielectric layers, wherein N is an integer equal to two or greater, the improvement wherein the integrated circuit includes a stacked structure comprising the following layers in sequence: silicon/silicon-oxide/metal/insulator/metal/insulator/metal, wherein the N+1 metal electrodes comprise the metal layers and the N dielectric layers comprise the insulator layers. Preferably, the stacked structure comprises the following layers in sequence: silicon/silicon-oxide/metal/insulator/metal/insulator/metal/insulator/metal/insulator/metal. Preferably, the integrated circuit further comprises an ohmic contact between one of the metal electrodes and the silicon. Preferably, at least one of the insulator layers comprises a high dielectric constant material. Preferably, one of the insulator layers comprises an oxide selected from the group consisting of $Al_2O_3$, $ZrO_2$, and $HfO_2$. Preferably, all of the N insulator layers comprise an oxide selected from the group. Preferably, the oxide comprises $Al_2O_3$. Preferably, the oxide comprises $ZrO_2$. Preferably, the oxide comprises $HfO_2$. Preferably, one of the N+1 metal electrodes comprises tungsten. Preferably, all of the N+1 metal electrodes comprise tungsten. Preferably, one of the insulator layers comprises an oxide selected from the group consisting of $Al_2O_3$, $ZrO_2$, and $HfO_2$. Preferably, all of the insulator layers comprise an oxide selected from the group. Preferably, the odd numbered ones of the N+1 metal electrodes are electrically connected and the even numbered ones of the N+1 metal electrodes are electrically connected. Preferably, at least a portion of the layers are stacked horizontally.

In yet another aspect, the invention provides an integrated circuit of the type including a multilayer capacitor comprising a stack of N+1 metal electrodes interleaved with N dielectric layers, wherein N is an integer equal to two or greater, the improvement wherein one of the N+1 metal electrodes comprises tungsten. Preferably, all of the N+1 metal electrodes comprise tungsten. Preferably, one of the N dielectric layers comprises an oxide selected from the group consisting of $Al_2O_3$, $ZrO_2$, and $HfO_2$. Preferably, one of the N dielectric layers comprises an oxide selected from the group consisting of $Al_2O_3$, $ZrO_2$, and $HfO_2$. Preferably, all of the N dielectric layers comprise an oxide selected from the group. Preferably, the oxide comprises $Al_2O_3$. Preferably, the oxide comprises $ZrO_2$. Preferably, the oxide comprises $HfO_2$.

In still an additional aspect, the invention provides an integrated circuit of the type including a multilayer capacitor comprising a stack of N+1 metal electrodes interleaved with N dielectric layers, wherein N is an integer equal to two or greater, the improvement wherein one of the N dielectric layers comprises an oxide selected from the group consisting of $Al_2O_3$, $ZrO_2$, and $HfO_2$. Preferably, all of the N dielectric layers comprise an oxide selected from the group.

Preferably, the oxide comprises $Al_2O_3$. Preferably, the oxide comprises $ZrO_2$. Preferably, the oxide comprises $HfO_2$.

In still another aspect, the invention provides a method of fabricating an integrated circuit having a multilayer capacitor, the method comprising: providing a silicon substrate; preparing a trench in the silicon substrate; with a substantially conformal technique such as atomic layer deposition (ALD), fabricating a four-layer stack comprising a silicon based dielectric layer $D_1$, a conductive layer $M_1$, a dielectric layer $D_2$, and a sacrificial layer; anisotropically etching the sacrificial layer from bottom and top of the trench to create openings to the $D_2$ layer; selectively etching the $D_2$ layer and the $M_1$ layer at the openings to create recesses; and filling the recesses using a substantially conformal technique. Preferably, filling comprises depositing the insulator to a thickness that exceeds half the thickness of the recesses. Preferably, the method further comprises removing the insulator from all areas except the recesses, leaving insulating plugs inside the recesses, thereby encapsulating the $M_1$ layer. Preferably, the method further comprises selectively removing the $D_1$ layer from the bottom of the trench to expose the silicon substrate and forming a thermally stable contact layer on the silicon. Preferably, the method further comprises: using a substantially conformal technique, forming a conductive layer $M_2$ and a dielectric layer $D_3$, with the conductive layer $M_2$ electrically connected to the contact layer; depositing a second sacrificial layer and recessing it below the top of the trench to a level $L_1$; selectively etching layers $D_3$ and $M_2$ to create a second recess; and removing the second sacrificial layer. Preferably, the method further comprises applying a second insulating layer using a substantially conformal technique to fill the second recess. Preferably, the method further comprises: depositing a third sacrificial layer and recessing it below the top of the trench to a level $L_2$ that is higher than the $L_1$ level; performing a selective etch to expose layer $M_1$; and depositing a conductive layer $M_3$ to form an integrated capacitor with conductive layers $M_1$ and $M_3$ interconnected and layer $M_2$ connected to the substrate contact. Preferably, the method further comprises fabricating a metal/polysilicon mediation layer; and forming a polysilicon layer in contact with the mediation layer. Preferably, the trench includes a collar and the multilayer capacitor and the mediation layer are formed below the collar. Preferably, the method further comprises, prior to formation of the $D_1$ layer, processing the silicon substrate to serve as a capacitor common plate, whereby a stack of silicon/$D_1$/$M_1$ forms a first integrated capacitor.

In still an additional aspect, the invention provides a method of fabricating an integrated circuit having a trench formed in a silicon substrate and a first electrical component formed in the trench, the electrical component including a metal electrode, the method comprising: fabricating a mediation layer in contact with the metal electrode; depositing a polysilicon layer in contact with the mediation layer; and completing the integrated circuit to form a second electrical integrated circuit component in contact with the polysilicon layer. Preferably, fabricating a mediation layer comprises forming a material selected from the group consisting of a silicide and a metal nitride. Preferably, the metal electrode comprises a tungsten plug.

In yet another aspect, the invention provides an integrated circuit having a trench formed in a silicon substrate and a first electrical component formed in the trench, the electrical component including a metal electrode, the improvement comprising: a mediation layer in contact with the metal electrode; a polysilicon layer in contact with the mediation layer; and a second electrical integrated circuit component in contact with the polysilicon layer. Preferably, the mediation layer comprises a material selected from the group consisting of a silicide and a metal nitride. Preferably, the metal electrode comprises a tungsten plug.

In still a further aspect, the invention provides a method of fabricating an integrated circuit, the method comprising: providing a partially completed integrated circuit wafer having a three-dimensional structure formed on it, the three-dimensional structure having horizontal surfaces and vertical surfaces; depositing a sacrificial layer; etching the sacrificial layer from the horizontal surfaces; patterning the horizontal surfaces while the vertical surfaces remain protected by the sacrificial layer; and removing the sacrificial layer. Preferably, the three-dimensional structure comprises a cavity and the horizontal surfaces include lower horizontal surfaces within the cavity and upper horizontal surfaces not within the cavity, and wherein depositing a sacrificial layer comprises filling the structure with a sacrificial material; etching comprises etching the sacrificial material from the upper horizontal surfaces while leaving the lower horizontal surfaces covered by the sacrificial layer; and patterning comprises patterning only the upper horizontal surfaces. Preferably, etching comprises an anisotropic etch.

The invention not only provides a multilayer capacitor having a much higher capacitance per unit area, but provides one that is highly reliable, can be made without any lithographic processes, and is compatible with conventional integrated circuit processing. The above and other advantages of the present invention may be better understood from a reading of the following description of the preferred exemplary embodiments of the invention taken in conjunction with the following drawings.

BRIEF DESCRIPTION OF THE DRAWINGS

The accompanying drawings, which are incorporated in and form a part of the specifications, illustrate the preferred embodiment of the present invention, and together with the description serve to explain the principles of the invention. In the drawings.

DETAILED DESCRIPTION OF THE PREFERRED EMBODIMENT

The present invention involves a process for the fabrication of an integrated capacitor and the structure of such a capacitor. An integrated capacitor is a multilayer capacitor stack formed from conductive electrode layers interleaved with dielectric layers in which the conductive electrode layers are interconnected to form multiple parallel-interconnected capacitors. The electrode and dielectric layers are thin films. Here, "thin film" is used in the sense in which it is used in the integrated circuit art. That is, a thin film is a film a micron or less thick, and more preferably one-half micron or less thick. The electrode and dielectric layers herein are most preferably one hundred nanometers (nm) or less thick. The integrated capacitor of the invention shall be primarily described in terms of a capacitor formed in a trench. However, it will be evident that the same capacitor can be formed in any cavity or other chamber.

Figure 1:
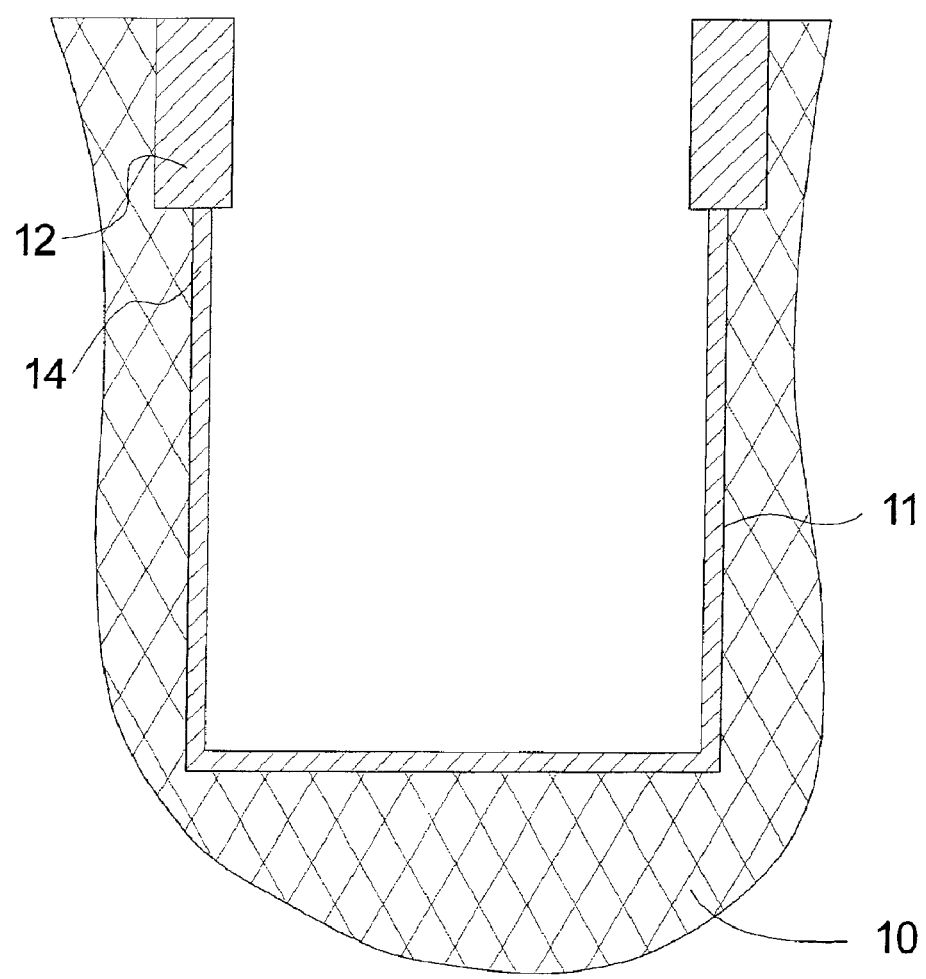
FIG. 1 shows a bottle-shaped deep trench (DT) of the present invention in a substrate.

The integrated capacitors of the present invention are formed on a substrate, which is preferably a semiconductor wafer or an insulator. Terms of orientation herein, such as "upward", "downward", "above", "top", "upper", "below", "bottom" and "lower" mean relative to semiconductor substrate 10 (FIG. 1). That is, if a second element is "above" a first element, it means it is farther from the substrate; and if it is "below" another element, then it is closer to semiconductor substrate 10 than the other element. Terms such as "above" and "below" do not, by themselves, signify direct contact of one layer with an underlying layer. The long dimension of semiconductor substrate 10 defines a plane that is considered to be a "horizontal" plane herein, and directions perpendicular to this plane are considered to be "vertical". The terms "lateral" or "laterally" refer to the direction of the flat plane of the thin film, that is, parallel to the horizontal direction.

Figure 15:
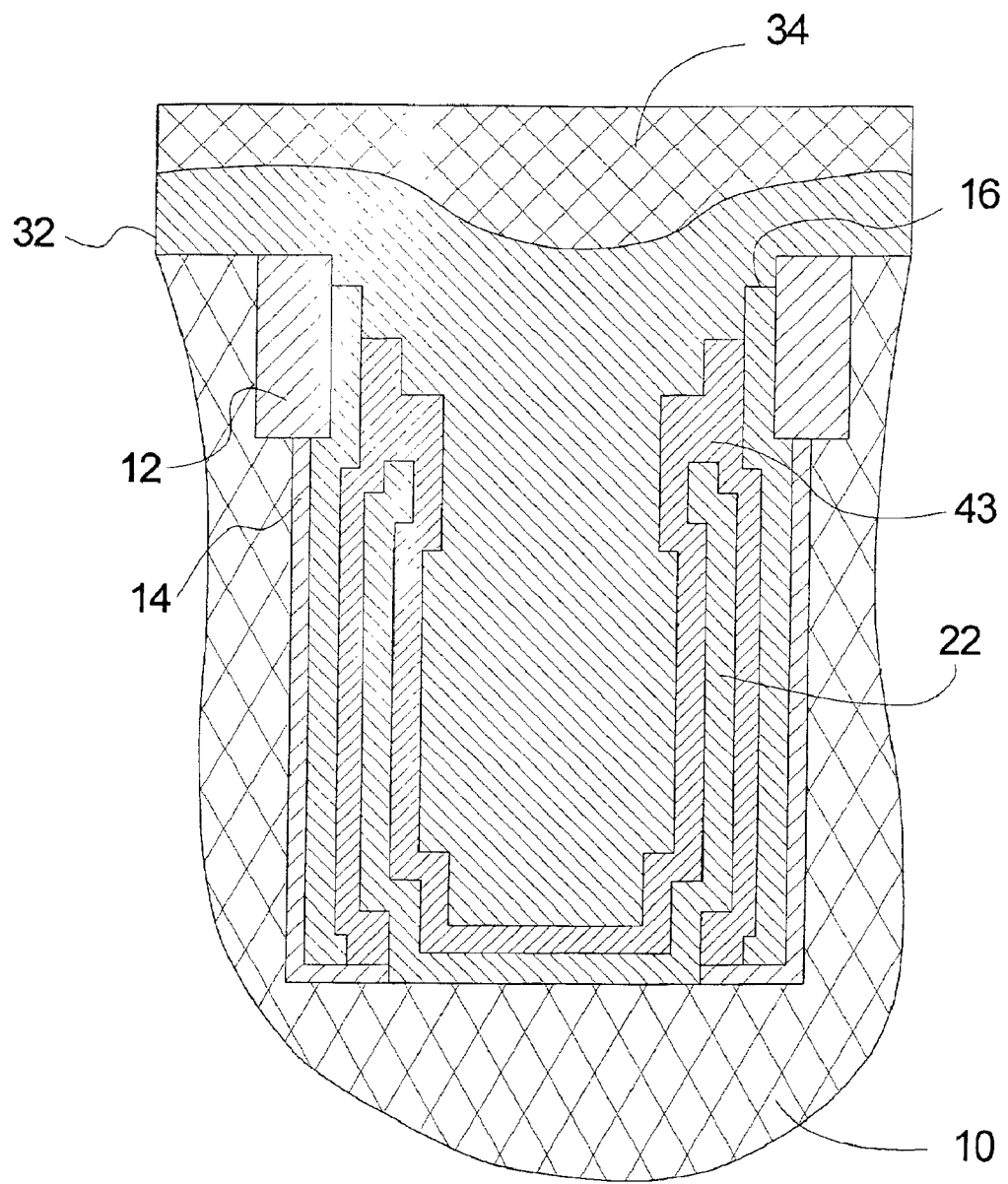
FIG. 15 illustrates an alternative preferred embodiment of the process of FIG. 14.

It should also be understood that the term "substrate" is often used ambiguously in the art of integrated circuits. Often it is used to refer to the silicon, gallium arsenide, or other wafer, such as 10 of FIG. 1, on which the integrated circuit is fabricated. Sometimes the term is used to refer to the incomplete portion of the integrated circuit on which a particular layer is formed. For example, in this sense, the "substrate" on which capacitor layer 34 in FIG. 15 is formed, is, in general terms, the completed capacitor and metalization through layer 32. At other times, the word "substrate" is used to mean the immediate layer on which a material is formed. In this sense, layer 32 is the immediate substrate on which layer 34 is formed. In this specification, the term "substrate" is used broadly to mean any layer on which another layer is formed.

Figure 52:
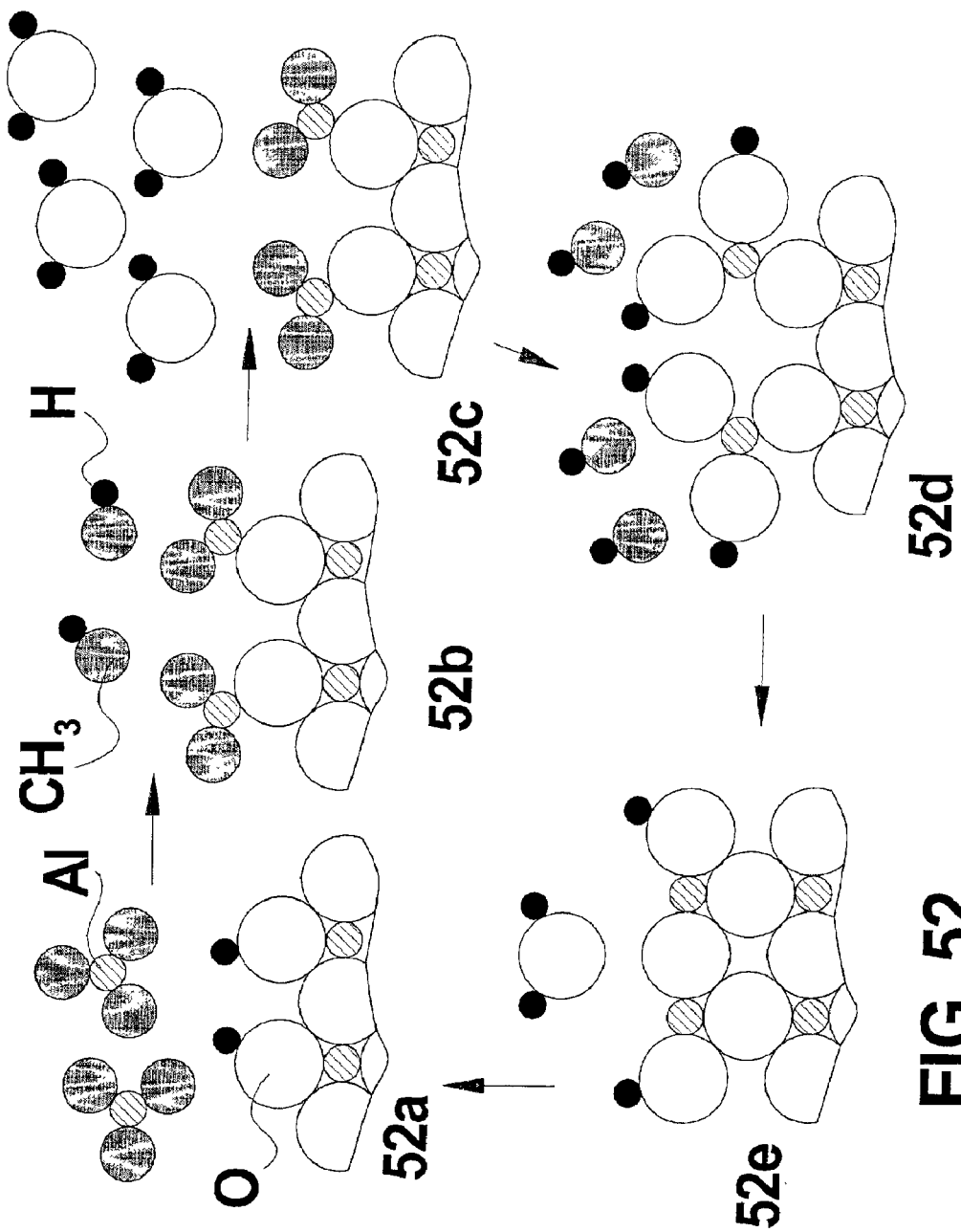
FIG. 52 illustrates the mechanism of an $Al_2O_3$ ALD process.

It should be understood that FIGS. 1–52 illustrating various integrated circuit portions are not intended to be actual plan or cross-sectional views of any particular portion of an actual capacitor or integrated circuit device, but are merely idealized representations which are employed to more clearly and fully depict the structure and process of the invention than would otherwise be possible. For example, the thickness of the various thin films are not to scale, since otherwise the figures would be either unreadable or so large as to not fit on a single sheet. As another example, generally, as known in the art, corners are not square as shown and other such variations of shapes are common.

The method taught by the present invention involves a series of self-aligned etch and deposition steps in which the conductive layers are deposited and interconnected to form capacitors. In one embodiment, the present invention teaches the fabrication of a trench or cavity capacitor. In this embodiment, the present invention teaches that a capacitor is formed by first generating a dielectric layer in a trench formed in a silicon substrate. Following this step, a conductive layer is deposited atop the dielectric layer. A second dielectric layer is then generated atop the conductive layer. The conductive layer is then recessed to form a gap between the two dielectric layers. An insulating dielectric layer is next deposited in the gap formed by the recess in the conductive layer. The insulating layer serves to plug the recess in the conductive layer and, in combination with the other dielectric layers, surround the conductive layer with a conformal, seamless layer of insulating dielectric material.

Additional capacitors may then be fabricated atop the single capacitor structure and interconnected in parallel to form a stack of parallel interconnected capacitors. In such an embodiment, the deposition and recessing process described above with regard to the single capacitor design are first iterated to fabricate additional capacitor structures. Once fabricated, the conductive layers of the capacitor structures are alternately interconnected to form a set of multiple capacitors connected in parallel. In particular, one set of interconnections is formed between the odd numbered conductive electrodes (first, third, fifth, etc.) at the bottom of the trench, and a second set of interconnections is formed between even numbered conductive electrodes at the top of the trench.

A capacitor of the present invention is thus referred to herein as a Capacitor LAyered Super Stack (or "CLASS") capacitor, where the number of parallel capacitors in the particular capacitor of the present invention appears as a superscript. For example, a three-capacitor stack of the present invention is referred to herein as a $CLASS^3$ capacitor. In the CLASS capacitors, the specific conductive layers are indicated by an "M" with a subscript indicating their respective order of deposition, which generally is the bottom of the stack or the portion of the stack closest to the side of the trench, cavity or other chamber; for example, $M_1$ is the first conductive electrode, starting from the bottom, $M_2$ is the second, and so on. Similarly, the dielectric layers are indicated by a "D" with a subscript indicating the position from the bottom of the stack; for example, $D_2$ is the second capacitor dielectric layer.

It will be appreciated by one of average skill in the art that the capacitance enhancement factor of a stack of parallel interconnected capacitors fabricated using the method of the present invention may be increased by implementing a larger number of capacitors in the stack. In particular, the capacitance enhancement factor (E) for a stack of N capacitors of the present invention (a $CLASS^n$ capacitor) is represented by Equation 2 below:

$$E = \sum_{i=1}^{N} \frac{\varepsilon_i d_{SiO_2}}{\varepsilon_{SiO_2} d_i} \quad (2)$$

where the N capacitors are fabricated from an interleaved stack of N+1 conductive layers and N dielectric layers, $\varepsilon_i$, $d_i$, $d_{SiO_2}$, are the dielectric constant of the ith dielectric layer, the thickness of the ith dielectric layer, and the thickness of the SiO$_2$ layer, respectively, of a conventional capacitor.

However, in practice, the typical width of the chamber, such as a trench or cavity, in which the capacitor is formed will normally limit the maximum number of parallel interconnected capacitors that can be formed in the trench, and thereby limit the capacitance enhancement factor provided by the stack of capacitors. By way of example, a typical trench used in DRAM design may become limited to a stack of three parallel interconnected capacitors in the 64 Gb generation. By way of continuing example, a three-capacitor stack of the present invention (a CLASS$^3$ capacitor) produced with two high-K dielectric insulating layers, one ONO dielectric layer, and three conductive layers on silicon, will have a capacitance enhancement factor (E) described by Equation 3 below:

$$E = 1 + 2 \frac{\varepsilon_{high-K} d_{SiO2}}{\varepsilon_{SiO2} d_{high-K}} \quad (3)$$

In the foregoing example, the CLASS$^3$ capacitor is comprised of stacked one MOS capacitor and two MIM capacitors. It will be appreciated by one of average skill in the art that the particular MOS+2MIM configuration of a capacitor of the present invention eliminates the need to interface silicon with high-K dielectrics. Removing the obstacle of integrating the silicon-high-K contact and reducing to a manageable minimum the silicon-metal contact substantially alleviates limitations on compatibility with the thermal budget of subsequent memory fabrication process flow. Further, with the proper choice of conductive materials and dielectric materials, MIM stacks that are thermodynamically stable ensure the stability of the complete MIMIMOS stack. An example of such a capacitor is one having the following materials in a stack: Si/ONO/W/Al$_2$O$_3$/W/Al$_2$O$_3$/W. As known in the art, the forgoing notation designates a sequence of the designated materials with the bottom most material on the left and the uppermost material on the right. In this disclosure, "high dielectric constant" or "high K" means a dielectric factor, K, of 7 or higher.

The materials used to fabricate capacitors of the present invention are preferably selected from combinations of dielectric and conductive materials that are thermodynamically stable. In particular, combinations in which the metal-oxide composing the dielectrics are more thermodynamically stable than the metal-oxide of the conductors avoid reduction of dielectrics by the conductors. By way of example, Al$_2$O$_3$ is more thermodynamically stable than most other common metal oxides and accordingly it is preferable to use Al$_2$O$_3$ with any practical metal or metal nitride, such as Ti, TiN, W, Mo, Ta, etc. In contrast, SiO$_2$ is more stable than only certain metal oxides. Thus, it is not preferable to use SiO$_2$ with many conductive materials such as Ti, TiN, Ta, etc., but is preferable to use SiO$_2$ with W, Mo, Ru, etc. In addition to the thermodynamics of oxidation-reduction, materials must also be considered on their thermal stability under possible fabrication conditions, for example, 1000° C. for a duration of sixty seconds. Such consideration renders materials such as Al undesirable. Alloying considerations are not important in the present invention except when Si, Sn and In are considered. Finally, spontaneous oxidation sensitivity is one consideration that is very much relaxed by the present invention. Accordingly, oxidation sensitive conductors such as W or Ti are not excluded from use in the present invention if used in combination with an appropriate dielectric layer, such as Al$_2$O$_3$.

As noted above, the fabrication method disclosed by the present invention includes the deposition of films that exhibit a high conformality and the creation of seamless gap filling layers of insulating dielectric material. In the embodiments of the present invention described herein, atomic layer deposition (ALD) is preferably used to deposit such films. Atomic layer deposition (ALD) is a process in which processes similar to chemical vapor deposition (CVD) processes are applied in a series of repetitive deposition cycles to deposit layers of thin film on a substrate. In ALD, the deposition thickness per cycle is precisely and reproducibly dictated by a self-saturation mechanism that is inherent to the ALD process. The elements composing the film are delivered as molecular precursors and the deposition is the outcome of chemical reactions between molecular precursors and the surface of the substrate. The net reaction deposits the pure desired film and eliminates the "extra" atoms, such as ligands, that compose the molecular precursors.

In the case of CVD, molecular precursors are fed simultaneously into the CVD reactor. The substrate is kept at a temperature that is optimized to promote chemical reaction between the molecular precursors concurrent with efficient desorption of byproducts, so that the byproducts do not incorporate into the film. The reaction thus proceeds to deposit the desired pure film on the substrate. However, in the case of ALD, the molecular precursors are introduced into the ALD reactor separately. In particular, the precursors are flowed into the reaction chamber one at a time. For example, the first precursor may include a volatile metal precursor, -ML$_x$, where M is a metal element, for example, Al, W, Ta, Si, etc., and L is an atomic or molecular ligand, for example, CH$_3$, Cl, F, C$_4$H$_{11}$, etc., bonded to M.

The metal precursor proceeds to react with the surface of the substrate. Accordingly, an ALD reaction will take place only if the surface of the substrate has been prepared to react directly with the molecular precursor. The surface of the substrate is typically prepared to include hydrogen-containing ligands -AH that are reactive with the metal precursor. The metal precursor thus proceeds to react with all of the ligands on the surface and to deposit a layer of the metal with its passivating ligand as described by Equation 4, below:

substrate-AH+ML$_x$→substrate-AML$_{x-1}$+HL    (4)

where HL is the surface reaction byproduct. During the reaction, the initial surface ligands, such as -AH, are consumed and the surface becomes covered with L ligands that cannot further react with the metal precursor. Therefore, as noted above, the ALD reaction self-saturates when all the initial ligands are replaced with -ML$_{x-1}$ species.

After completing the metal precursor reaction, the excess precursor is typically removed from the reaction chamber with an inert gas purge prior to the introduction of another precursor.

The second type of precursor is used to restore the surface reactivity of the substrate to the metal precursor by, for example, eliminating the L surface termination and redepositing AH surface species. ALD is commonly applied to deposit compound films. In such a case, the second precursor is composed of a desired, usually nonmetallic, element -A, for example, O, N, S, Se, or As, and hydrogen using, for example, $H_2O$, $NH_3$, or $H_2S$. In this case, the reaction proceeds to convert the surface back to be AH covered, as described by Equation 5, below:

$$-ML+AH_y \rightarrow M-AH+HL. \tag{5}$$

For the sake of simplicity, the chemical reactions in Equation 5 are not balanced. It will be appreciated that the desired additional element, A, is deposited and the ligands L are eliminated as volatile byproduct. As with the initial reaction, this reaction consumes the reactive sites, this time the L terminated sites, and self-saturates when the reactive sites are entirely depleted.

The sequence of surface reactions in which the surface conditions are restored to their initial conditions is called the "ALD deposition cycle". The ALD deposition cycle is the keystone of ALD and provides ALD with the ability to deposit films in equal metered sequences that are identical in chemical kinetics, deposition per cycle, composition and thickness. Self-saturating surface reactions make ALD insensitive to transport nonuniformity either from flow nonuniformity or surface topography, i.e., deposition into high aspect ratio structures. As a result, the nonuniform flux of chemicals into the reaction chamber can, at most, only result in different completion times at different areas of the substrate. However, if each of the reactions is allowed to complete on the entire area, the different completion kinetics bears no penalty.

By way of example, the ALD reactions for $Al_2O_3$ are shown in FIG. 52 for purposes of demonstrating the fundamental ALD deposition cycle. The ALD reactions are shown below in Equations 6 and 7:

$$2 \times \text{substrate-OH} + 2Al(CH_3)_3 \rightarrow 2 \times \text{substrate-O—Al(CH}_3)_2 + 2CH_4 \tag{6}$$

$$2 \times \text{substrate-O—Al(CH}_3)_2 + 3H_2O \rightarrow \text{HO-substrate-O-substrate-OH} + 4CH_4 \tag{7}$$

In this example, the constant deposition per cycle is driven by restoring the surface to have two surface OH sites by the end of the cycle for every two OH sites that existed at the beginning of the cycle.

As illustrated in FIG. 52, the second reaction is made up of several fundamental steps. Initially, in step 52a, an OH terminated $Al_2O_3$ surface is exposed to $Al(CH_3)_3$. The reaction is driven by the generation of volatile $CH_4$ byproduct and attaches one —$Al(CH_3)_2$ per each —OH, as shown in step 52b. The reaction saturates when the OH species are eliminated, since $Al(CH_3)_3$ cannot react with —$CH_3$ terminated surface. Excess $Al(CH_3)_3$ is removed prior to the subsequent $H_2O$ exposure, as shown in step 52(c). The $H_2O$ reaction is driven by the generation of volatile $CH_4$ byproduct and converts surface —$CH_3$ species into surface OH, as shown in step 52(d). The reaction saturates when all —$CH_3$ species are converted into —OH species. Finally, thermodynamics of $Al_2O_3$ stoichiometry and reduction of surface free energy both drive excessive OH coverage to condense into volatile $H_2O$ molecules, creating lateral Al—O—Al cross-linking bonds and reducing the OH coverage at the end of the cycle (shown in step 52(e)) to be identical to the OH coverage at the start of the sequence in step 52(a). This process is driven by the thermodynamic stability of the Al:O ratio with a 2:3 stoichiometry. Excess $H_2O$ is removed and the sequence is repeated to grow $Al_2O_3$ film up to the desired thickness.

It will be appreciated that ALD offers many advantages over other more conventional techniques, such as CVD. ALD films can be uniquely grown continuously on substrates avoiding inferior discontinuous transition caused by nucleation. As a result, ALD films grow pinhole free and practically stress free. In contrast, other deposition techniques initiate film growth by nucleation. Nucleation results with only partial bonding between the substrate and the growing film. In the case of CVD, for example, molecular precursors attach to the surface mainly by CVD reactions between the reactive precursors on the surface. Nucleation is followed by the growth of grains. When the grains finally coalesce into continuous films, the thickness could be on the order of 50 Å–100 Å in the case of CVD and even thicker in the case of PVD. Films initiated by nucleation exhibit substantial compressive stress and abundance of pinholes that extend far beyond coalescence depth.

ALD films can grow continuously at any thickness, provided that the surface of the substrate is made reactive to one of the ALD precursors, as described above, i.e., $ML_x$ or $AH_y$. In this case, ALD films can be grown with layer-by-layer continuity all the way from the interface. The ability to initiate the surface and start layer-by-layer growth from the first layer makes ALD films continuous, low stress and pinhole free. Together with the ultimate conformality that results from the self-saturating nature of the ALD processes, continuity of ultrathin ALD films makes ALD best suitable for challenging thin film deposition applications, such as memory DTs.

The exceptional thickness control and uniformity provided by ALD provides for consistent conductive layer thickness that determines consistent width of recessed gaps. It will be appreciated by one of average skill in the art that, while the embodiment of the present invention described herein makes substantial usage of ALD, other fabrication methods, particularly those possessing the ability to deposit conformal layers into trench and cavity features and to close gaps with conformal coating, may be employed.

As noted above, the present invention is preferably directed to the fabrication of trench or cavity capacitors. In one embodiment, the present invention is applied to deep trench (DT) capacitors. Current DT technology provides that the capacitor is manufactured inside a deep trench that is etched into a silicon wafer. The silicon wafer typically includes a highly conductive $p^+$ layer buried beneath an upper lightly-doped p-well layer on the surface of the wafer. The $p^+$ layer and the p-well layer are typically separated by an $n^-$ doped layer. In practice, the ground contact for the DT capacitor is thus made through the wafer into the buried $p^+$ layer.

Referring now to FIGS. 1–17 a process flow is shown for the manufacturing of a CLASS[3] DT capacitor with enhanced capacitance density according to one embodiment of the present invention. It will be appreciated by one of average skill in the art that, for the sake of simplicity, the DTs illustrated in the figures are schematic representations of actual DTs. In practice, DTs are substantially deeper than they are wide, and have aspect ratios on the order of 40 and even more. In the future, DT aspect ratios are projected to grow up to and exceed 100 as the 64 Gb generation is reached. It should be understood that the dimensions provided herein are for purposes of example only and that the present invention is equally applicable to trenches having aspect ratios and measurements different from those given.

As shown in FIG. 1, a trench 11 is preferably etched into substrate 10. By way of example, the trench may be etched to a depth of ~8 $\mu$m (in the case of 512 Mb technology) and is typically elliptically shaped at the top, which includes an elliptical collar 12 formed from, for example, $SiO_2$. By way of continuing example, the dimensions of collar 12 may be 0.2 μm and 0.4 μm on the short and long axis of the ellipse, respectively. Below collar 12, the trench widens to create a wider opening throughout most of the depth of the trench. This architecture is referred to in the art as a bottle-shaped trench and provides additional enhancement of surface area on the walls of the trench. In the present example, the shape of the bottle under the collar is rectangular, and has dimensions of approximately 0.22×0.44 μm. After cleaning substrate 10 by conventional techniques, a layer of ONO dielectric 14 is grown on the surface of the substrate by conventional techniques.

Figure 2:
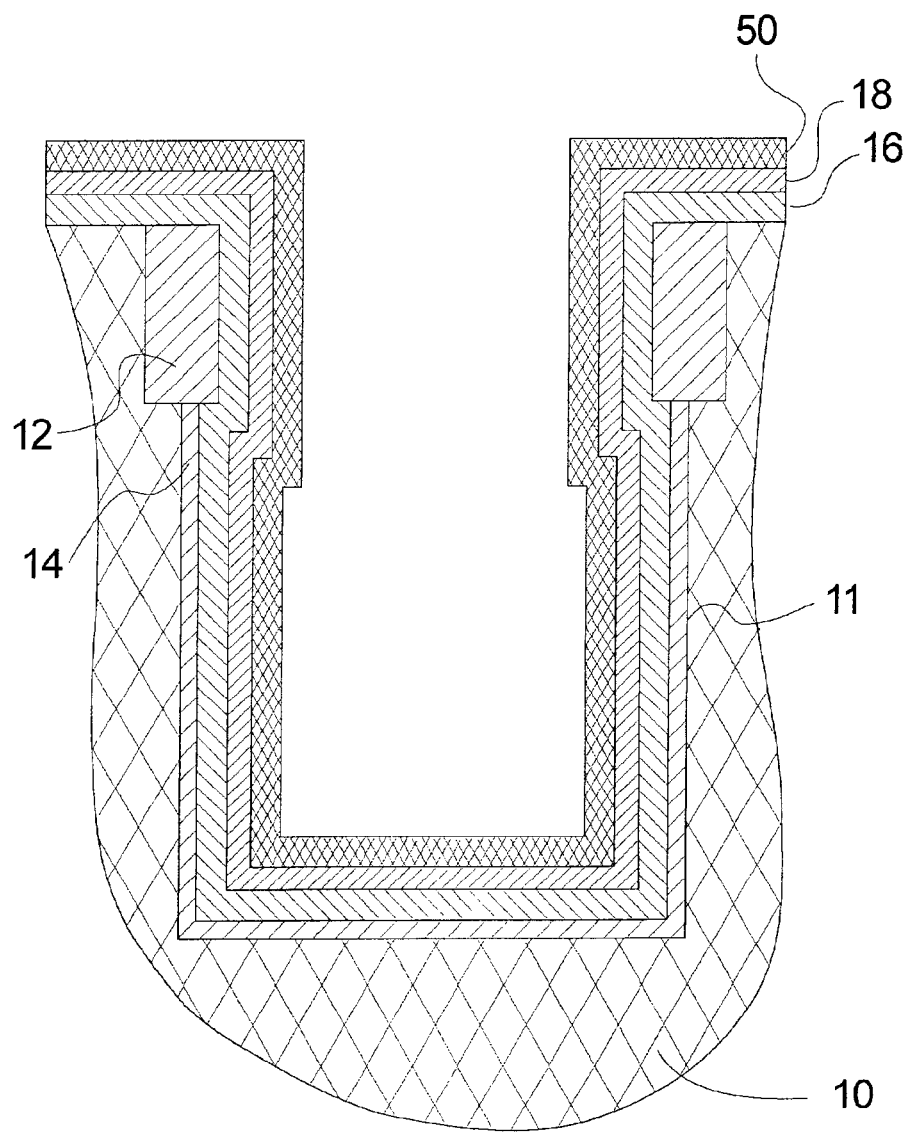
FIGS. 2–14 illustrate a preferred embodiment of a process for fabricating a multilayer capacitor in the trench of FIG. 1.

As shown in FIG. 2, the substrate is then covered with a conductive layer 16. Conductive layer 16 is preferably conformal over the entire area of the wafer including vertical and re-entrant walls inside the DT. Further, conductive layer 16 preferably exhibits very low stress in all areas including convex and concave corners. By way of example, conductive layer 16 may be a layer of W deposited by ALD or other equivalent technique to a thickness of five nm. In an alternative embodiment, a layer of TiN (not shown) may be deposited over dielectric layer 14 by ALD to a depth of several tenths of a nanometer to improve the interface between conductive layer 16 and dielectric layer 14.

A layer of dielectric material 18 is next deposited atop conductive layer 16. By way of example, dielectric layer 18 may be comprised of a high-K material such as $Al_2O_3$. Dielectric layer 18 is preferably conformal over its entire area and possesses a high degree of uniformity. The step of depositing dielectric layer 18 is preferably performed insitu with the previous conductive layer 16, that is, on the same integrated process cluster tool as the previous conductive layer 16 without ambient exposure to avoid oxidation or contamination of conductive layer 16. By way of further example, dielectric layer 18 may be deposited by ALD or other equivalent technique to a thickness of 5 nm. To improve the interface with conductive layer 16, a layer of TiN (not shown) may be deposited by ALD to a depth of several tenths of a nanometer on dielectric layer 18. The layer of TiN is preferably included as part of the integrated process without ambient exposure.

Following the deposition of dielectric layer 18, a sacrificial layer 50 is preferably grown on top of dielectric layer 18. Sacrificial layer 50 is preferably conformal over its entire area and possesses a high degree of uniformity. By way of example, sacrificial layer 50 may be formed from W deposited by ALD or other equivalent technique. Although an insitu process is not crucial to the deposition of sacrificial layer 50, convenience and simplicity dictate that sacrificial layer 50 is preferably produced together with conductive layer 16 and dielectric layer 18.

Figure 3:
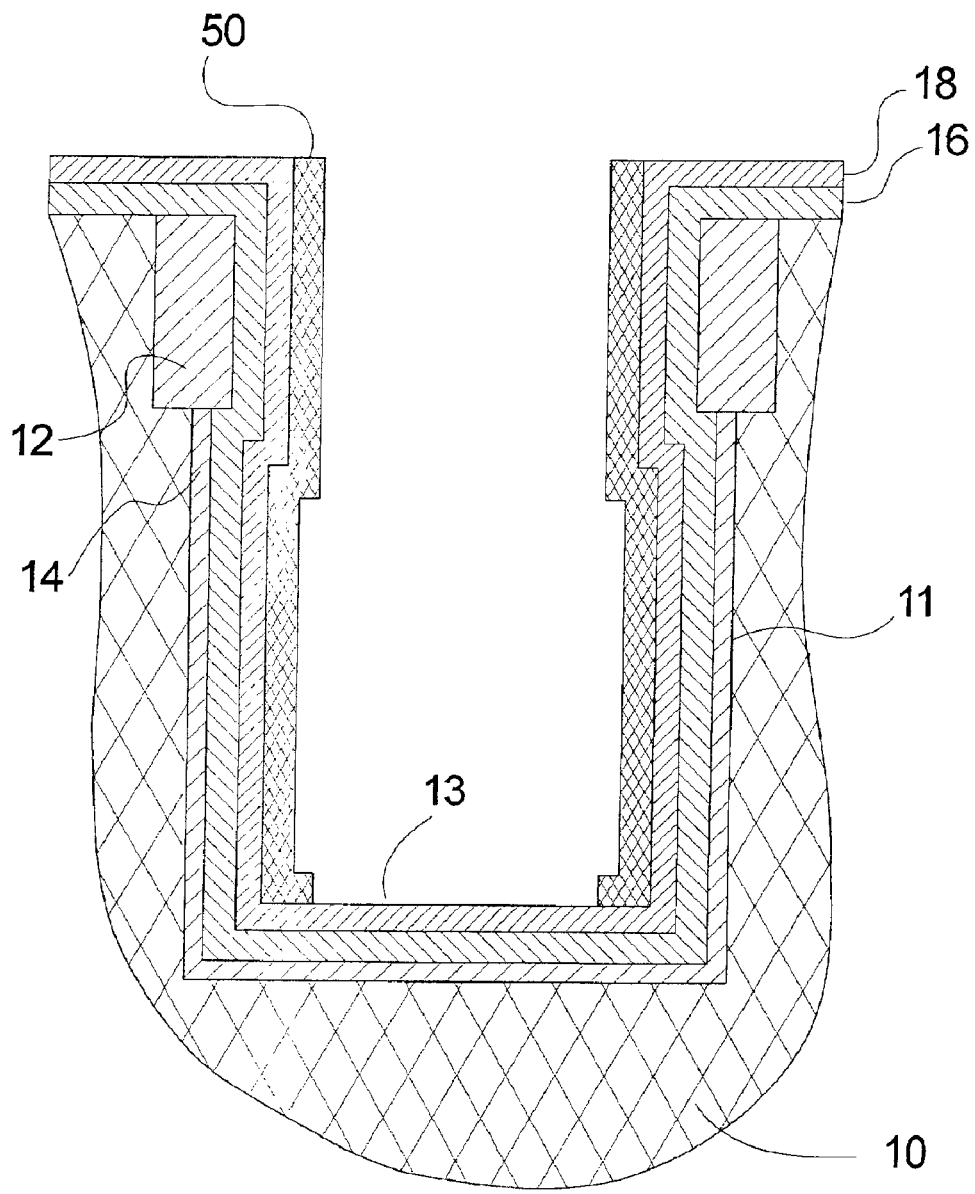

As shown in FIG. 3, anisotropic etch is next applied on substrate 10 to open sacrificial layer 50 at the bottom of trench 11 and to remove a portion 13 of sacrificial layer 50 deposited on the surface of substrate 10. In the present example, the opening at the bottom of the trench is shown in FIG. 3 to be confined to the dimensions and shape of the collar opening. At the end of the etch process, the process may be tweaked to enhance substantial polymer growth on the wall of the sacrificial layer 50, as known in the art. That is, in the case that conductive layer 16 and sacrificial layer 50 are made from the same material, the present invention further provides that a polymer layer (not shown) may be grown on sacrificial layer 50 to protect sacrificial layer 50 during subsequent etching of conductive layer 16 as described below. This polymer layer can be grown from the anisotropic etch process and may be enhanced by tweaking the etch chemistry at the end point of sacrificial layer 50 etch.

Figure 4:
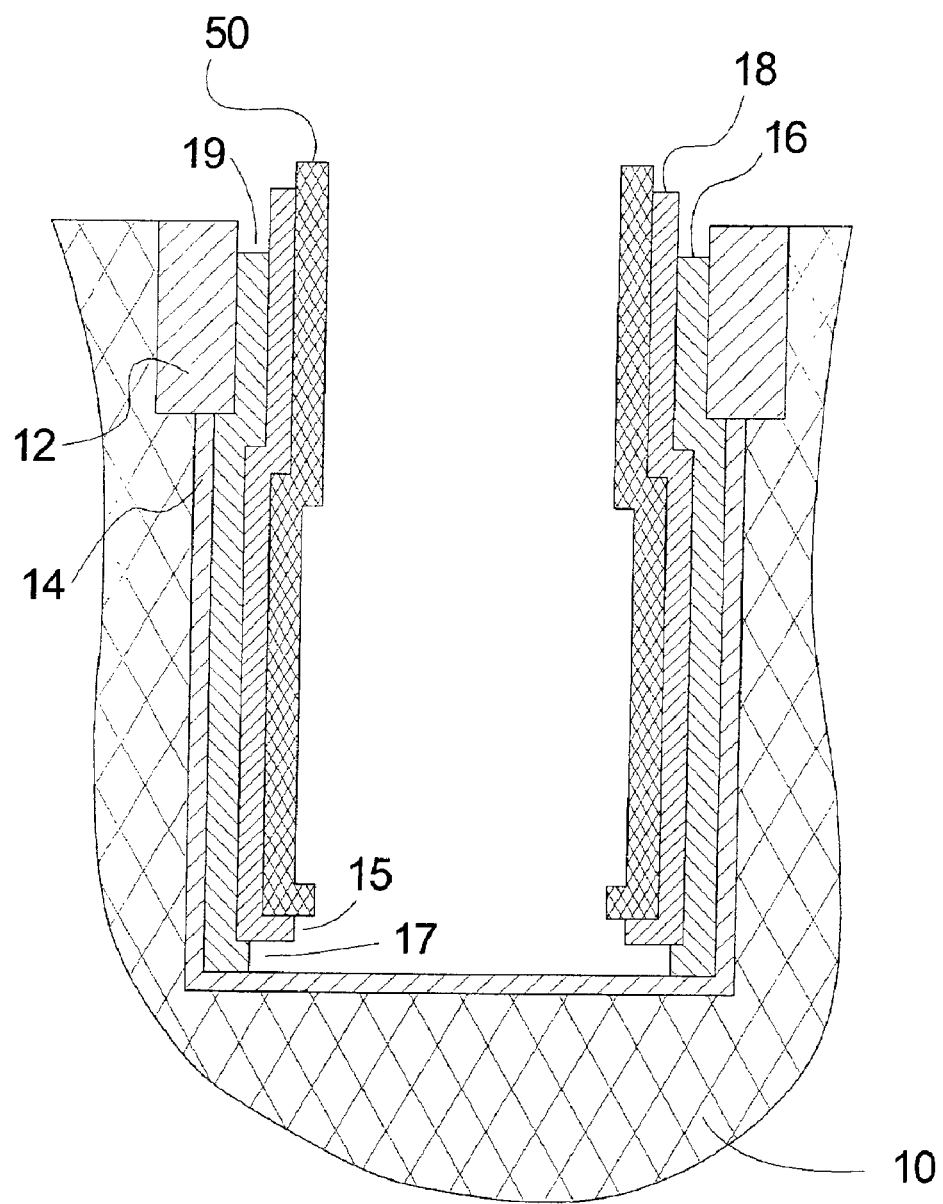

As shown in FIG. 4, the present embodiment next provides that a selective wet etch process is used to remove dielectric layer 18 with slight over etch 15 (undercut) from the areas that are not covered by sacrificial layer 50. A selective wet etch process is then used to remove conductive layer 16 from the areas that are not covered by dielectric layer 18. In the embodiment described herein, a substantial over etch is applied to create a recess 17 for approximately twice the thickness of conductive layer 16. For example, a five nm conductive layer 16 is recessed ~10 nm. As shown in FIG. 4, a recess 19 is also formed at the top of conductive layer 16. The integrity of the combined dielectric layer 18 and sacrificial layer 50 is maintained above recess 19 in conductive layer 16 by virtue of the closed shape of collar 12 and the fact that dielectric layer 18 and sacrificial layer 50 are deposited using ALD so as to exhibit very low stress. To preserve the structural strength of dielectric layer 18 and sacrificial layer 50, the recess in conductive layer 16 is preferably not carried to substantial distance beyond twice the thickness of conductive layer 16. The present invention provides that strength improvement at recess areas 17 and 19 of conductive layer 16 may be implemented, as necessary, by increasing the thickness of sacrificial layer 50.

Figure 5:
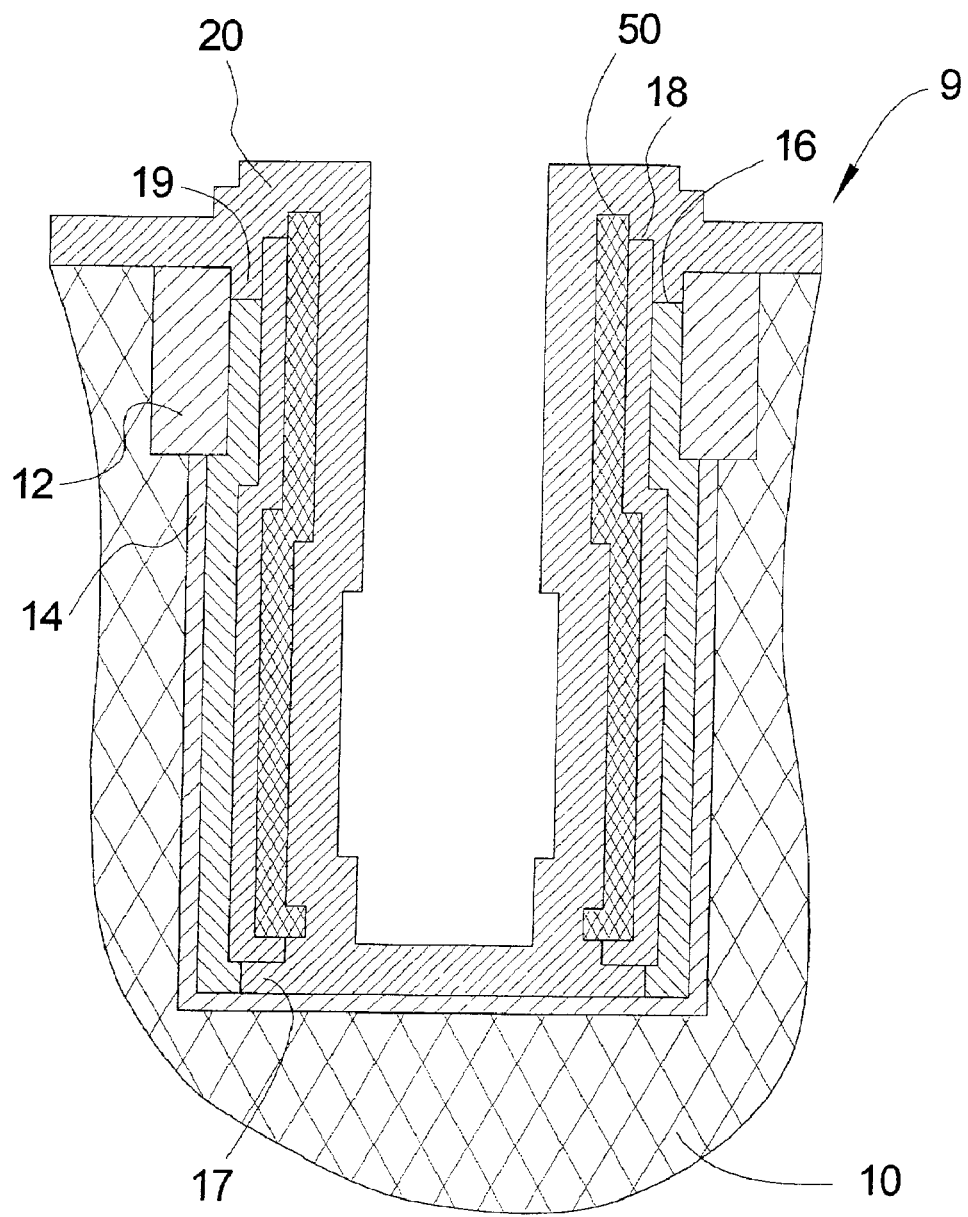

As shown in FIG. 5, partially completed wafer 9 is next coated with a dielectric layer 20. Dielectric layer 20 is preferably deposited by ALD so as to achieve a conformal coating throughout the surface of the layer. The material of dielectric layer 20 may be identical or different from that of dielectric layer 18. If the walls of sacrificial layer 50 are covered by a polymer layer as discussed above, the walls should be cleaned using a conventional technique prior to the deposition of dielectric layer 20. In the embodiment described herein, dielectric layer 20 is deposited up to a thickness that exceeds half of the thickness of conductive layer 16. Preferably, the thickness of dielectric layer 20 equals or slightly exceeds the thickness of conductive layer 16. As shown in FIG. 5, dielectric layer 20 seamlessly fills recesses 17 and 19 formed in conductive layer 16 to plug the recesses and insulate conductive layer 16. One of average skill in the art will appreciate that, due to filling the recesses in conductive layer 16, the thickness of dielectric layer 20 in the area of contact with conductive layer 16 is substantially thicker than the overall thickness in other areas of dielectric layer 20.

Figure 6:
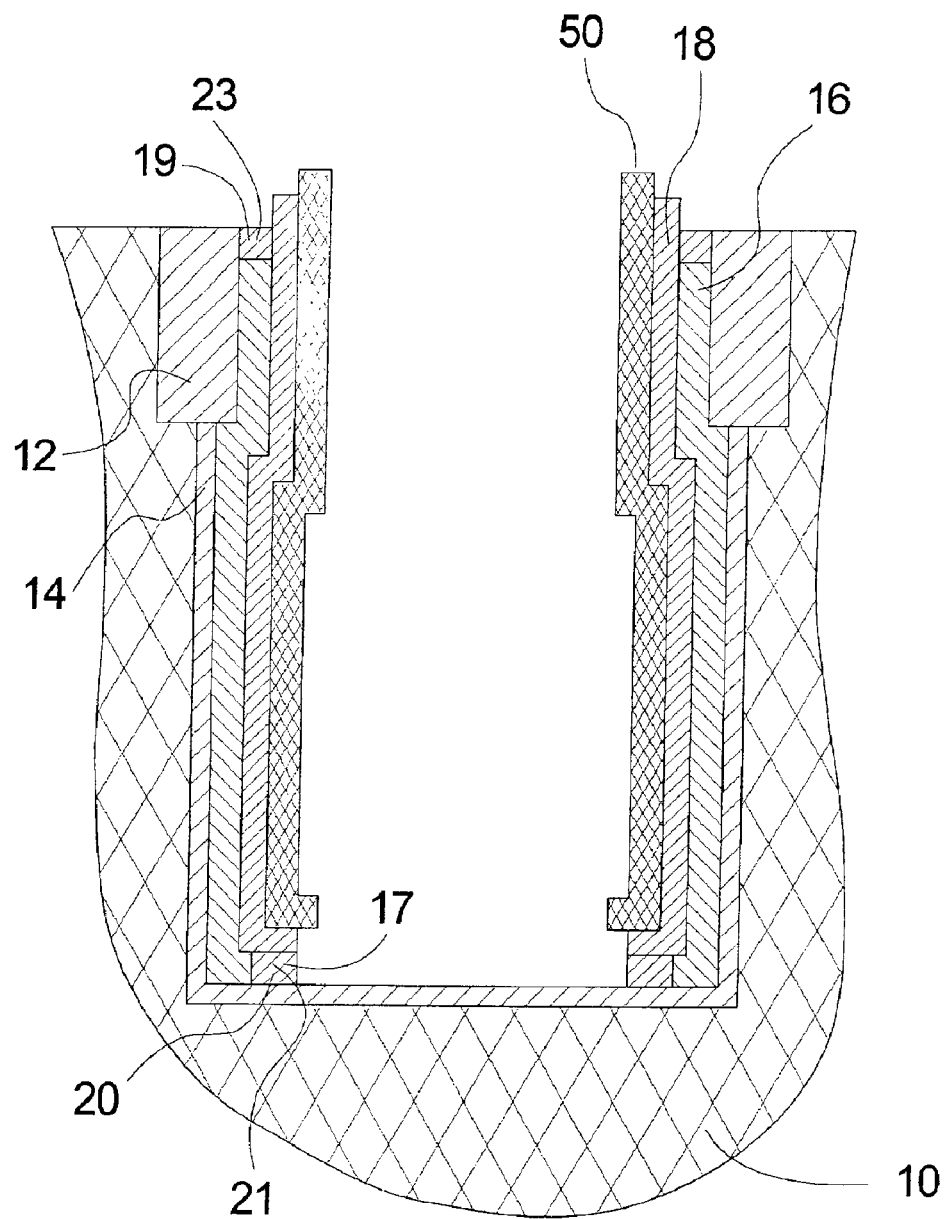

A selective wet etch process is next used to remove portions of dielectric layer 20, as shown in FIG. 6. Preferably, a slight over etch is used to ensure the complete removal of dielectric layer 20 from all areas with the exception of the substantially thicker plugs 21 and 23 in recesses 17 and 19, respectively, at the upper and lower portions of conductive layer 16. Following the wet etch, conductive layer 16 is sealed between dielectric layers 14, 18, and plugs 21 and 23.

Figure 7:
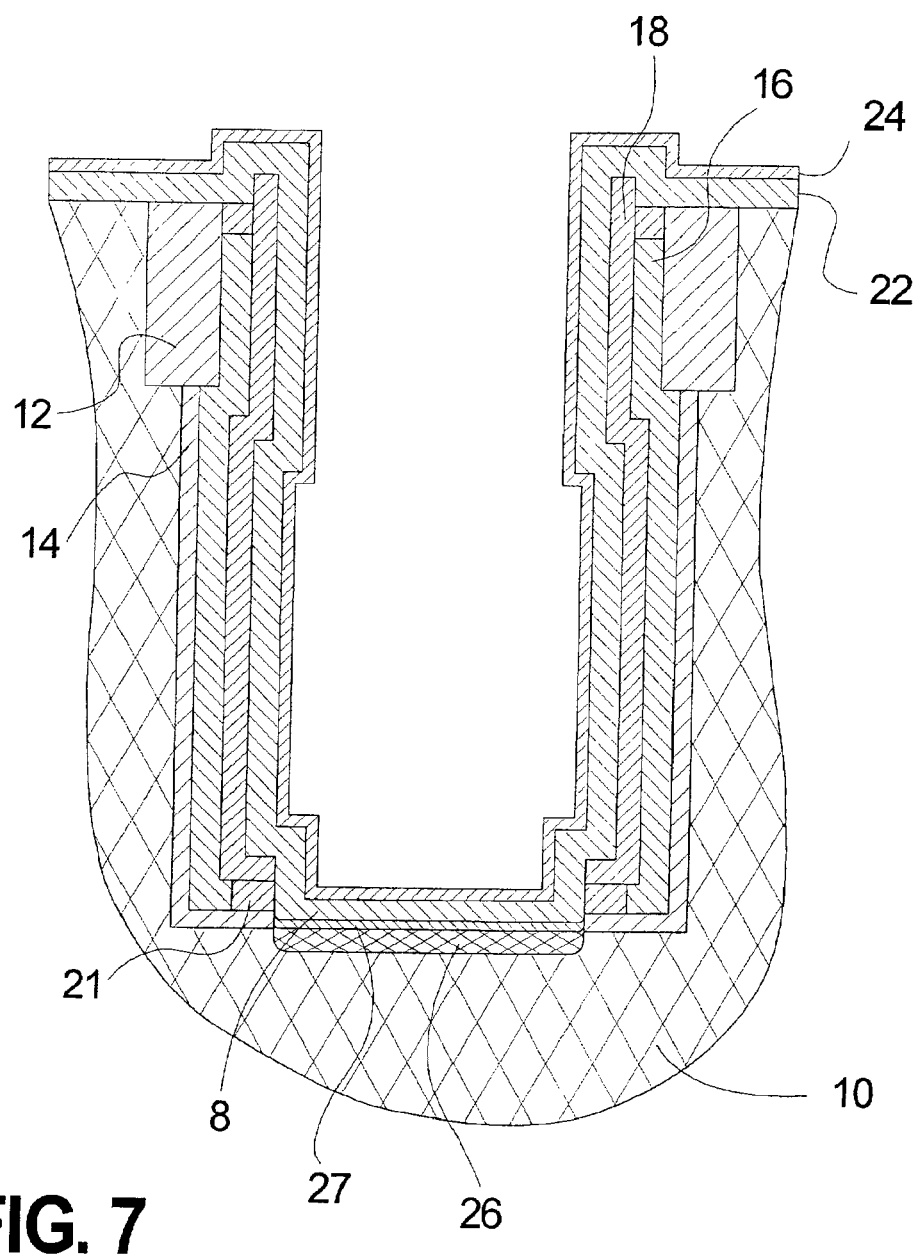

As shown in FIG. 7, sacrificial layer 50 is next removed by, for example, a conventional wet or dry etch process. The top of dielectric layer 18 is cleaned and an opening 8 is etched in the uncovered area of dielectric layer 14 at the bottom of the trench to expose a portion 27 of silicon substrate 10 lying at the bottom of the trench. A conductive layer 22 is then deposited over the entire area of wafer 10. Conductive layer 22 is preferably conformal and uniform over its entire area. In the embodiment of conductive layer 22 shown in FIG. 7, conductive layer 22 is formed from W to a thickness of 5 nm using ALD or other equivalent technique. As noted above with regard to conductive layer 16 and dielectric layer 18, an appropriate TiN interface layer may be provided as needed beneath conductive layer 22.

Prior to the deposition of conductive layer 22, the exposed portion of substrate 10 may be processed to prepare an ohmic contact 26, which, preferably, is a thin refractory metal silicide contact/barrier layer. The ohmic contact may be fabricated from, for example, refractory metal-silicides, metal-nitrides, nitridized silicides, or other appropriate materials. For example, ohmic contacts such as $WSi_2$, $WSi_2N_x$, $WSi_2N_x$, $WSi_2$, $TaSi_2$, $TaNSi_2$, $MoSi_2$, $W:TiSi_2$, etc., may be used. In one embodiment, the present invention teaches that sputtering is used to deposit the transition layer. Different materials may be stacked advantageously, such as $WSi_2N_x/WSi_2$, which can be fabricated by RF sputtering from a $WSi_2$ composite target implementing inert gas for the silicide and reactive sputtering with nitrogen for the nitride. Suicide layer 26 ensures the integrity of the contact area between silicon substrate 10 and conductive layer 22 throughout subsequent high temperature processing steps described below. An ultrathin layer of high-K dielectric material 24 is then deposited over conductive layer 22. Dielectric layer 24 is preferably deposited insitu with conductive layer 22, without ambient exposure of conductive layer 22, using ALD or other equivalent technique. Dielectric layer 24 serves to create an advantageous non-oxidized and clean interface between conductive layer 22 and the subsequent dielectric layer described below. Dielectric layer 24 may be as thin as 1 nm, but more preferably 2 nm–2.5 nm.

Figure 8:
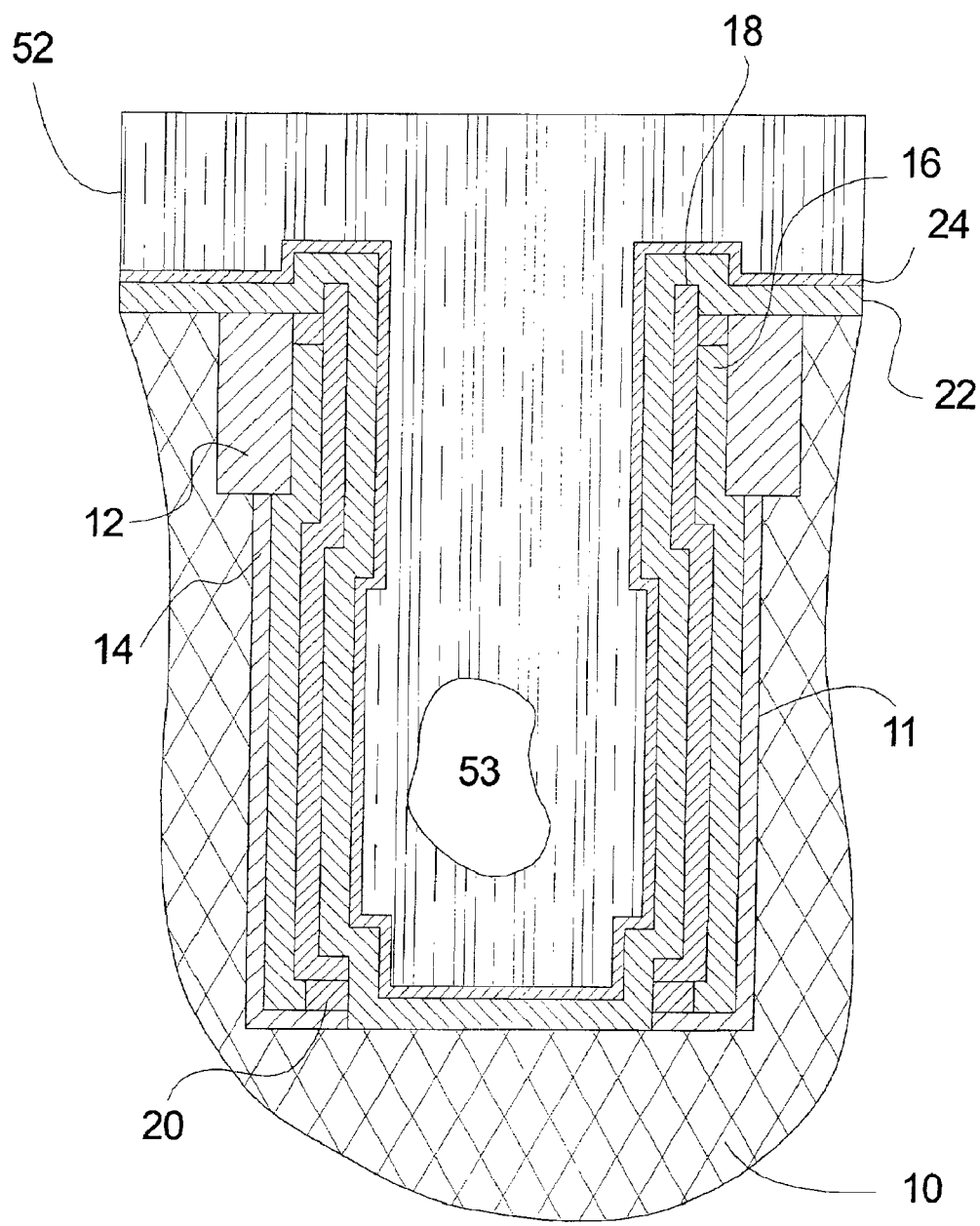

As shown in FIG. 8, a sacrificial layer 52 is applied to uniformly cover the area of wafer 10 and to fill in trench 11. Sacrificial layer 52 may be formed, for example, from photoresist or other complying polymer and deposited using conventional techniques such as spin-on, CVD or other similar techniques. As necessary, sacrificial layer 52 may be planarized using conventional planarization techniques, such as etch back or CMP. In an alternative embodiment, sacrificial layer 52 may be fabricated from conformally deposited $SiO_2$ or tungsten using, for example, atmospheric TEOS-ozone CVD. It will be understood by one of average skill in the art that forming sacrificial layer 52 from $SiO_2$ provides a more robust alternative to photoresist or polymer. In addition, the support provided by $SiO_2$ increases the support provided to the portion of dielectric layer 24 adjacent to the recessed portion of conductive layer 22, as discussed below in connection with FIG. 10. As shown in FIG. 8, sacrificial layer 52 completely fills into the bottom of trench 11. However, it will be appreciated by one of average skill in the art that sacrificial layer 52 need not completely fill into the bottom of the trench. In particular, as further illustrated below, the subsequent steps in the fabrication process impact only the upper portion of the trench, for example, the upper ~1 μm of the trench. Accordingly, the lower portion of the trench need not be completely filled by sacrificial layer 52 and may in fact include voids 53 or other imperfections without adversely affecting the yield of the process.

Figure 9:
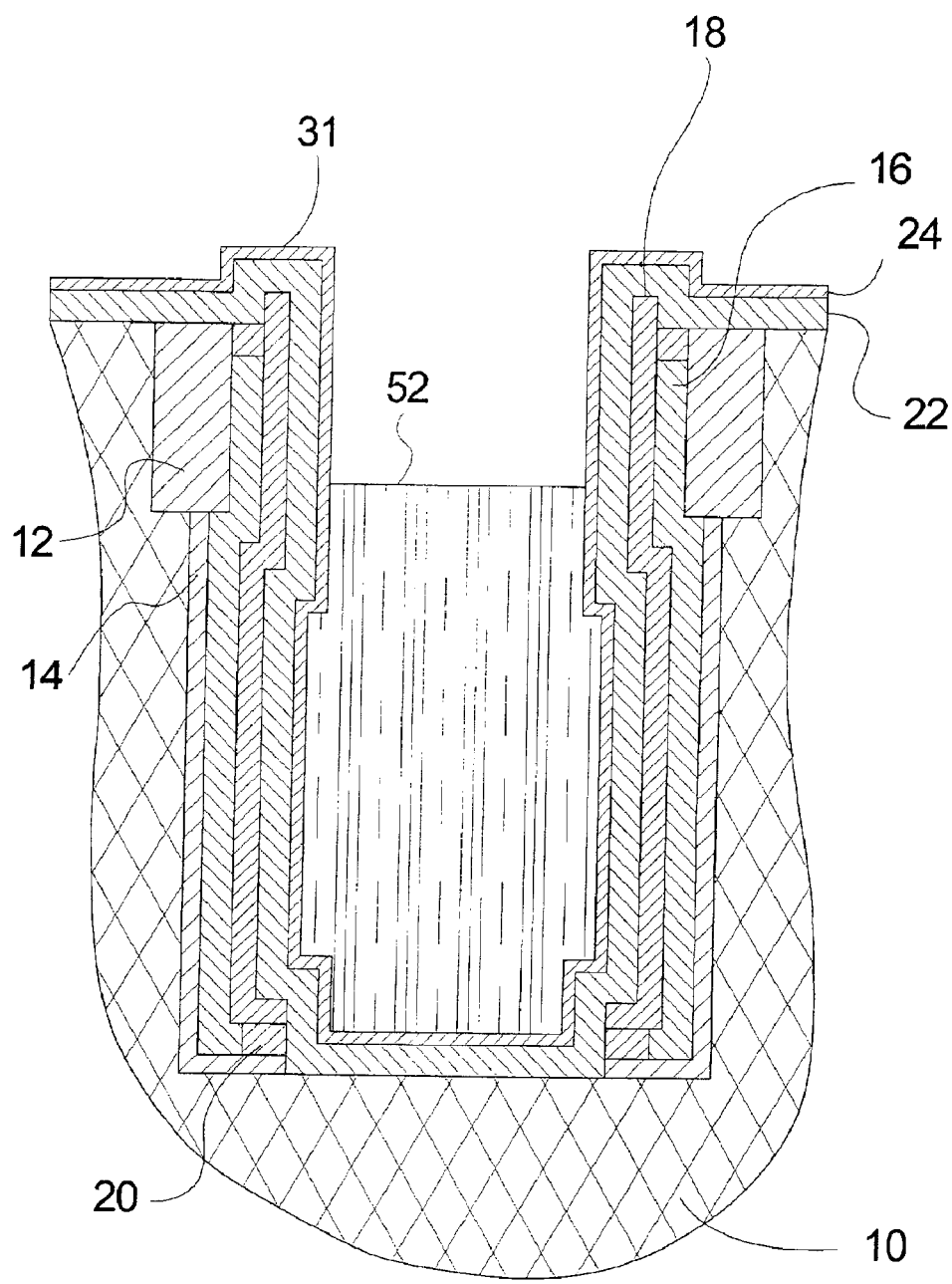

Sacrificial layer 52 is then recessed, as shown in FIG. 9, using, for example, conventional techniques, such as ozone or downstream oxygen plasma. Preferably, sacrificial layer 52 is recessed to a range of 0.1 μm–0.5 μm below surface level 31 defined by the highest point of dielectric layer 24. In the embodiment in which sacrificial layer 52 is formed from $SiO_2$, sacrificial layer 52 may be recessed using, for example, conventional fluorine based dry etching or conventional wet etch process such as buffered-HF.

Figure 10:
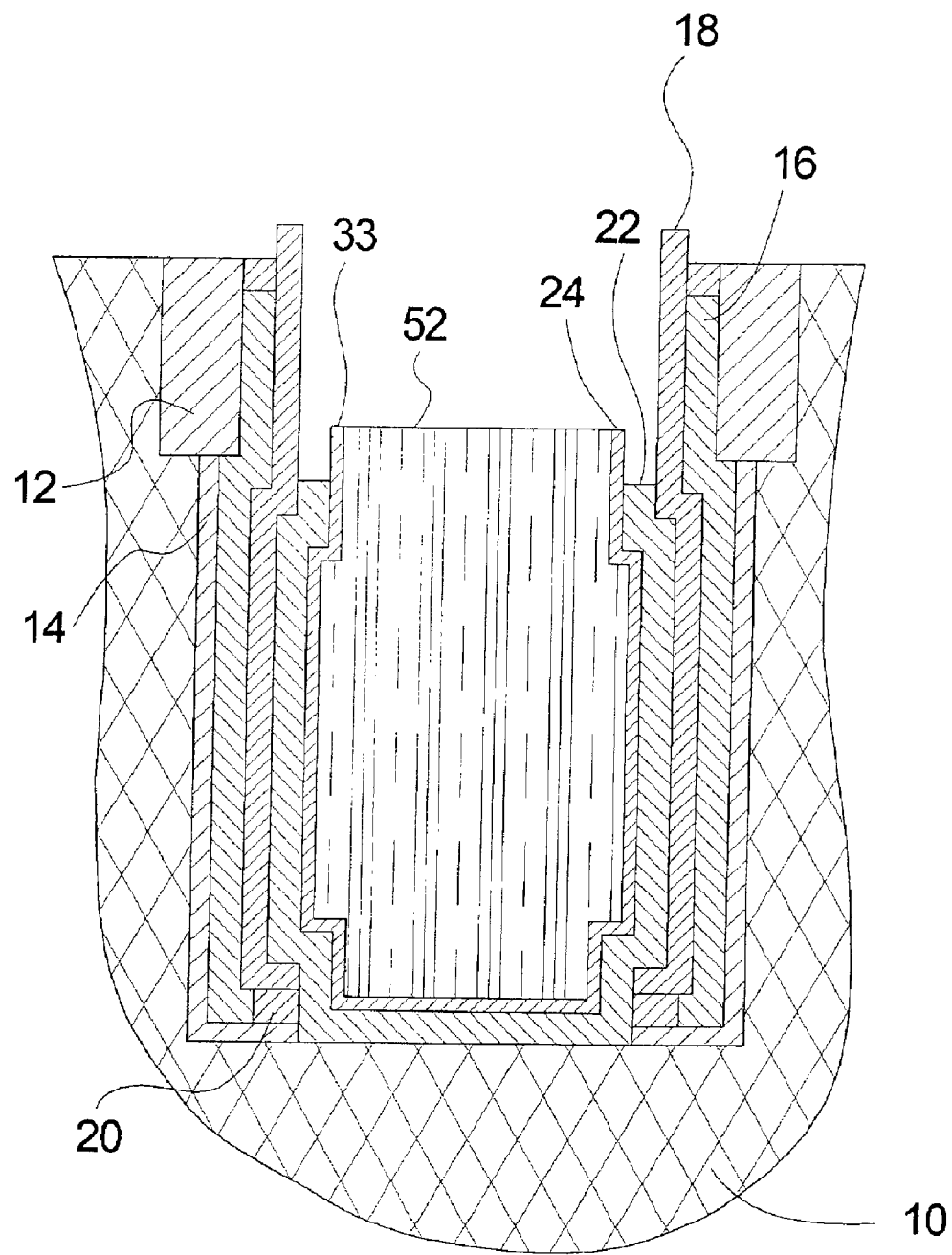

As shown in FIG. 10, the exposed portion of dielectric layer 24 is next removed using, for example, a conventional selective wet etch process. The exposed portion of conductive layer 22 is also removed using, for example, a conventional selective wet etch process. Preferably, over etch is applied to recess conductive layer 22 for approximately twice the thickness of conductive layer 22. It will be appreciated by one of average skill in the art that the integrity of portion 33 of dielectric layer 24 adjacent to the recessed portion of conductive layer 22 is preserved due to the closed shape of the trench and further due to the fact that dielectric layer 24 is deposited so as to exhibit very low stress. The integrity of dielectric layer 24 is further enhanced by the support of sacrificial layer 52.

Figure 11:
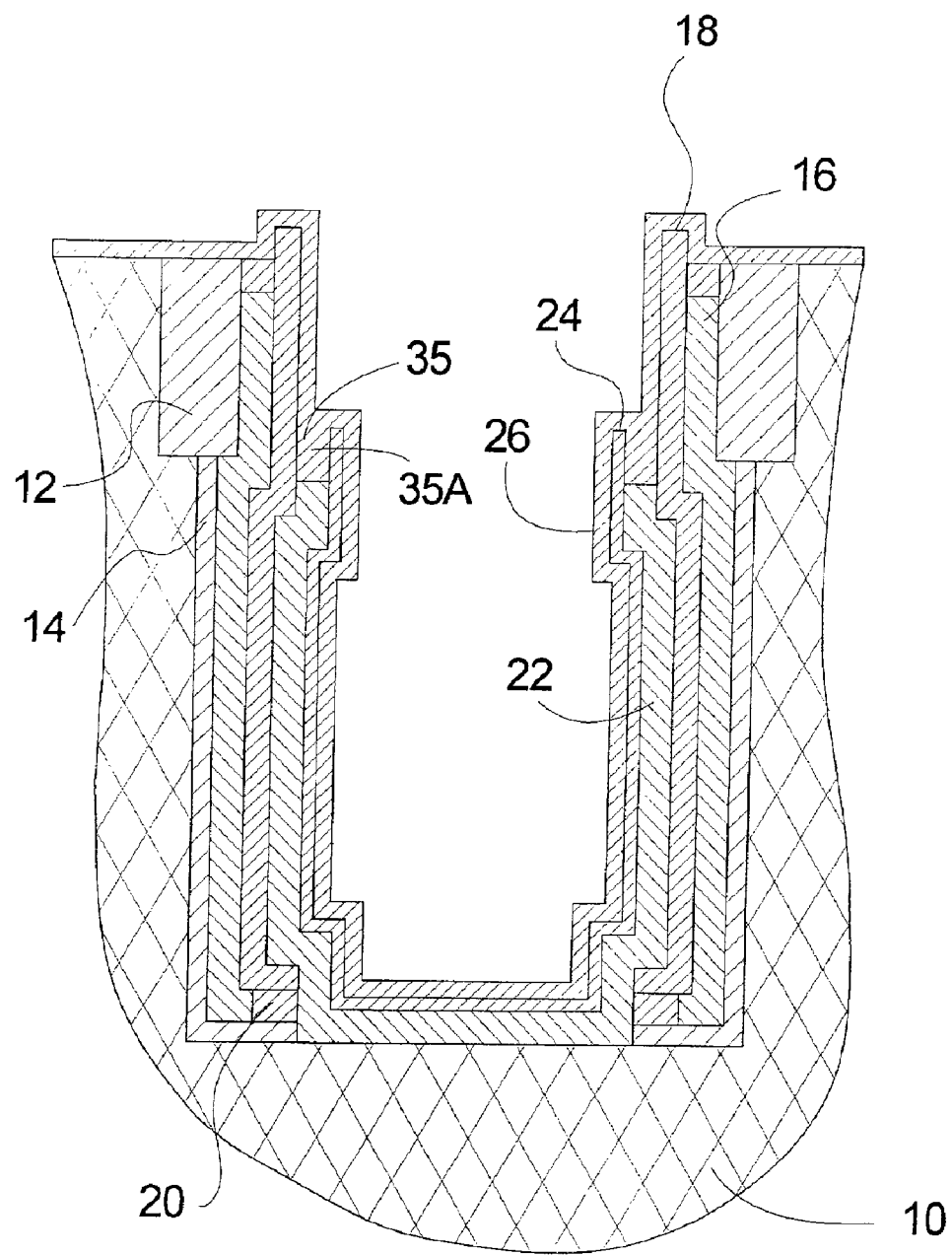

As shown in FIG. 11, sacrificial layer 52 is then removed by conventional techniques and dielectric layer 26 is deposited thereon. Dielectric layer 26 may be fabricated from either the same or different material as that of dielectric layer 18. Dielectric layer 26 serves thereby to complement the thickness of dielectric layer 24 as well as to seamlessly fill recess 35 formed in conductive layer 22 with an insulating layer of dielectric material. Dielectric layer 26 is preferably deposited using ALD. In particular, and by way of example, dielectric layer 26 may be formed from $Al_2O_3$ deposited using ALD to form insulating plug 35A within recess 35 in conductive layer 22. In the embodiment where sacrificial layer 52 is formed from $SiO_2$, sacrificial layer 52 is removed by conventional wet or dry etch techniques that are selective and do not etch dielectric layer 24 and the insulating plug formed by dielectric layer 26. By way of example, if dielectric layers 24 and 26 are made of $Al_2O_3$, $SiO_2$ films of sacrificial layer 52 may be removed using downstream plasma $NF_3$ etch process that is selective and does not etch $Al_2O_3$.

Figure 12:
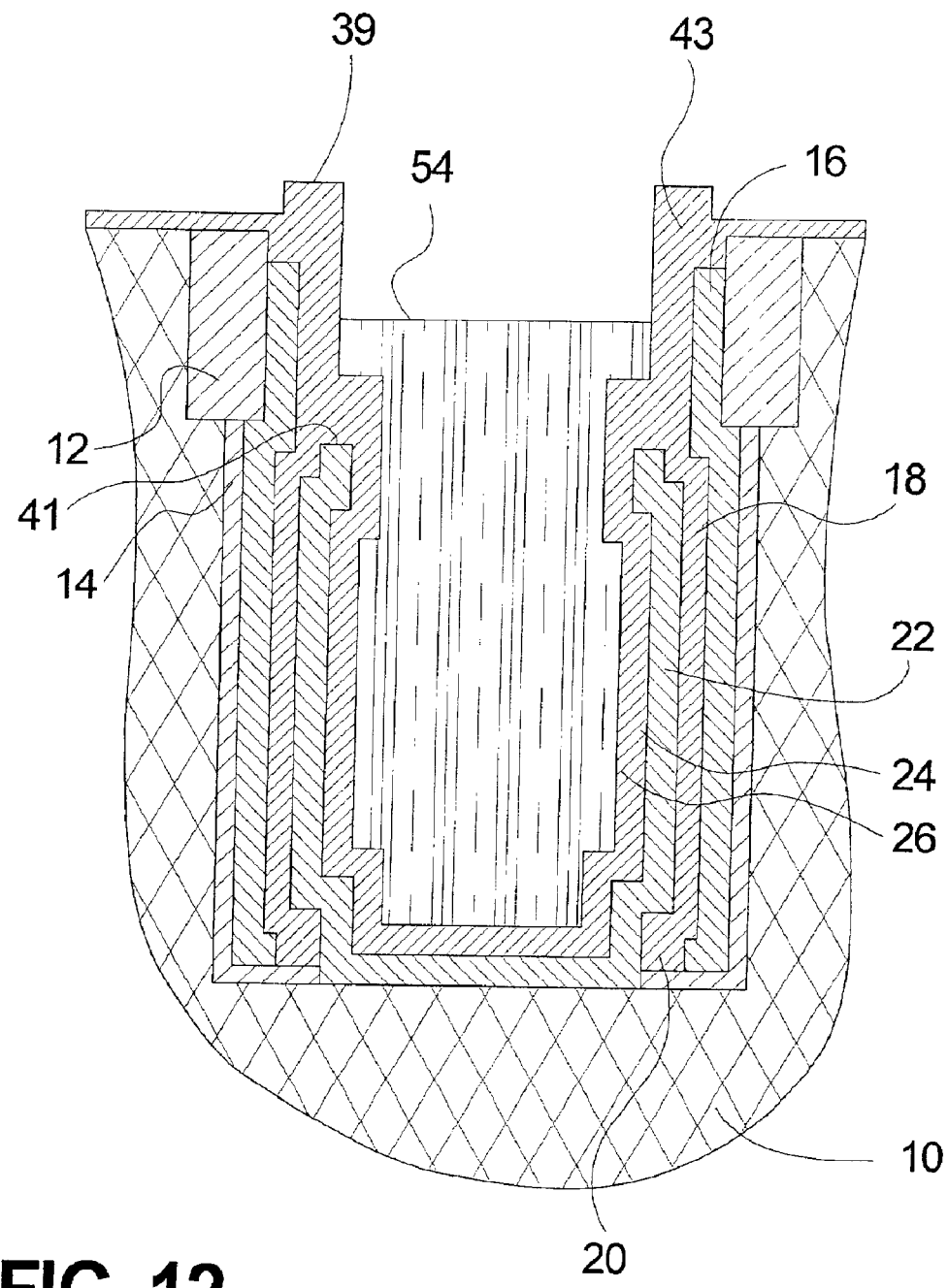

Accordingly, as shown in FIG. 12, a conformal, seamless dielectric insulating layer 43 made up of dielectric layers 18, 20, 24, and 26 is formed around conductive layer 22. Combined dielectric layer 43 serves to insulate conductive layer 22 from conductive layer 16, and thus form the structure of the capacitor. While combined dielectric layer 43 is illustrated as a layer formed from a single material, it will be appreciated that the combined layer may alternatively be formed from various dielectric materials that together form the conformal, seamless insulating structure illustrated in the figures.

As shown in FIG. 12, a layer 54 of photoresist or other complying polymer is next applied to uniformly cover the area of wafer 10 and to fill in trench 11. Layer 54 is preferably deposited using conventional techniques. It will be appreciated by one of average skill in the art that layer 54 does not need to completely fill into the bottom of the trench since only the top of the trench is of interest to the formation of the capacitor. Layer 54 is then recessed using conventional techniques, such as ozone or downstream oxygen plasma. Layer 54 is preferably recessed to a range of 0 μm–0.25 μm below surface level 39. However, in any case, layer 54 is preferably recessed to a level that is higher than level 41 of the portion of dielectric layer 26 adjacent to the recessed portion of conductive layer 22. Accordingly, as is described below, layer 54 forms an exposed contact for conductive layer 16 while protecting the insulation over conductive layer 22.

Figure 13:
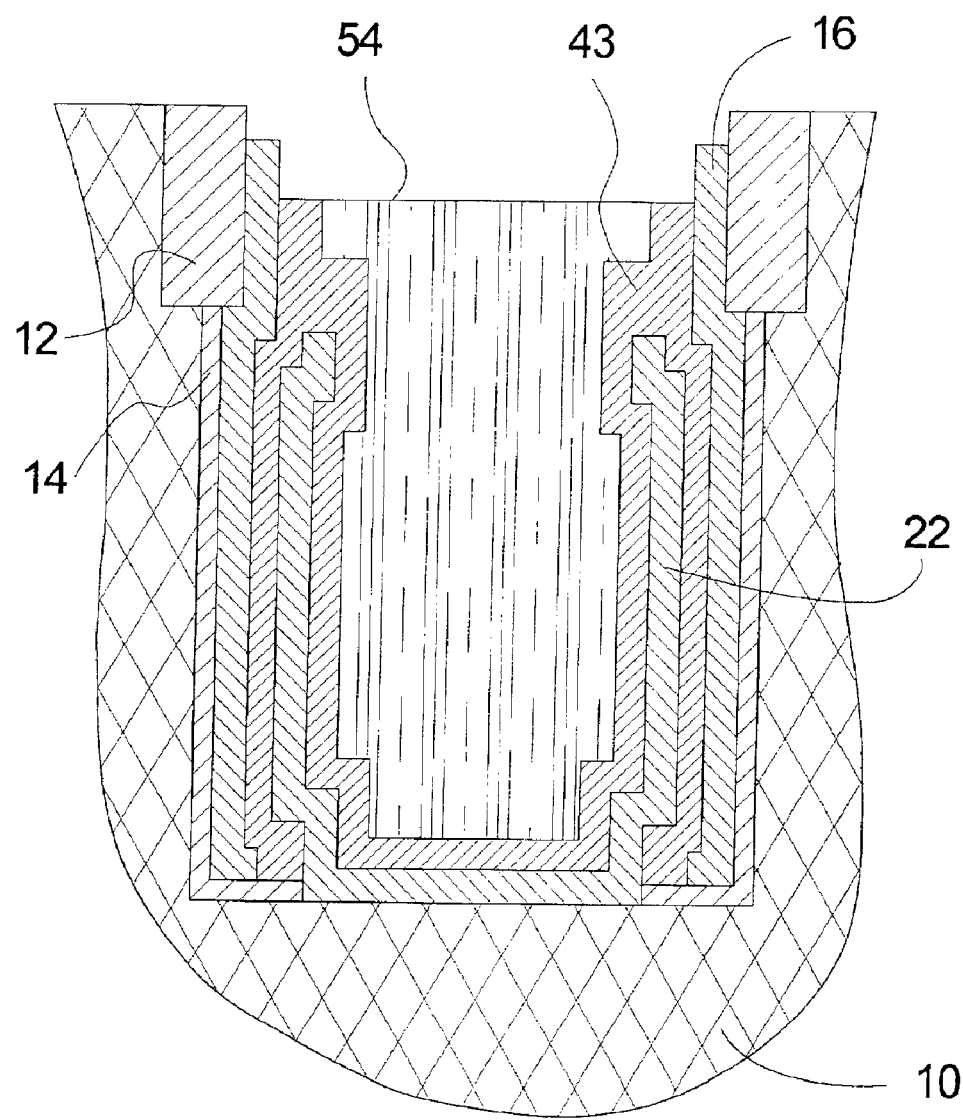

As shown in FIG. 13, using conventional selective wet etch processes, the dielectric material of combined dielectric layer 43 is removed from the area that is not protected by layer 54 to expose conductive layer 16.

Figure 14:
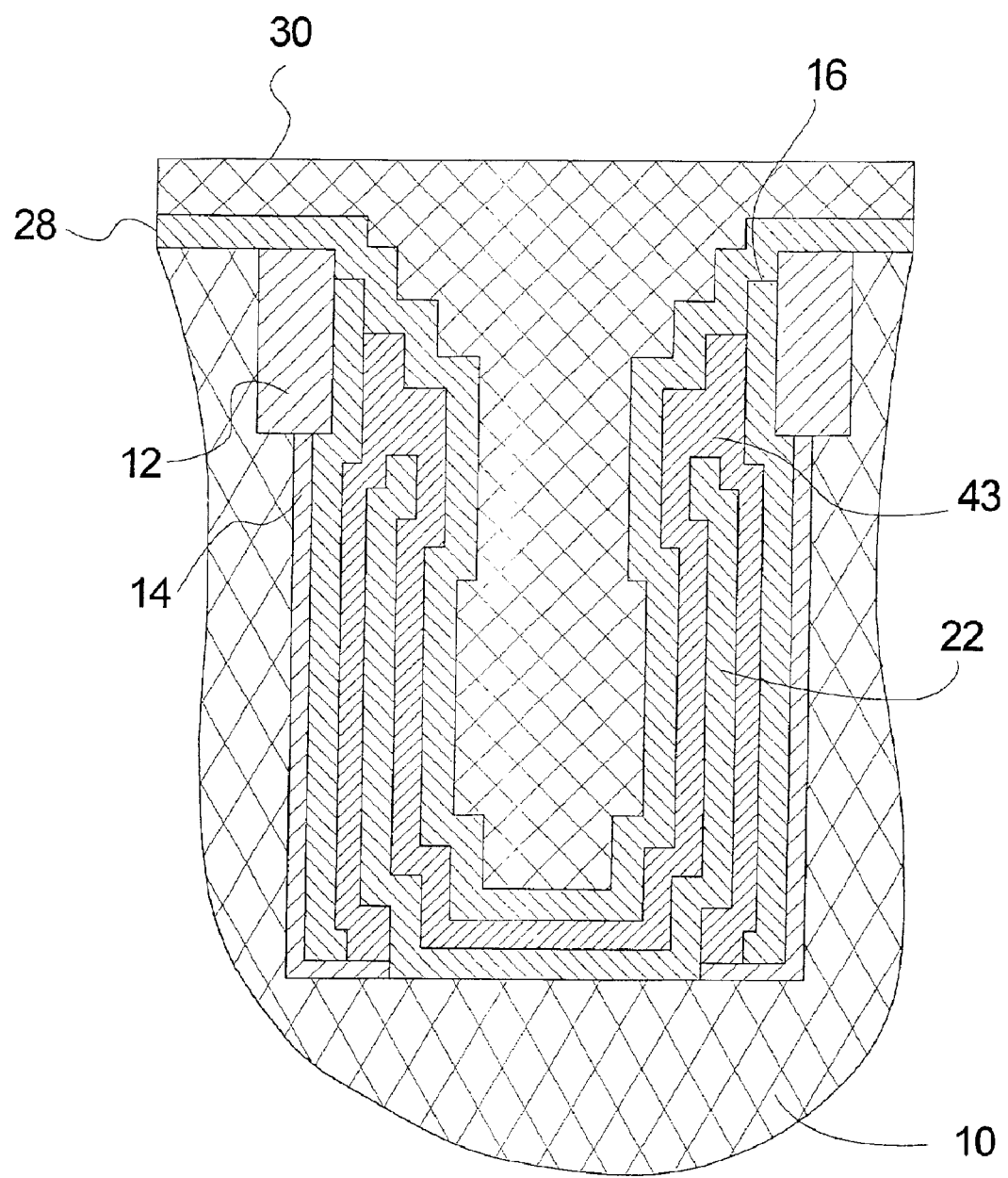

Layer 54 is then removed using conventional techniques, and conductive layer 28 and conductive plug 30 are deposited into the trench making contact with conductive layer 16, as shown in FIG. 14. Conductive plug 30 forms the storage node electrode and will be subsequently connected to the drain area of the passing transistor, as discussed in below. Preferably, implementations of conductive plug 30 are optimized for the particular thermal budget of the capacitor and the need to be compatible with silicon at the drain area of the transistor. Accordingly, and by way of example, conductive stack 28 and 30 may be constructed using ALD for both layers or ALD for conductive layer 28 and CVD for conductive layer 30 to complete an optimized capacitor. In another embodiment, shown in FIG. 15, a plug 32, composed of conductive layers 28 and 30, refills trench 11 approximately up to the area of collar 12. Then trench fill is completed with silicon plug 34 that is doped to create an $n^+$ contact with the transistor drain area.

Figure 16:
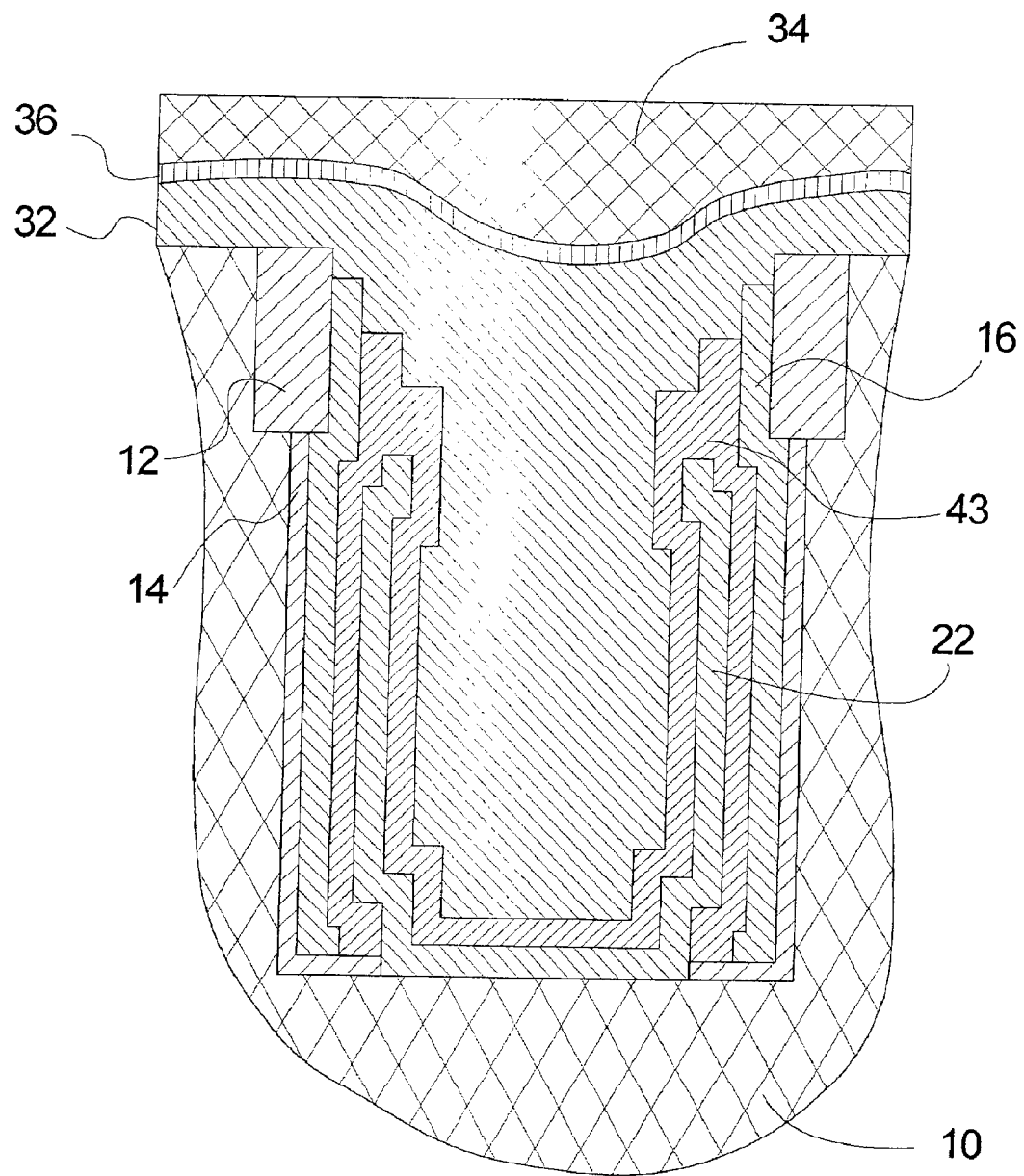
FIG. 16 illustrates another alternative preferred embodiment of the process of FIG. 14.

In yet another alternative, as shown in FIG. 16, a mediation layer 36 comprised of silicide or a stack of suicide and metal-nitride may be formed between conductive plug 32 and polysilicon plug 34. By way of example, conductive plug 32 may be made out of W that is initially deposited by a combination ALD and CVD, but in later generations, below the 90 nm technology node, is deposited solely by ALD. By way of further example, mediation layer 36 may comprise a thin layer stack of tungsten nitride and tungsten silicide deposited, for example, by CVD or PVD.

Figure 17:
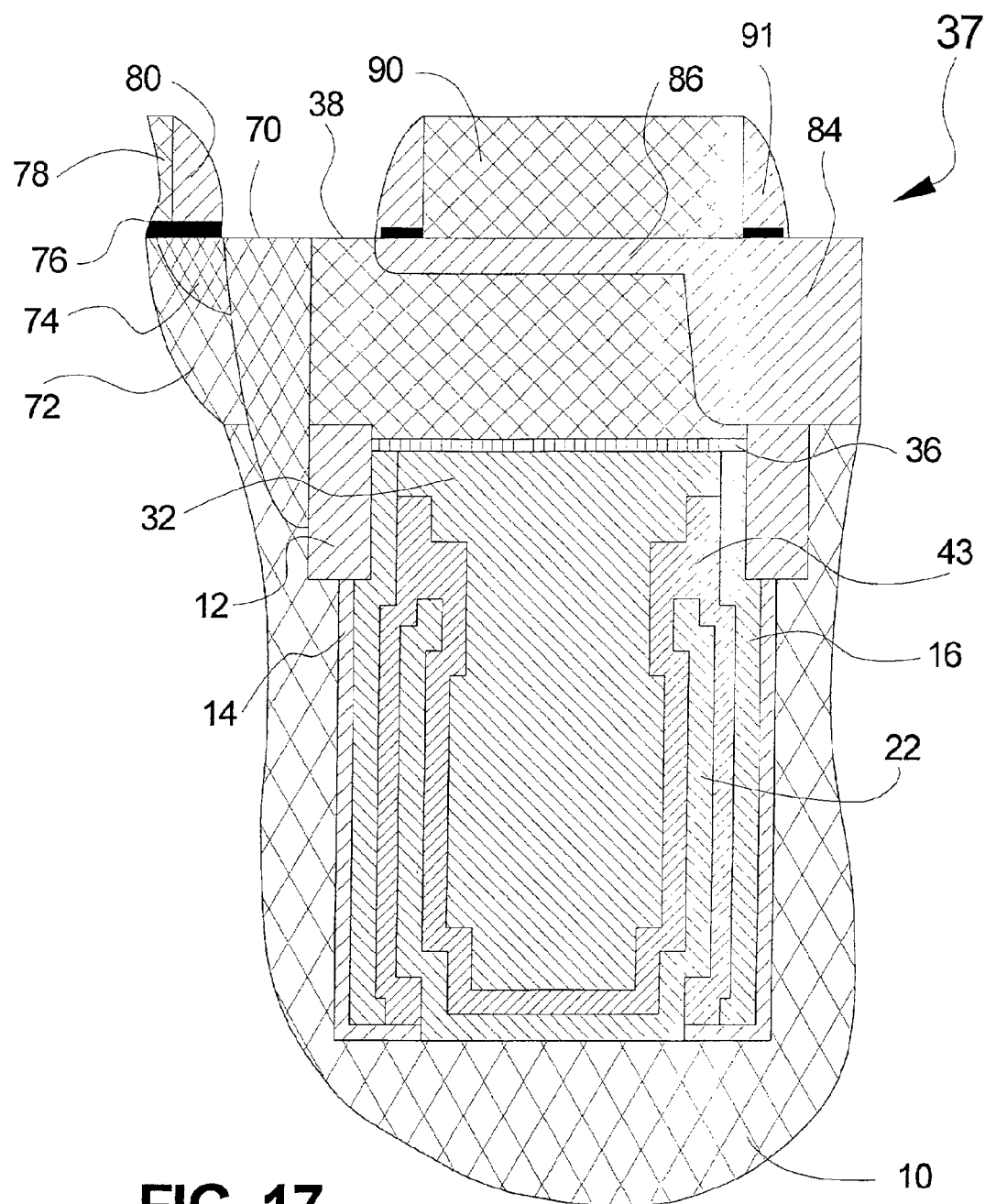
FIG. 17 illustrates an alternative preferred embodiment in which BEST deep trench technology is combined with the present invention.

In a further example, FIG. 17 illustrates a completed capacitor stack 37 that was manufactured according to the method of the present invention. Capacitor stack 37 is shown in FIG. 17 integrated into a conventional BuriEd STrap (BEST) memory cell architecture. In this example, layer 32 is implemented with a W plug deposited by ALD to make contact with conductive layer 16 to complete the interconnection of the three-capacitor stack ($CLASS^3$). Conductive plug 32 is recessed to below the collar level using conventional techniques and a thin layer of nitride is grown thereon by plasma nitridation. Following this step, a thin layer of polysilicon or tungsten silicide is deposited by conventional techniques such as CVD or PVD and subsequently annealed to form interfacial tungsten-silicide with the tungsten nitride layer. During that high temperature process, tungsten nitride is converted to tungsten at the interface with tungsten and into tungsten-nitride-silicide at the interface with tungsten-silicide. Accordingly, a proven robust silicon-metal interface 36 is generated. Finally, polysilicon plug 38 is deposited to completely plug the trench and to form the interconnection with transistor drain area 74 (the buried strap, 38). In an alternative to the separate creation of a tungsten-silicide transition layer, it should be understood that the deposition of the silicon plug may follow the creation of the tungsten nitride thin layer and the tungsten-silicide may be produced during subsequent high temperatures steps that are existing steps of the conventional process of memory fabrication.

Following the deposition of silicon plug 38, fabrication proceeds according to conventional process flow such as BEST. In particular, architecture of the memory cell follows a folded bit line configuration, as is known in the art. As shown in FIG. 17, shallow trench isolation 84 and passing word line isolation 86 are fabricated into buried strap 38. Buried strap 38 is connected to the word line transistor through $n^+$ doped layer 70 that is contacted with drain area 74 of the word line transistor. Transistor gate dielectric 76 is formed and the gate/word line 78 is shown to be manufactured with spacers 80 according to conventional process flow. Together with word line 78, passing word line 90 is formed and insulated with spacers 91 according to conventional process flow. Each passing word line 90 is connected to a transistor of an inverse bit line row to complete the fabrication of the memory cell array.

As noted above, the fabrication process for the embodiment of the present invention described above may be modified to provide additional strength and support to the portion 33 of dielectric layer 24 (FIG. 10) that lies adjacent to the recessed portion of conductive layer 22. Such modifications take the form of deviations from the process flow described above in which alternate interim steps are inserted into the process flow described above. The interim steps serve to increase the mechanical strength of dielectric layer 24 at stages during the process flow in which dielectric layer 24 is most at risk of fracture or failure.

Figure 18:
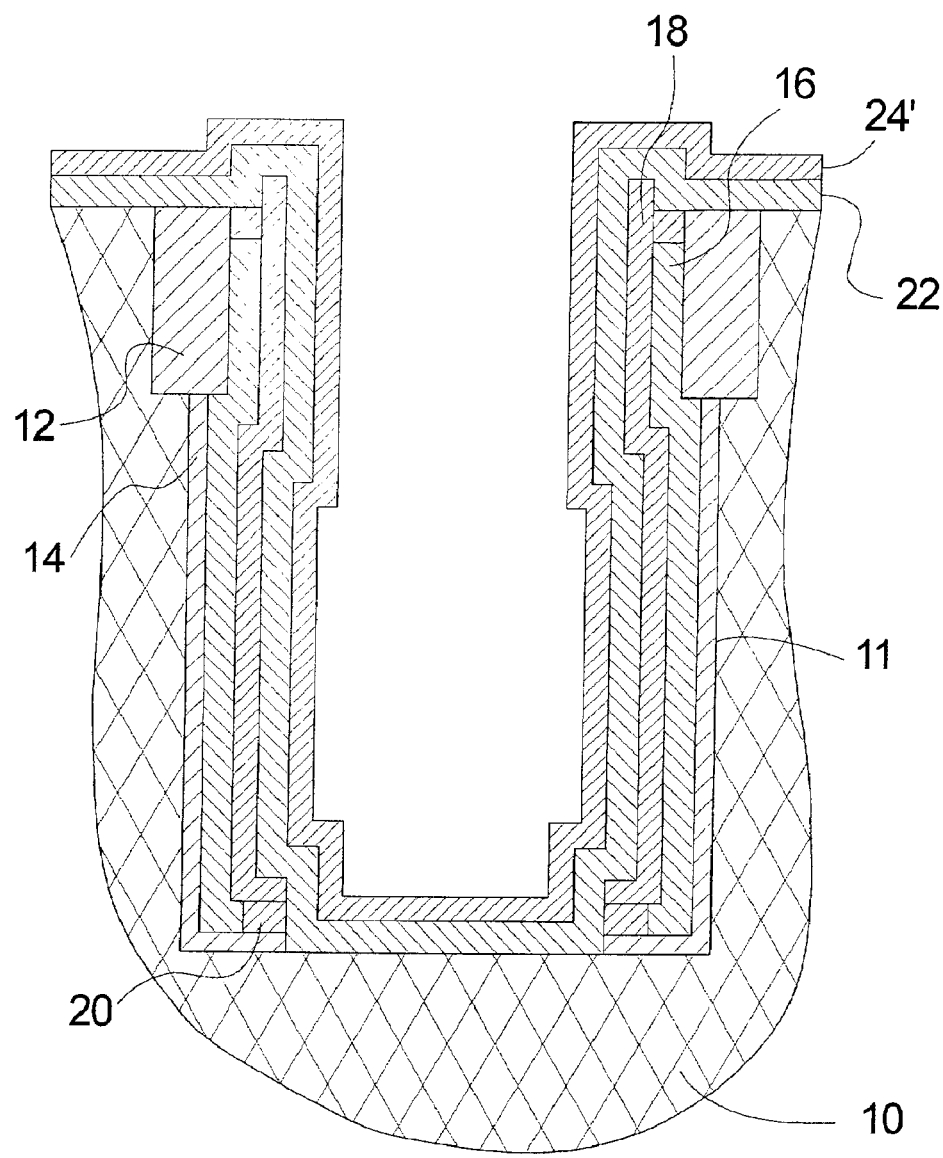
FIGS. 18–24 illustrate an alternative preferred embodiment of the process for forming the first four layers of a multilayer capacitor subsequent to the process of FIG. 6.

In one such embodiment, the process flow of the present invention proceeds as described above to form the structure shown in FIG. 6. However, following the formation of the structure shown in FIG. 6, the process flow deviates from the flow described above to include the steps illustrated in FIGS. 18–24. As shown in FIG. 18, in this embodiment, dielectric layer 24' is deposited over conductive layer 22 to the full thickness that is necessary for dielectric layer 24' to serve as a capacitor dielectric. For example, dielectric layer 24' may be deposited to a thickness similar to that of dielectric layer 18. Dielectric layer 24' is otherwise deposited as described above, with the exception that the increased thickness of dielectric layer 24' serves to provide the portion of dielectric layer 24' that lies adjacent to the recessed portion of conductive layer 22 with additional mechanical strength.

Figure 19:
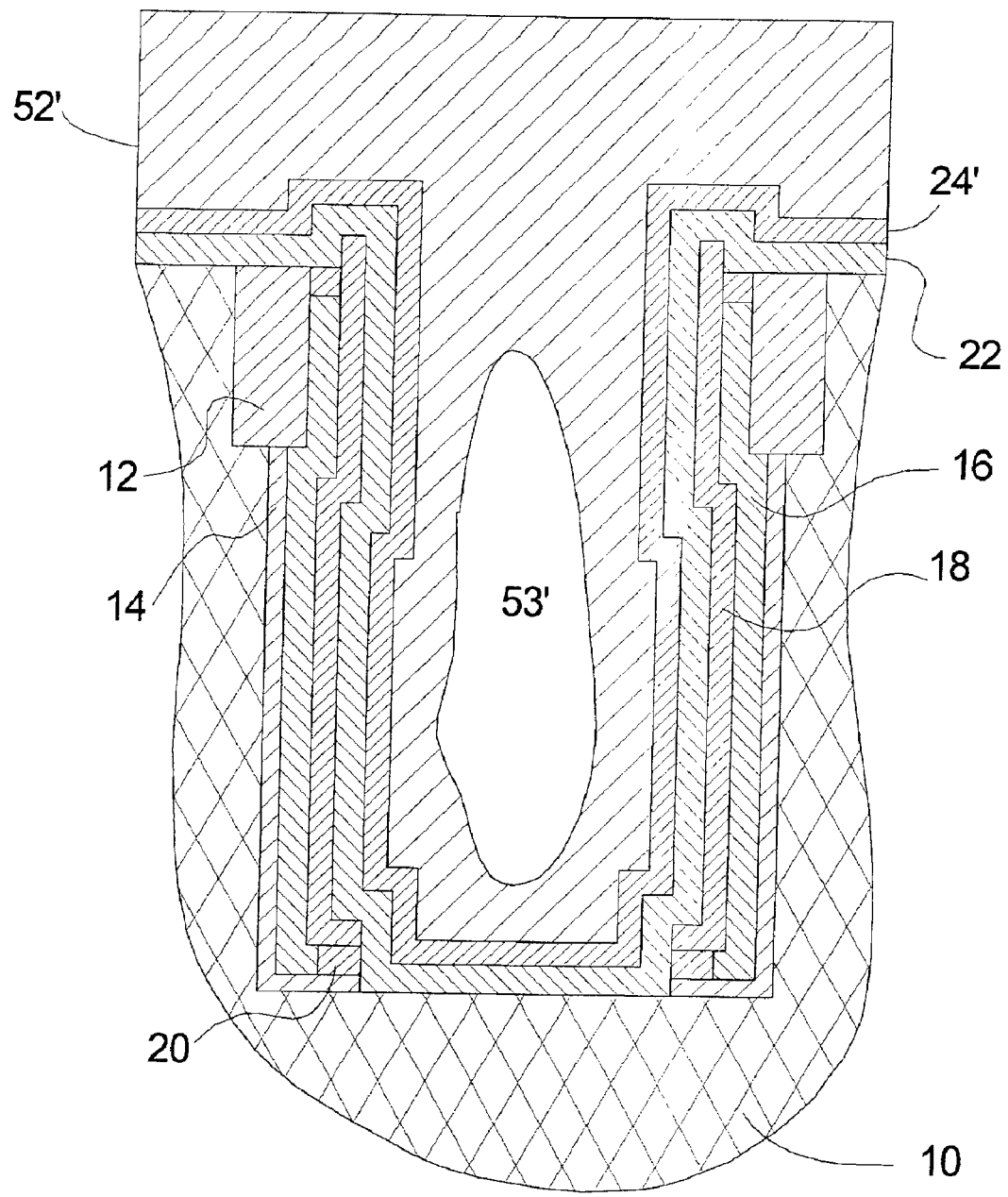
Figure 20:
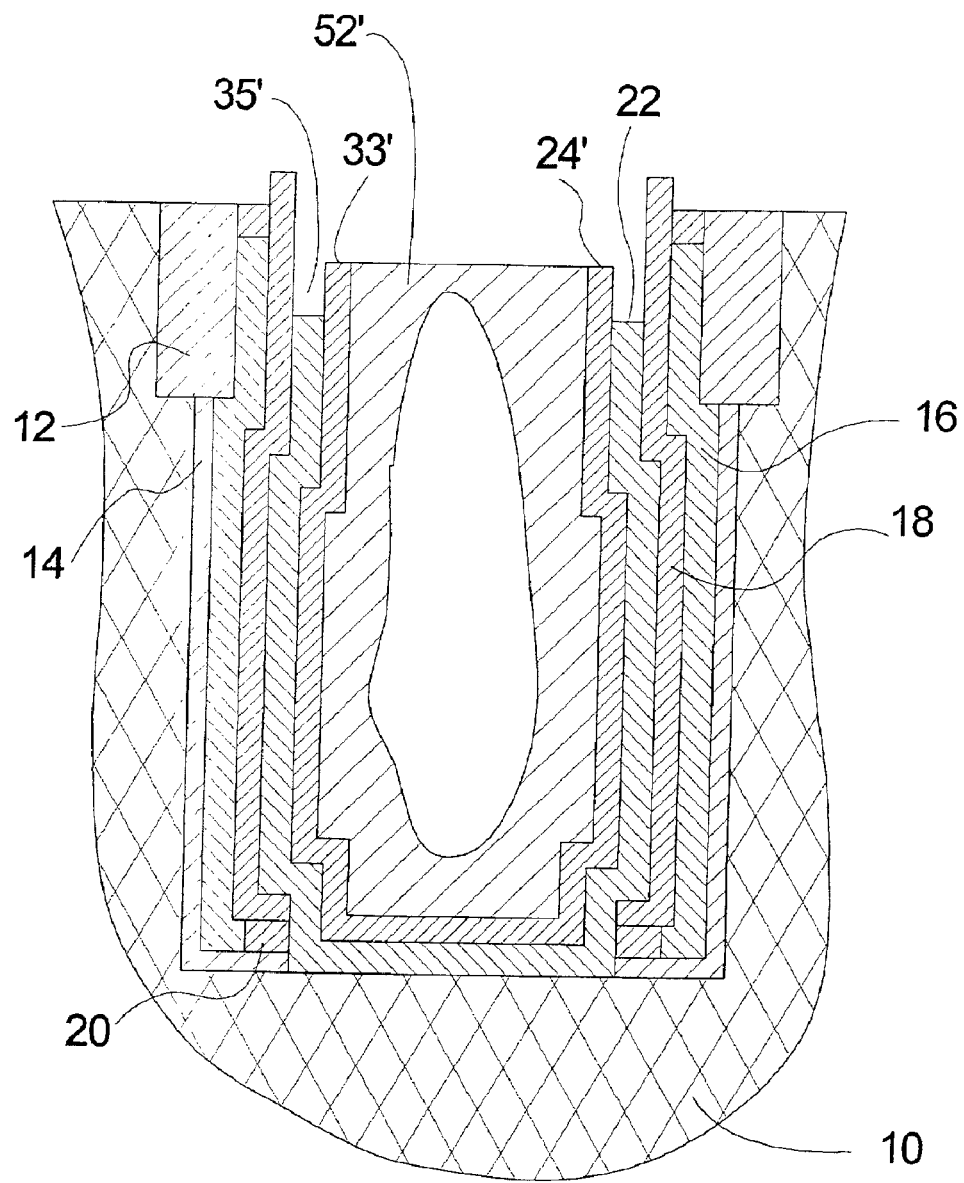

As shown in FIG. 19, following the deposition of layer 24', sacrificial layer 52' is deposited in trench 11. Sacrificial layer 52' is preferably formed using the materials and fabrication processes described above with regard to sacrificial layer 52. For example, sacrificial layer 52' can be made out of $SiO_2$ and may be deposited by Atmospheric Pressure CVD from TEOS-ozone. In addition, sacrificial layer 52' need only to fill the upper most one $\mu$m of the DT and accordingly voids such as 53' may be formed. As shown in FIG. 20, sacrificial layer 52' is then recessed to expose portions of conductive layer 22 and dielectric later 24', using the etch techniques described above with regard to the recessing of sacrificial layer 52. In the illustration shown in FIG. 20, sacrificial layer 52' is recessed to a range of 0.1 $\mu$m–0.5 $\mu$m below surface level, so that it is below the level of the top of collar 12. As further shown in FIG. 20, portions of the exposed areas of dielectric layer 24' and conductive layer 22 are then removed and over-etch is applied to recess conductive layer 22 below the level of dielectric layer 24'. While over-etch has been applied to create a recess 35' in conductive layer 22, it will be appreciated that the additional support provided by the plug formed by sacrificial layer 52' serves to strengthen portion 33' of dielectric layer 24' adjacent to recess 35' in conductive layer 22.

Figure 21:
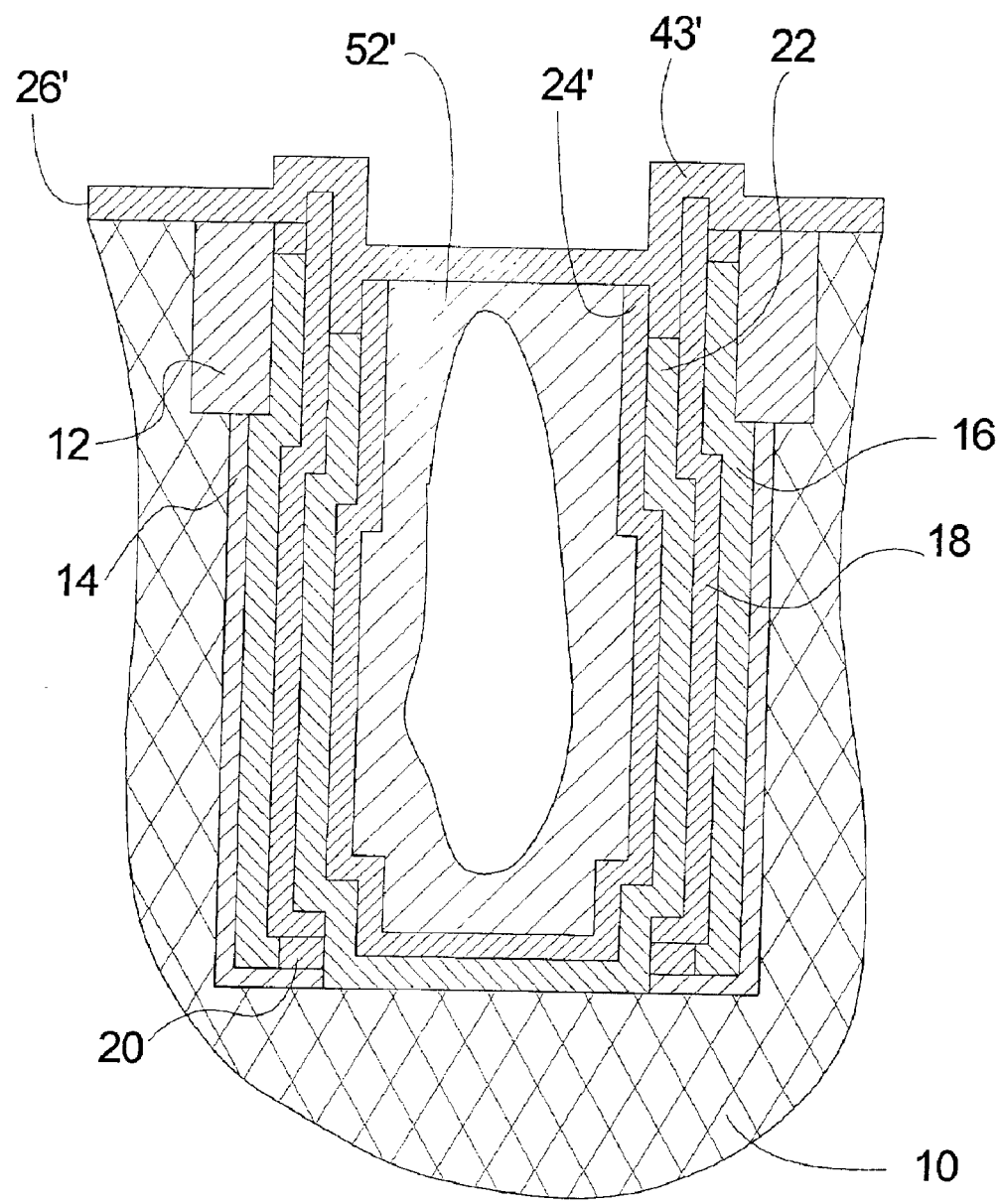
Figure 22:
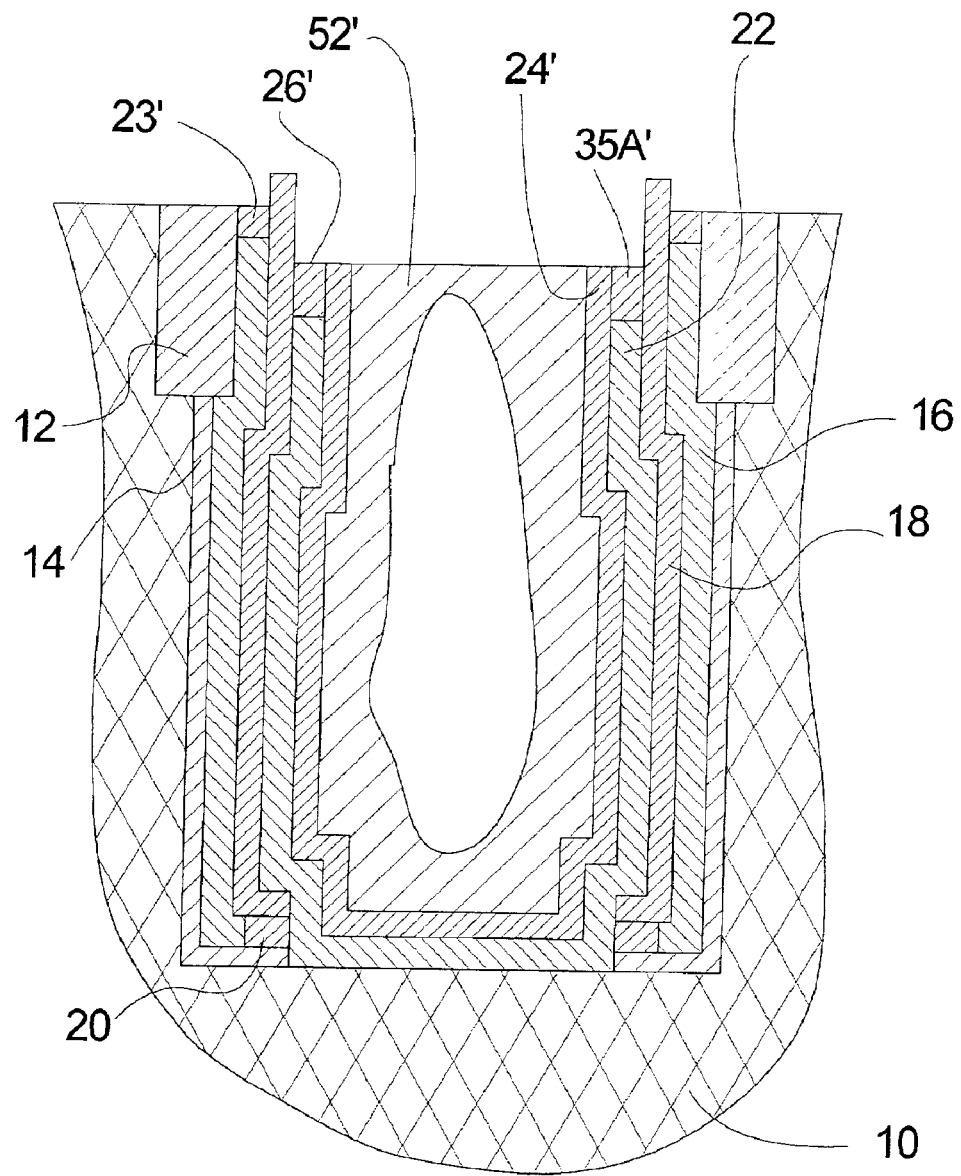

As shown in FIG. 21, without removing sacrificial layer 52', dielectric layer 26' is next deposited to seamlessly fill recess 35' created in conductive layer 22 with an insulating layer of dielectric material. Dielectric layer 26' is then selectively etched to leave encapsulating plugs inside the recessed gaps in conductive layer 22, as shown in FIG. 22. At this point in the process flow, it will be appreciated that the combination of dielectric layers 18, 24', and 26' together form a conformal, seamless insulating layer 43' of dielectric material around conductive layer 22 in the same fashion that dielectric layers 18, 24, and 26 serve to create an insulating layer 43 of dielectric material in the embodiment described above. As shown in FIG. 22, dielectric layer 26' is then etched in a controlled etch to remove all of it except plug 35A'.

Figure 23:
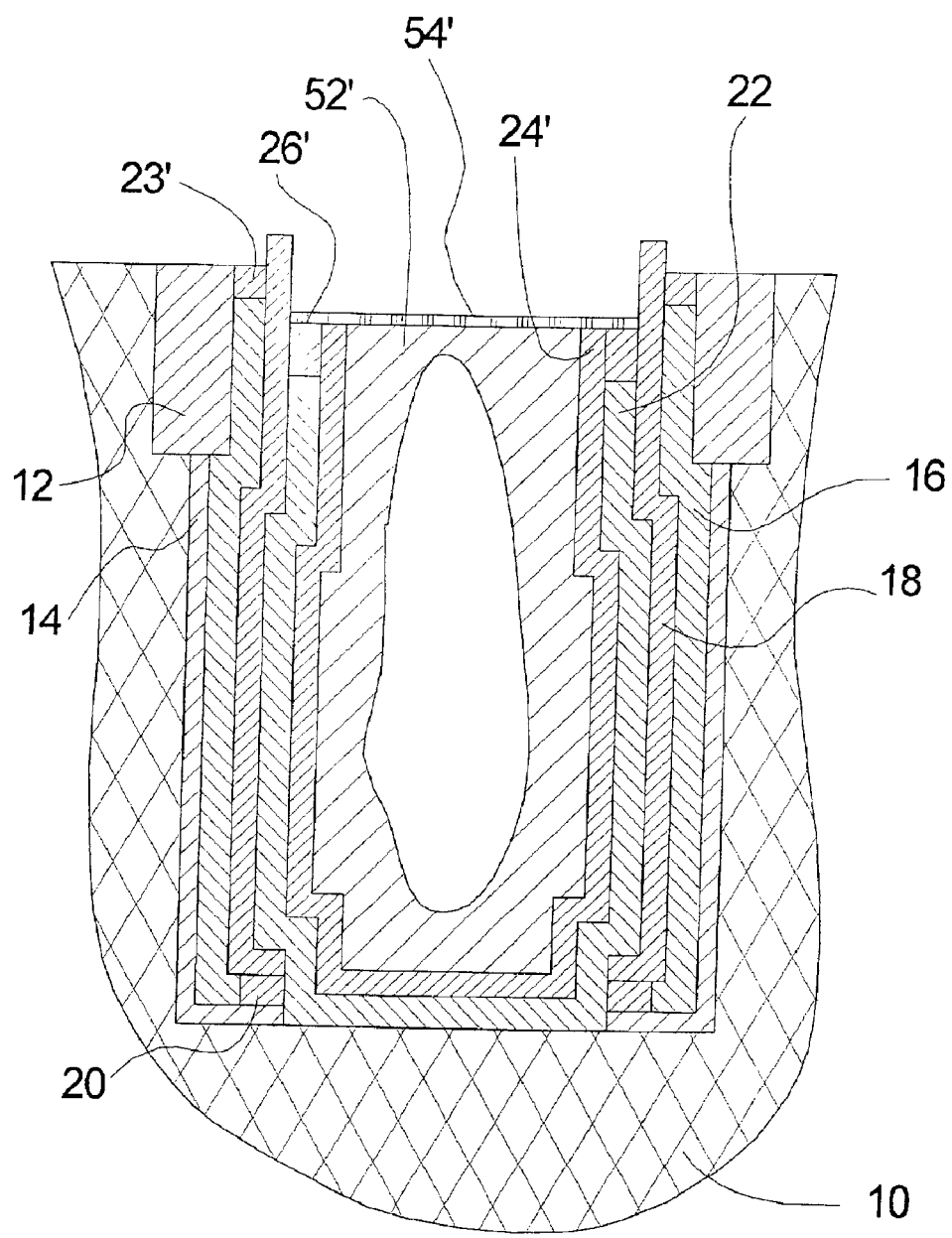
Figure 24:
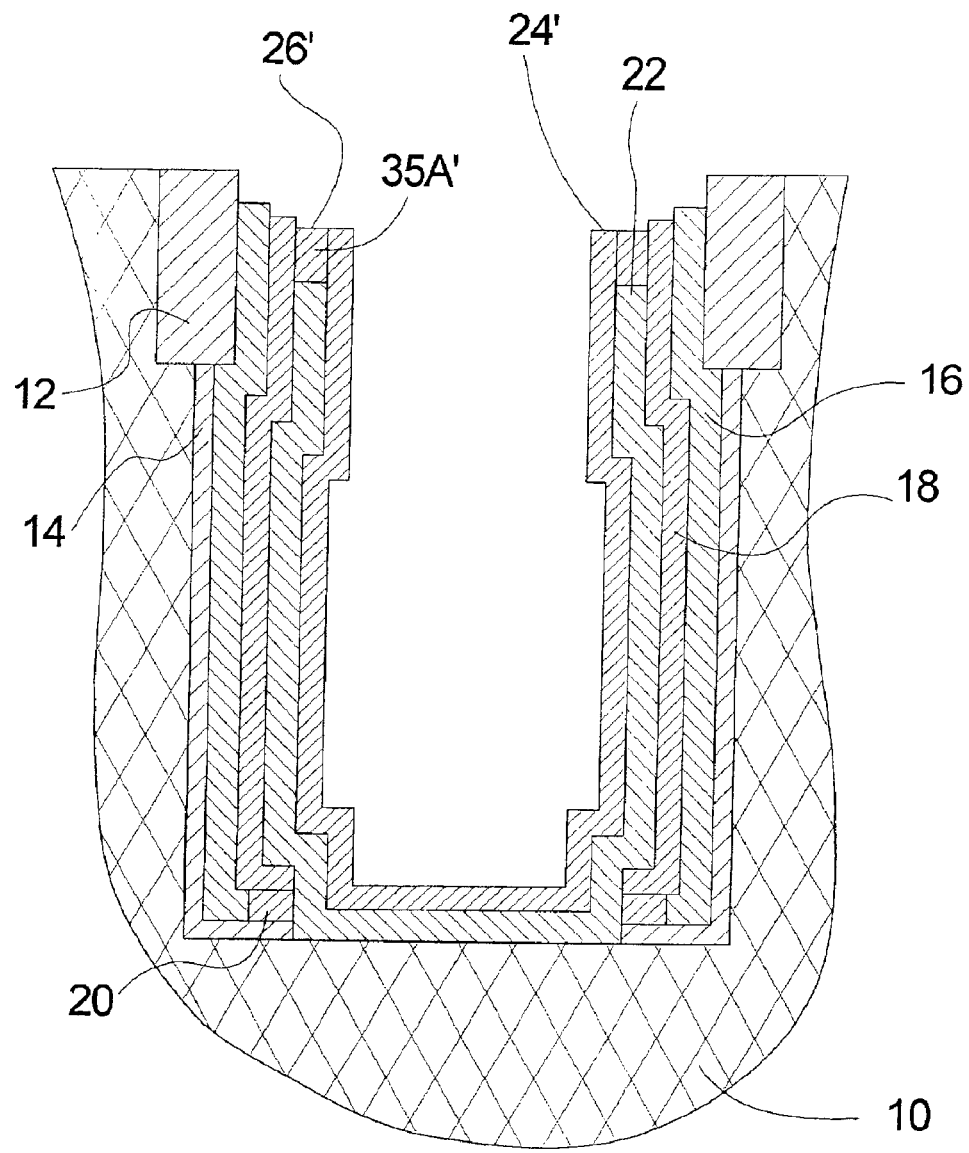

As shown in FIG. 23, sacrificial layer 54' is then deposited in trench 11. Sacrificial layer 54' is preferably formed using the materials and fabrication processes described above with regard to sacrificial layer 54. Sacrificial layer 54' is then recessed, preferably using the etch techniques described above with regard to the recessing of sacrificial layer 54. Sacrificial layer 54' thus acts to expose plug 23' for conductive layer 16 while protecting plug 35A' over conductive layer 22. Portions of dielectric layer 18 and plug 23' are then removed from the area that is not protected by sacrificial layer 54' to expose conductive layer 16, as shown in FIG. 24. The removal process is preferably accomplished as described above. Following this step, sacrificial layers 52' and 54' are removed by conventional techniques without affecting dielectric layer 24'. At this point in the process flow, conductive layer 22 is still surrounded with a seamless insulating layer of dielectric material formed from dielectric layers 18 and 24', and plug 35A'. The need to structurally support dielectric layer 24' has been eliminated, and the process flow may then proceed to completion as described above with regard to FIGS. 14–17.

Figure 25:
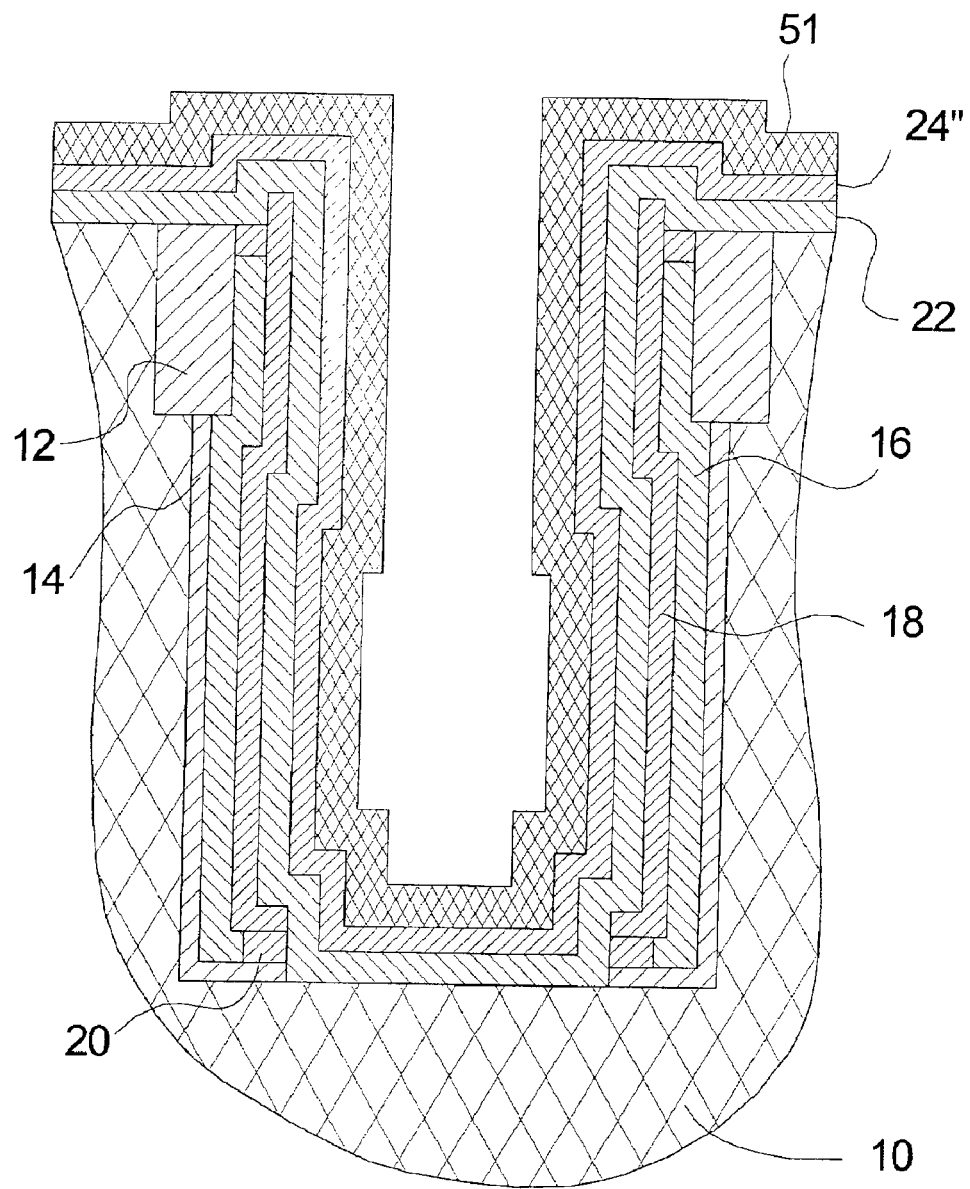
FIGS. 25–30 illustrate a further embodiment of the preferred method of the invention for forming the first four layers of the multilayer capacitor according to the invention.
Figure 26:
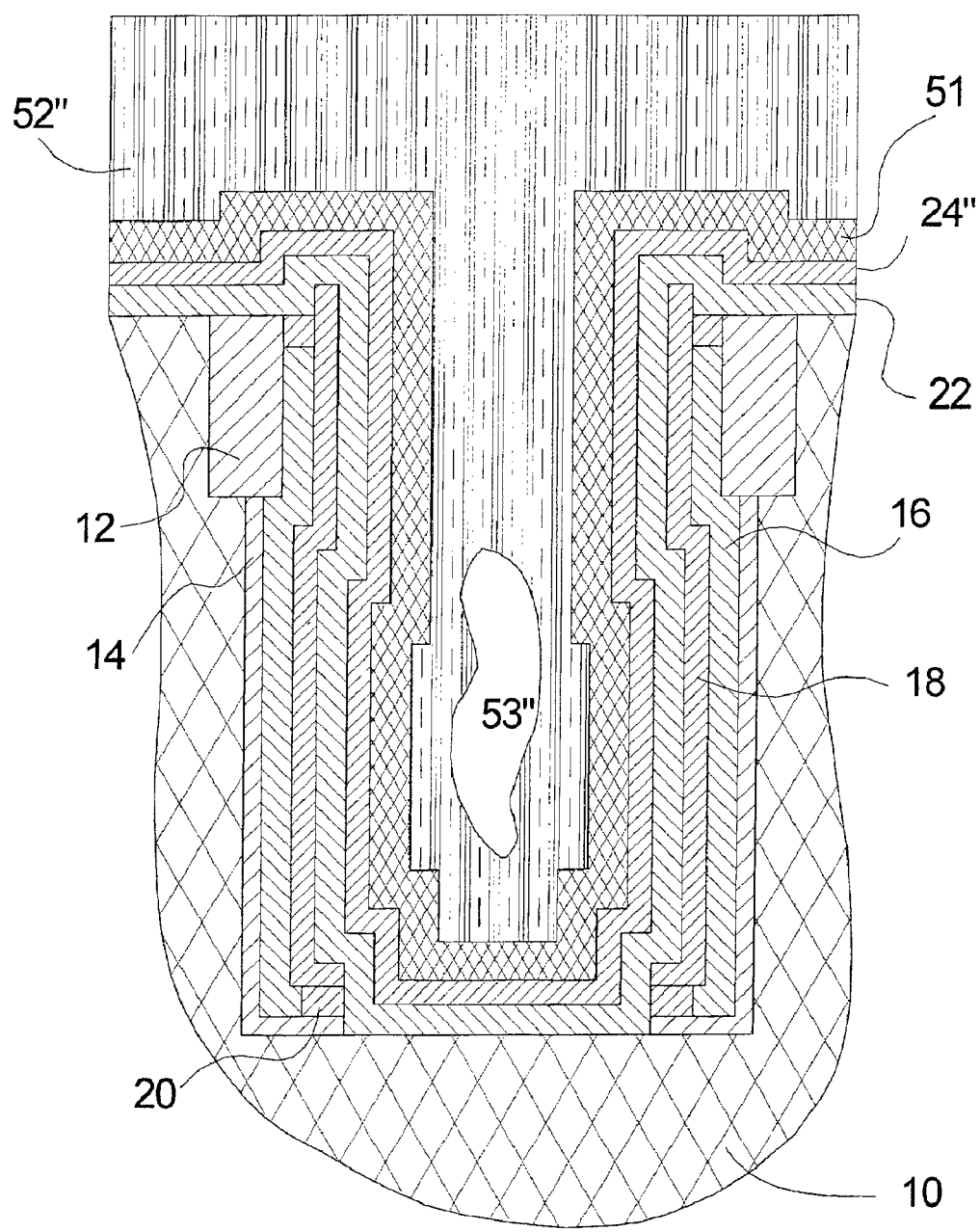
Figure 27:
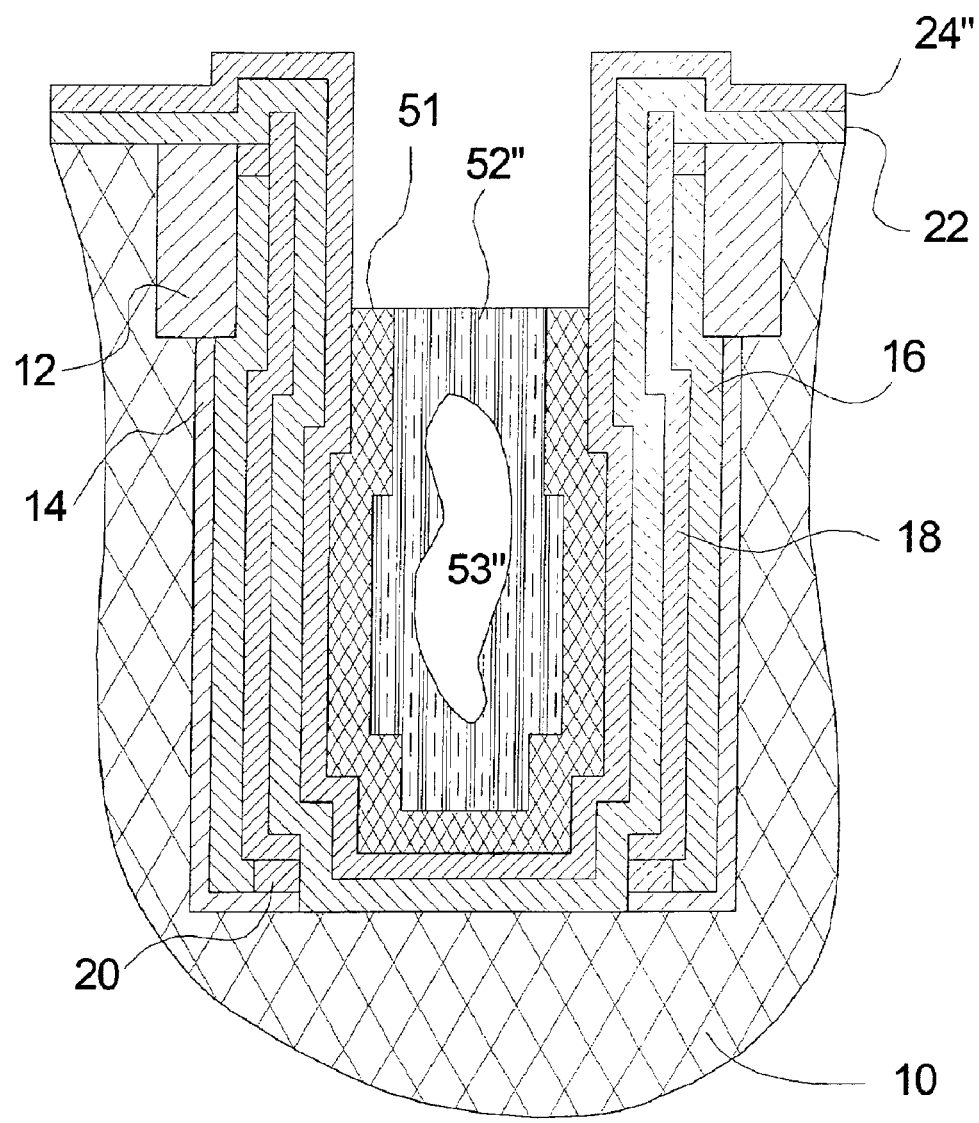

In a second such embodiment, the process flow of the present invention also proceeds as described above to form the structure shown in FIG. 6. However, following the formation of the structure shown in FIG. 6, the process flow deviates from the flow described above to include the steps illustrated in FIGS. 25–30. As shown in FIG. 25, dielectric layer 24" is deposited to full thickness over conductive layer 22. A sacrificial layer 51 is then deposited over dielectric layer 24". Sacrificial layer 51 may be deposited by ALD, CVD or other conventional technique and need not be conformal. As shown in FIG. 26, a sacrificial layer 52" is deposited in the trench. Sacrificial layer 52" is preferably formed using the materials and fabrication processes described above with regard to sacrificial layers 52 and 52', and may contain voids, such as 53". As illustrated in FIG. 27, sacrificial layer 52" is then recessed to expose portions of dielectric layer 24" and sacrificial layer 51. Sacrificial layer 52" may be recessed using the etch techniques described above with regard to the recessing of sacrificial layer 52. Following, sacrificial layer 51 is etched from the exposed area using conventional techniques.

Figure 28:
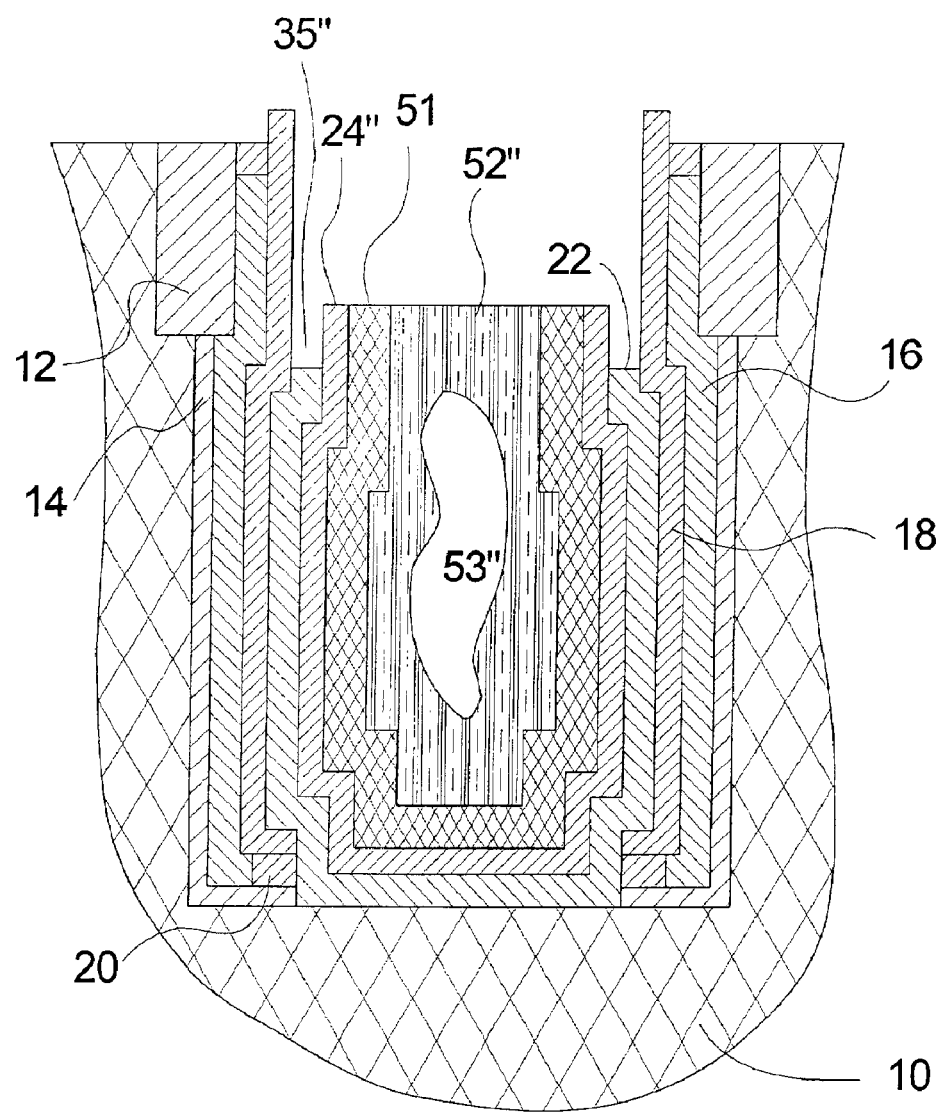
Figure 29:
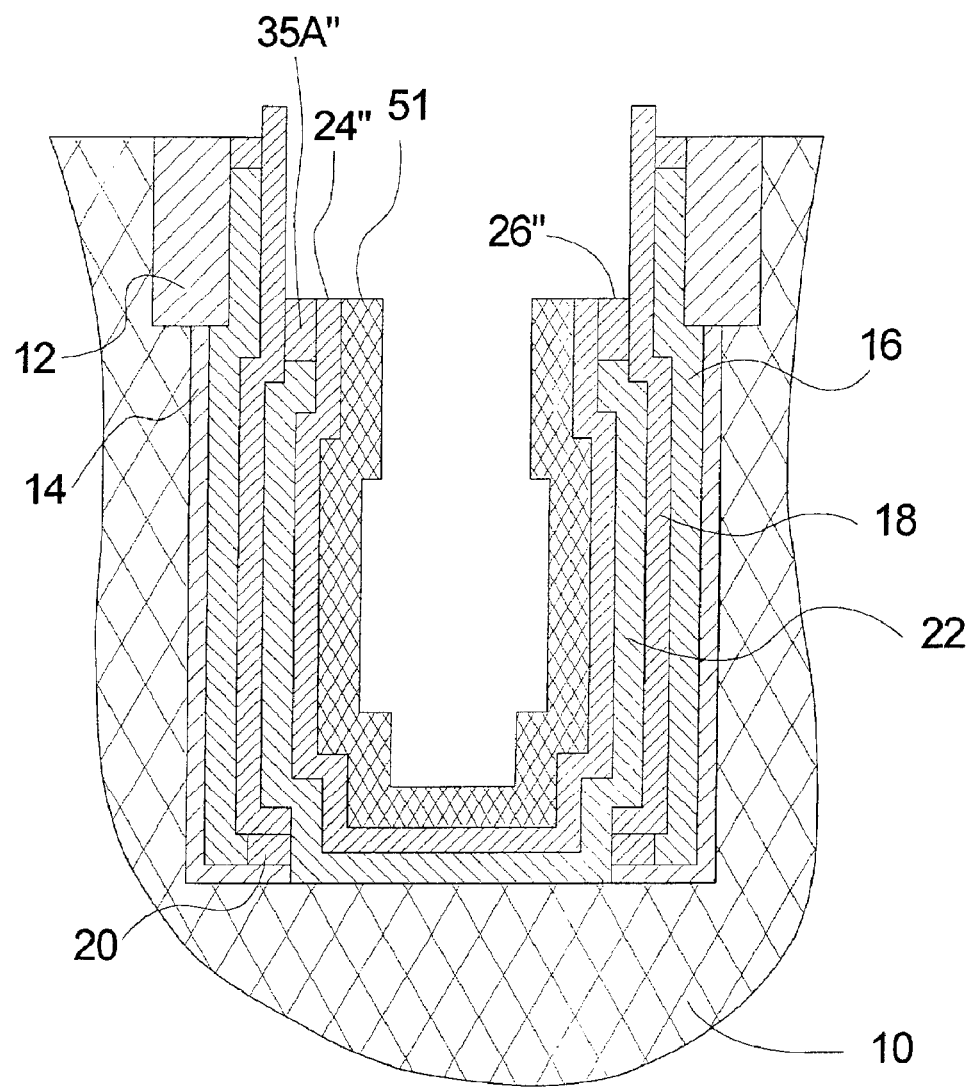

As shown in FIG. 28, dielectric layer 24" is then removed from the area that is no longer protected by sacrificial layer 52" and conductive layer 22 is then over-etched to recess conductive layer 22 below the level of dielectric layer 24" to form a recess 35" in conductive layer 22. Sacrificial layer 52" is then removed, as described above with regard to sacrificial layer 52, and dielectric layer 26" is deposited to fill the recessed gap created in conductive layer 22 with an insulating layer of dielectric material. As shown in FIG. 29, dielectric layer 26" is then selectively etched to leave only plug 35A". Sacrificial layer 51 is then removed by conventional selective etch techniques. It will be appreciated that in the foregoing process flow, the portion of dielectric layer 24" lying adjacent to the recessed gap in conductive layer 22 remains at all times supported by sacrificial layer 51 until it can be supported by dielectric layer 26".

Figure 30:
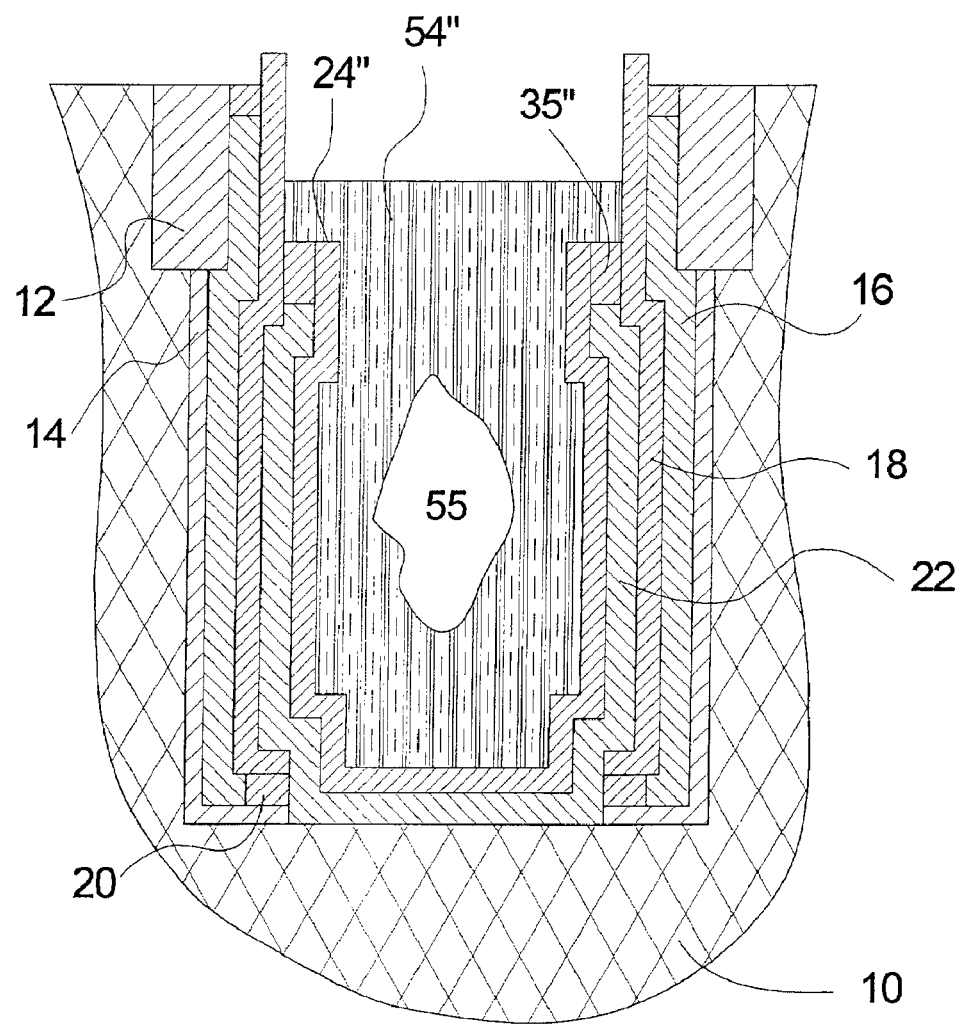

As shown in FIG. 30, a sacrificial layer 54" is next applied to uniformly cover the area of the wafer and to fill in the DT. Sacrificial layer 54" is preferably formed using the materials and fabrication processes described above with regard to sacrificial layer 54. Sacrificial layer 54" is then recessed, preferably using the etch techniques described above with regard to the recessing of sacrificial layer 54. At this point in the process flow, conductive layer 22 has been encapsulated with a seamless insulating layer of dielectric material formed from dielectric layers 18 and 24", and plug 35A". The need to structurally support dielectric layer 24" has been eliminated, and the process flow may then proceed to completion as described above with regard to FIGS. 13–17.

Figure 31:
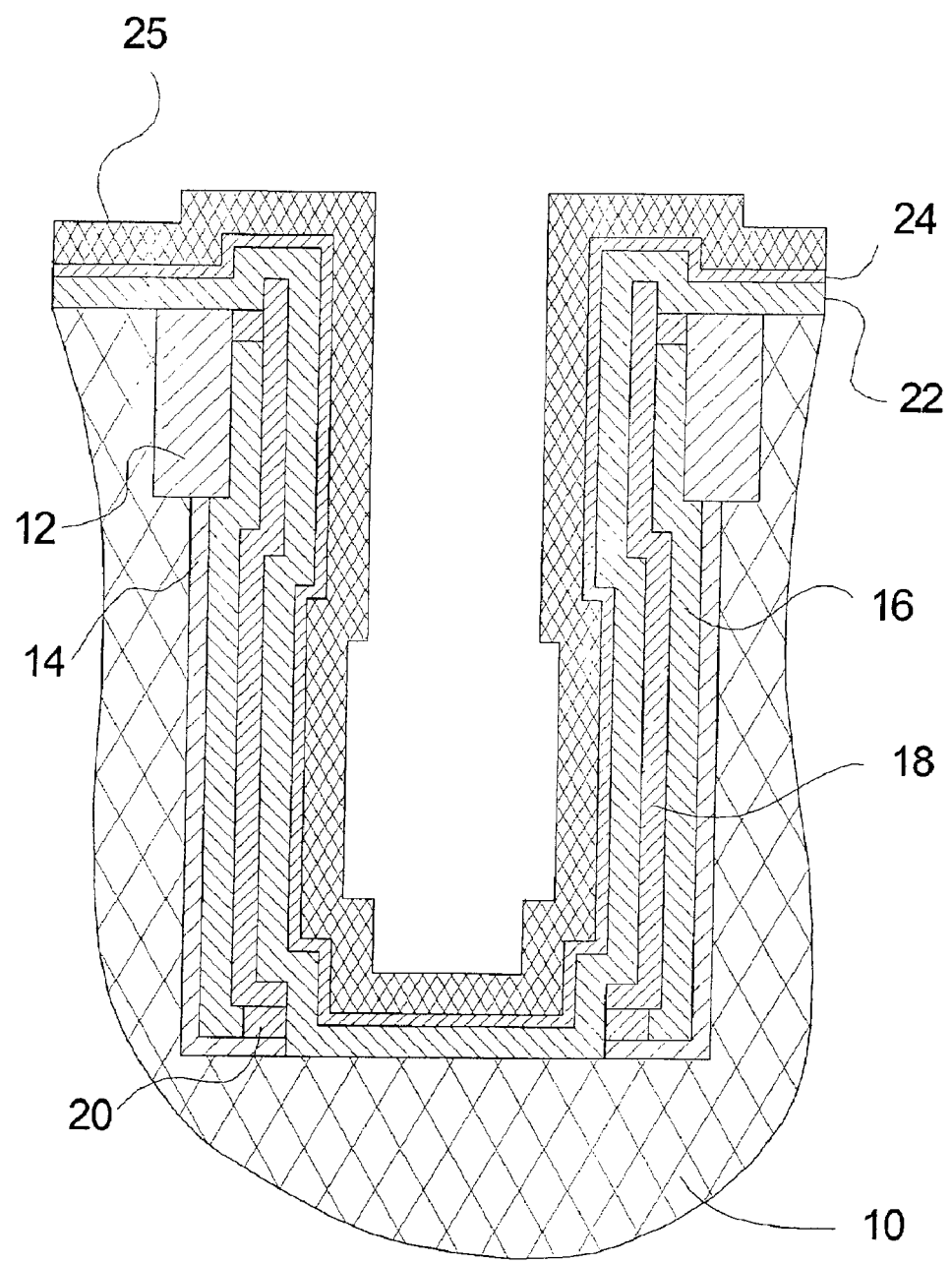
FIGS. 31–33 illustrate yet another preferred embodiment of a portion of the process of the invention subsequent to formation of the substrate of FIG. 7.
Figure 32:
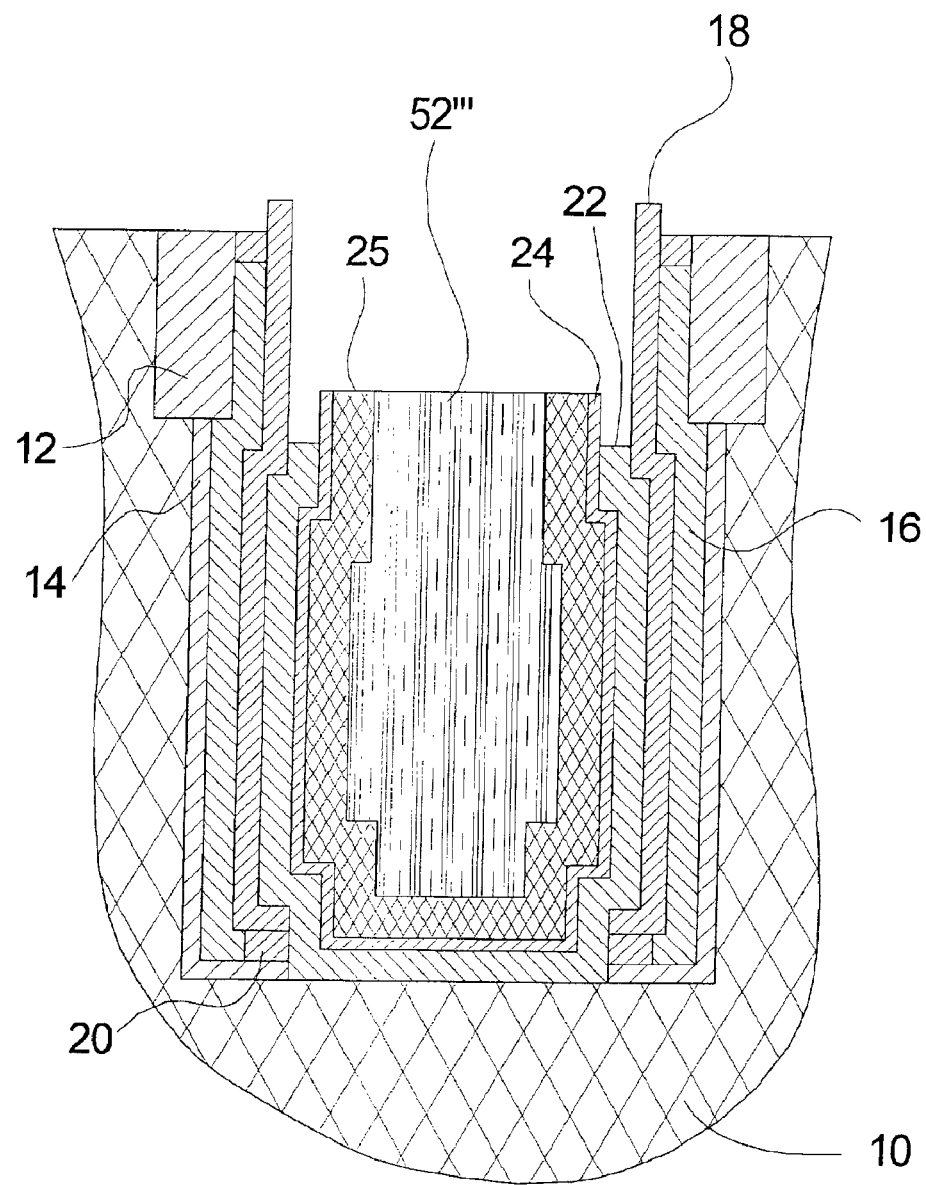
Figure 33:
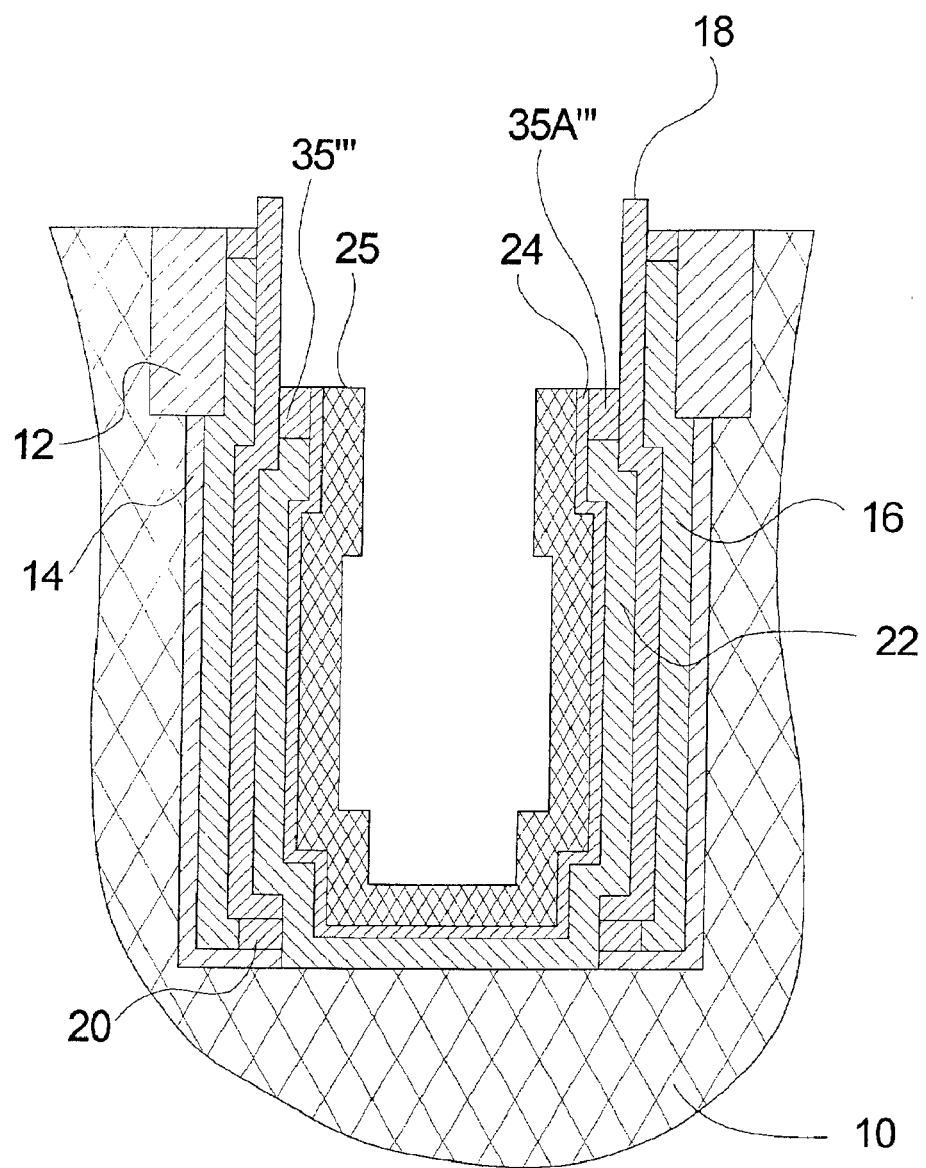

In a third such embodiment, the process flow of the present invention proceeds as described above to form the structure shown in FIG. 7. However, following the formation of the structure shown in FIG. 7, the process flow deviates from the flow described above to include the steps illustrated in FIGS. 31–33. As shown in FIG. 31, a sacrificial layer 25 is deposited on top of dielectric layer 24. Sacrificial layer 25 is preferably formed using the materials and fabrication processes described above with regard to sacrificial layer 50. Sacrificial layer 25 thus serves to add additional strength and robustness to adjacent dielectric layer 24. Sacrificial layer 52''' is then applied to uniformly cover the area of the wafer and to fill in the trench. Sacrificial layer 52''' is preferably formed using the materials and fabrication processes described above with regard to sacrificial layer 52. As shown in FIG. 32, sacrificial layer 52''' is then recessed to expose sacrificial layer 25. Sacrificial layer 52''' may be recessed using the etch techniques described above with regard to the recessing of sacrificial layer 52. The exposed areas of conductive layer 22, dielectric layer 24 and sacrificial layer 25 are then removed, and over-etch is applied to recess conductive layer 22 below the level of dielectric layer 24 and sacrificial layer 25. As shown in FIG. 33, sacrificial layer 52''' is next removed by conventional techniques. Despite the removal of sacrificial layer 52''', as can be seen from FIG. 33, the integrity of dielectric layer 24 is enhanced by the support of sacrificial layer 25. Dielectric layer 26''' is then deposited to seamlessly fill recess 35''' in conductive layer 22. Dielectric layer 26''' is etched leaving only insulating plug 35A'''. Sacrificial layer 25 is then removed using conventional techniques and dielectric layer 24 is grown to full thickness. At this point in the process flow, conductive layer 22 has been encapsulated with a seamless insulating layer of dielectric material formed from dielectric layers 18 and 24, and plug 35A'''. The need to structurally support dielectric layer 24 has been eliminated, and the process flow may then proceed to completion as described above with regard to FIGS. 11–17.

Figure 34:
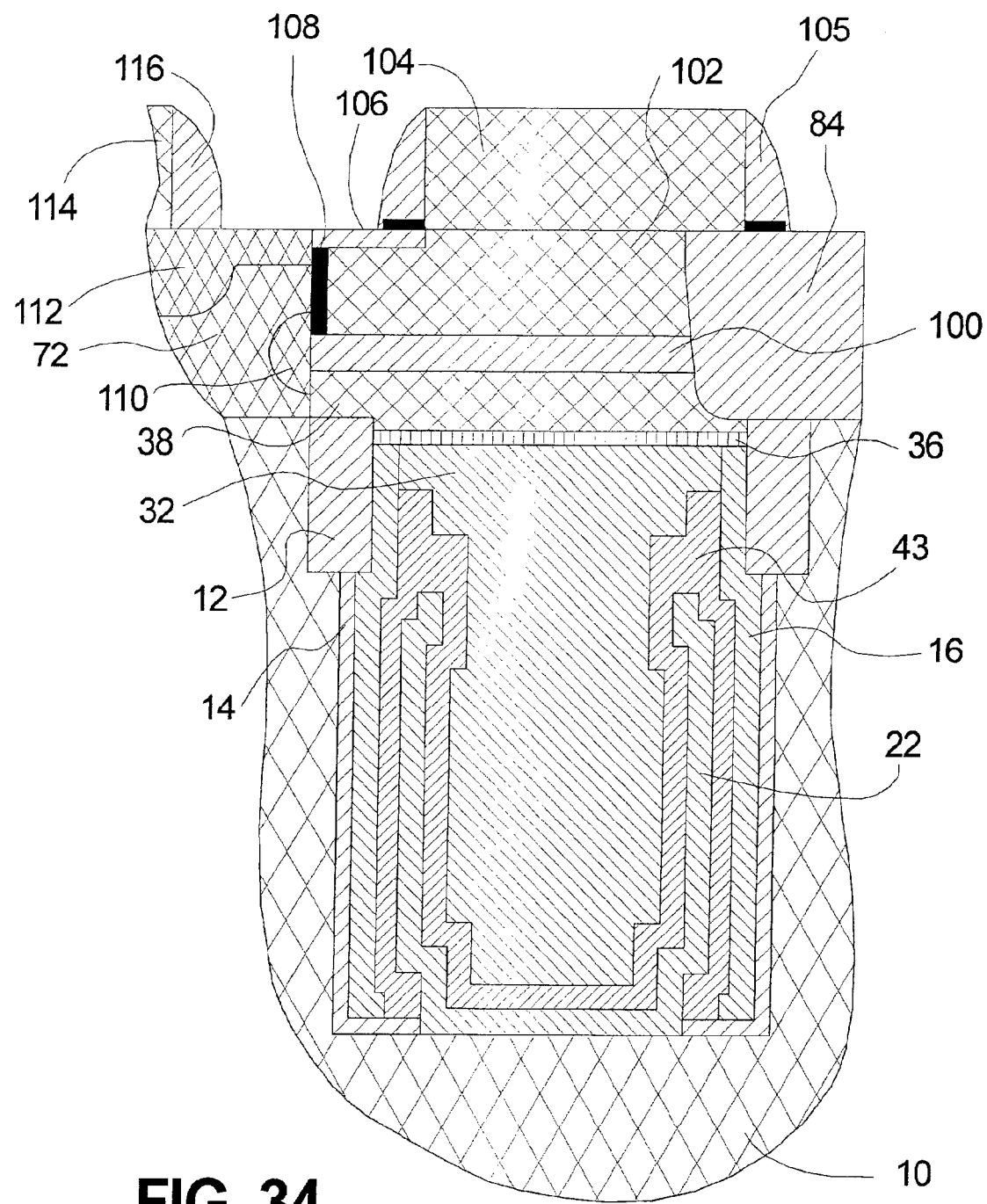
FIG. 34 illustrates the integration of the present invention with a VERI BEST deep trench technology with vertical passing transistor.

In another embodiment, a CLASS³ capacitor of the present invention is integrated with emerging VERtical access transistor and BuriEd STrap (VERI BEST) technology. As shown in FIG. 34, in this embodiment, buried strap layer 38 is insulated from silicon plug 102 by insulating layer 100, all manufactured according to established VERI BEST process flow. The gate dielectric of passing transistor 108 is formed vertically on the wall of the trench prior to the deposition of polysilicon plug 102. Drain area 110 and bit line contact 112 are formed according to established VERI BEST techniques. Similarly, shallow trench isolation 84 and insulation layer 106 are formed by conventional VERI BEST process flow. In this configuration, passing transistor 108 is activated by word line 104 that is formed above the DT while passing word line 114 is formed on the side of the DT. One of average skill in the art will appreciate that VERI BEST technology lends itself into sub $8F^2$ memory cell design, and offering possibilities to moderate feature size reductions. Accordingly, the present invention is compatible with VERI BEST technology and creates the potential for further simplicity and cost reduction of memory manufacturing at the 64 Gb node and beyond.

The embodiments described above emphasize the particular advantages of the present invention. In particular, it should be appreciated by one of average skill in the art from reading the foregoing description that the process flow of the present invention is entirely self-aligned. Additionally, most critical pattern delineation steps of the embodiment of the present invention described above may utilize wet etch techniques that are generally recognized as cheap, dependable, versatile, highly selective, well controlled and damage free. Further, particular utilization of undercut and over-etch to produce recessed gaps is advantageous. Likewise, the process flow is designed to avoid ambient exposure of conductive-layer surfaces that are notorious for creating inferior metal-dielectric interfaces due to oxidation and contamination. Therefore, conductive layers are deposited in an integrated process with a covering dielectric layer without ambient exposure. In contrast, dielectric layers can be exposed to the ambient and are easy to clean and prepare for conductive layer deposition.

Figure 35:
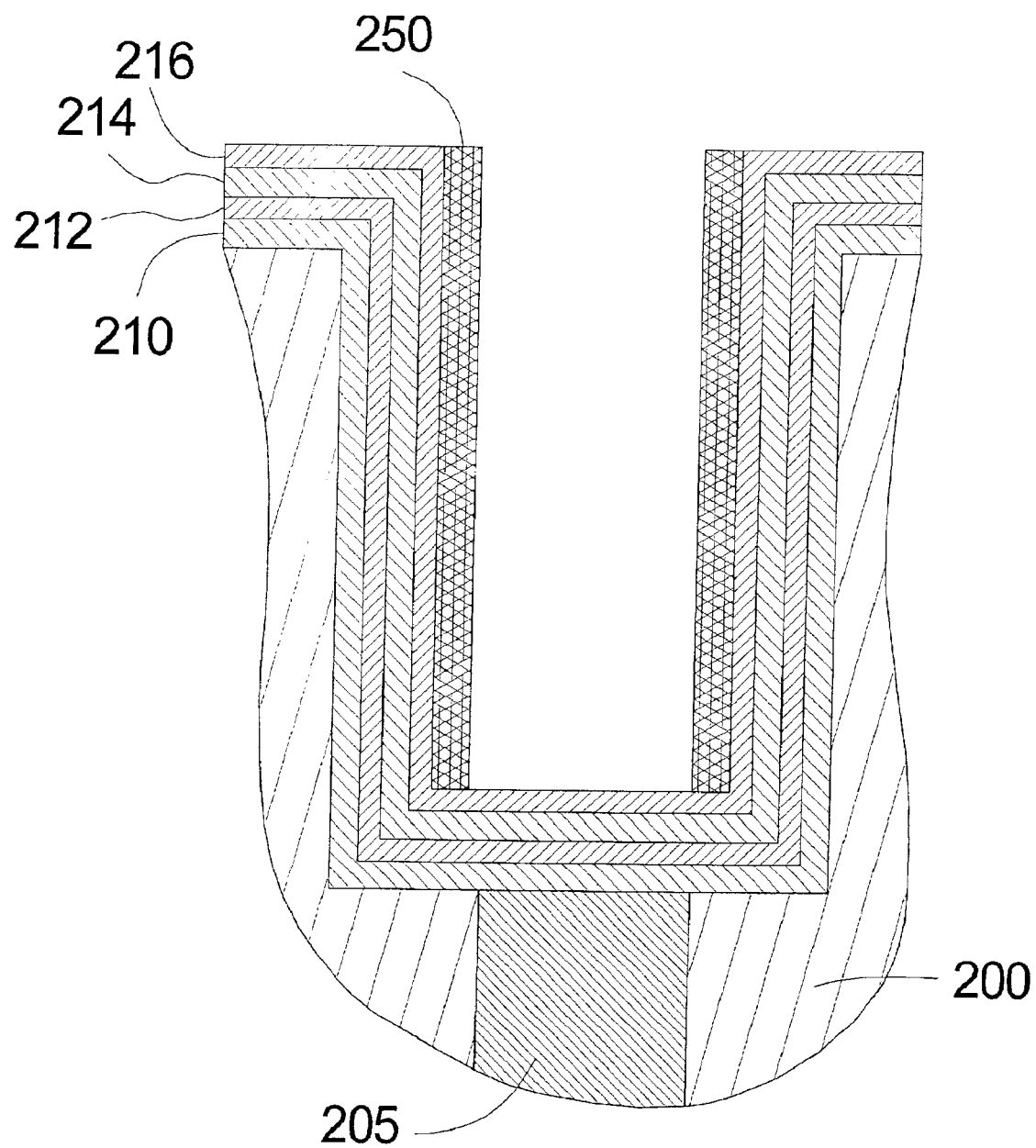
FIGS. 35–41 illustrate a preferred embodiment of the process by which a multilayer capacitor may be formed on an insulating substrate according to the present invention.

In another embodiment of the present invention, shown in FIGS. 35–40, a CLASS$^3$ is formed into an interconnect layer for embedded memory or RF applications. According to this embodiment of the present invention, and as shown in FIG. 35, a cavity is formed in an interlevel dielectric layer (ILD) 200 over a contact via 205. Next, a 3×MIM capacitor is fabricated. Accordingly, five layers (210, 212, 214, 216 and 250) are deposited in the cavity. Preferably, the layers are deposited by ALD without ambient exposure. The layers comprise conductive layers 210 and 214, dielectric layers 212 and 216, and sacrificial layer 250. Sacrificial layer 250 is anisotropically etched, preferably using a process described above with regard to FIG. 3.

Figure 36:
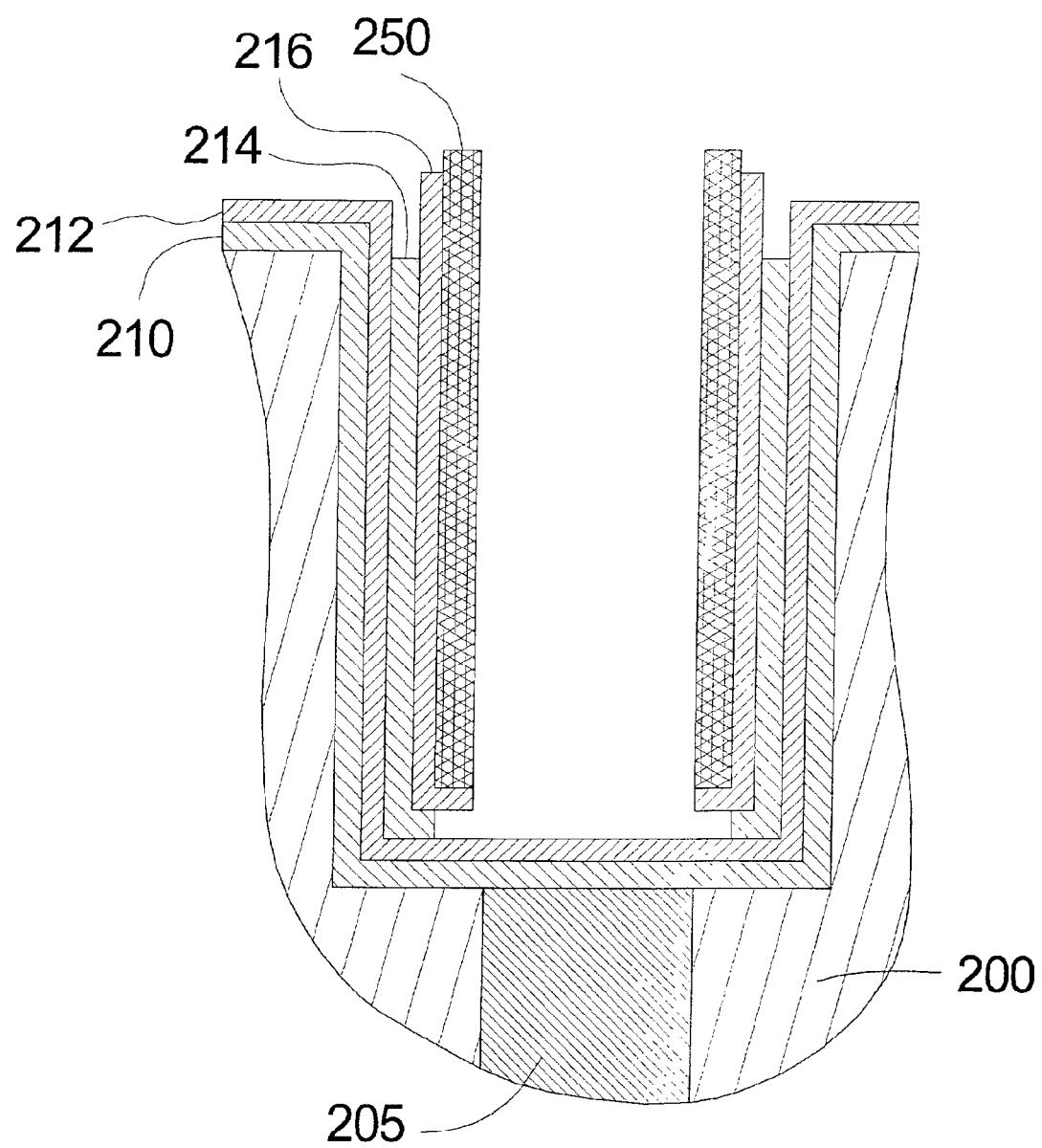

As shown in FIG. 36, dielectric layer 216 is opened and conductive layer 214 is etched and recessed, preferably using technology described above with regard to FIG. 4.

Figure 37:
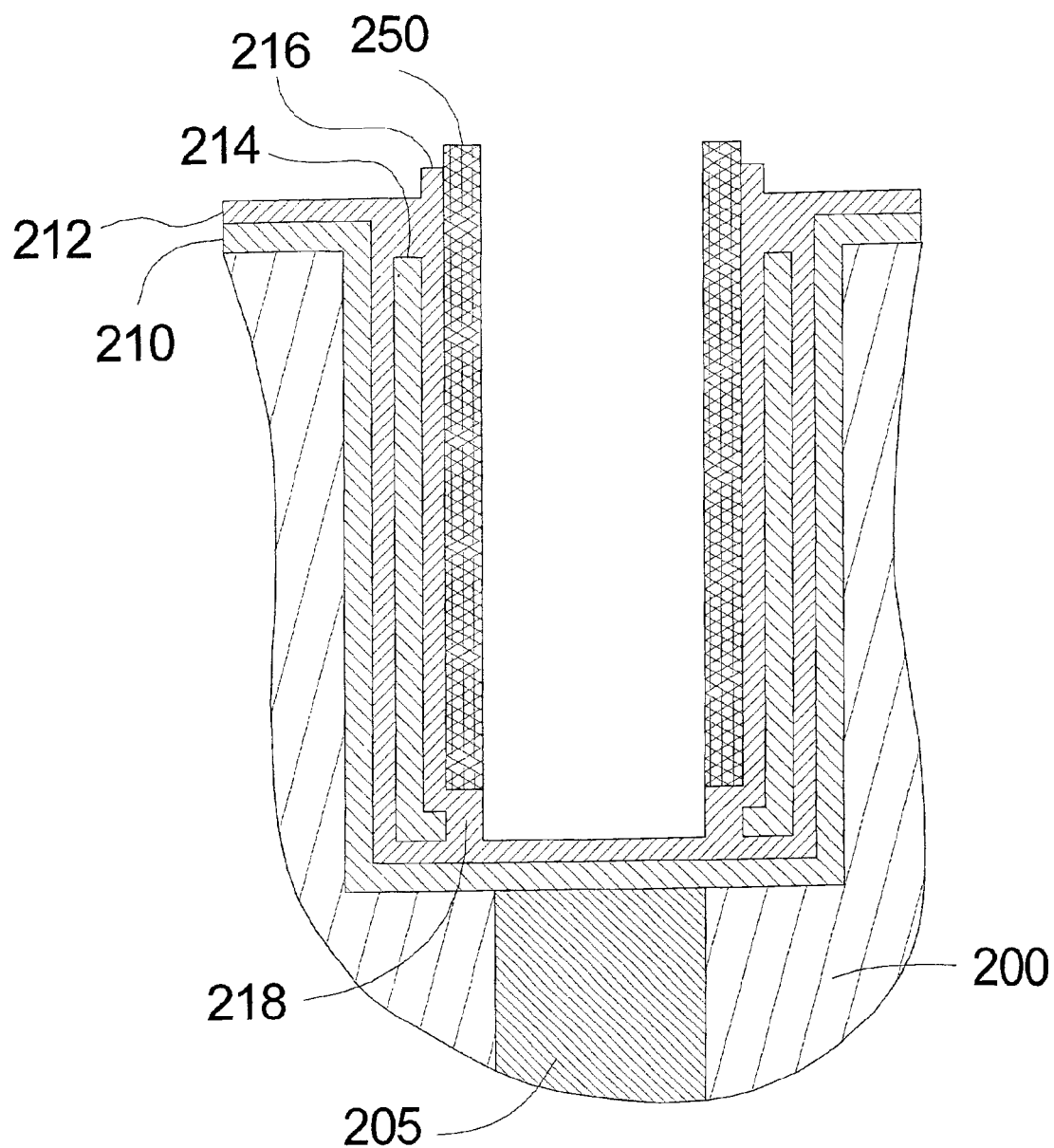
Figure 38:
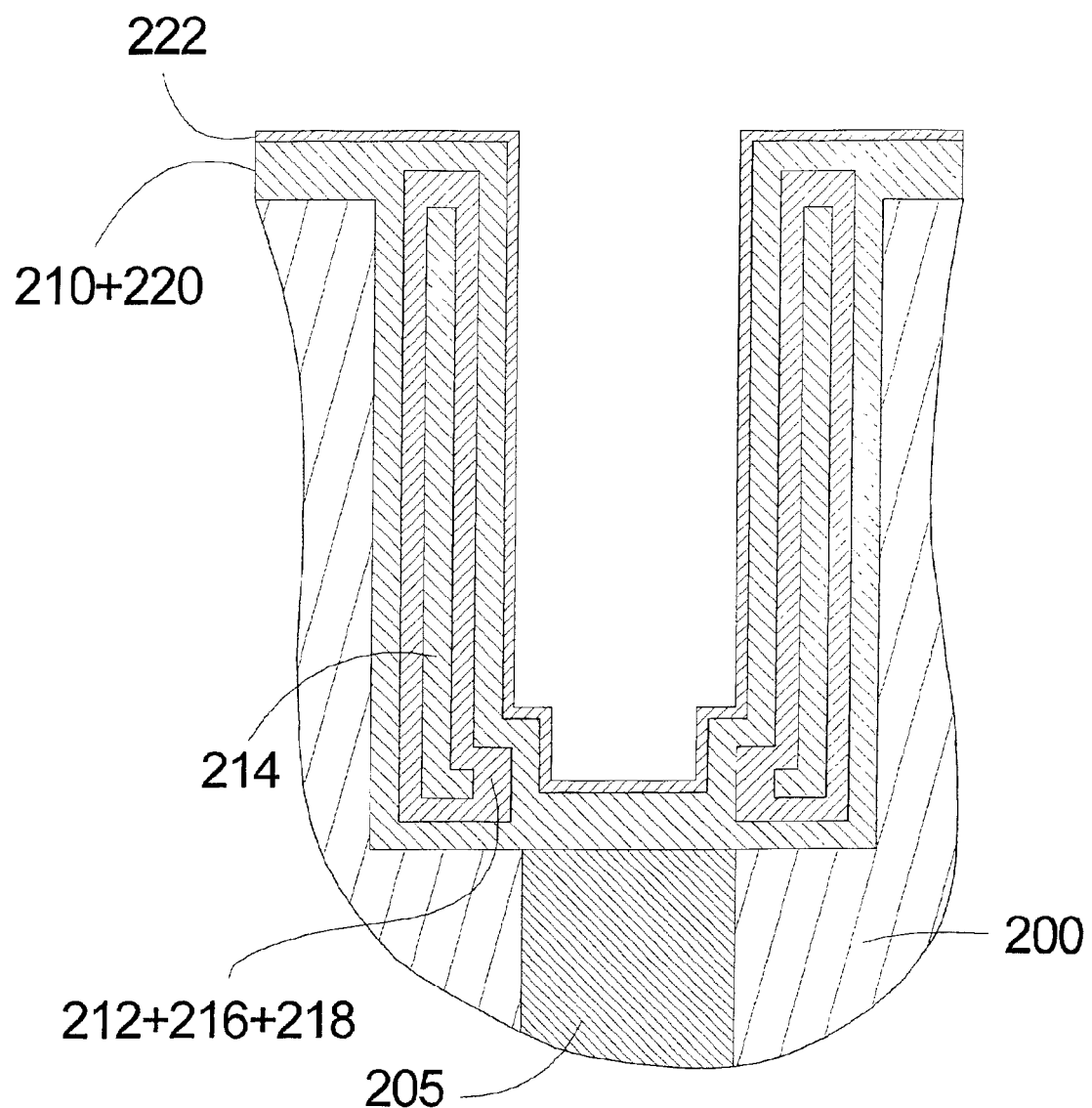

As shown in FIG. 37, conductive layer 216 is then insulated using process flow of the type described above with regard to FIGS. 5 and 6. In the next steps shown in FIG. 38, sacrificial layer 250 has been removed and a stack of conductive layer 220 and dielectric layer 222 have been deposited using processes described with regard to FIG. 7 above.

Figure 39:
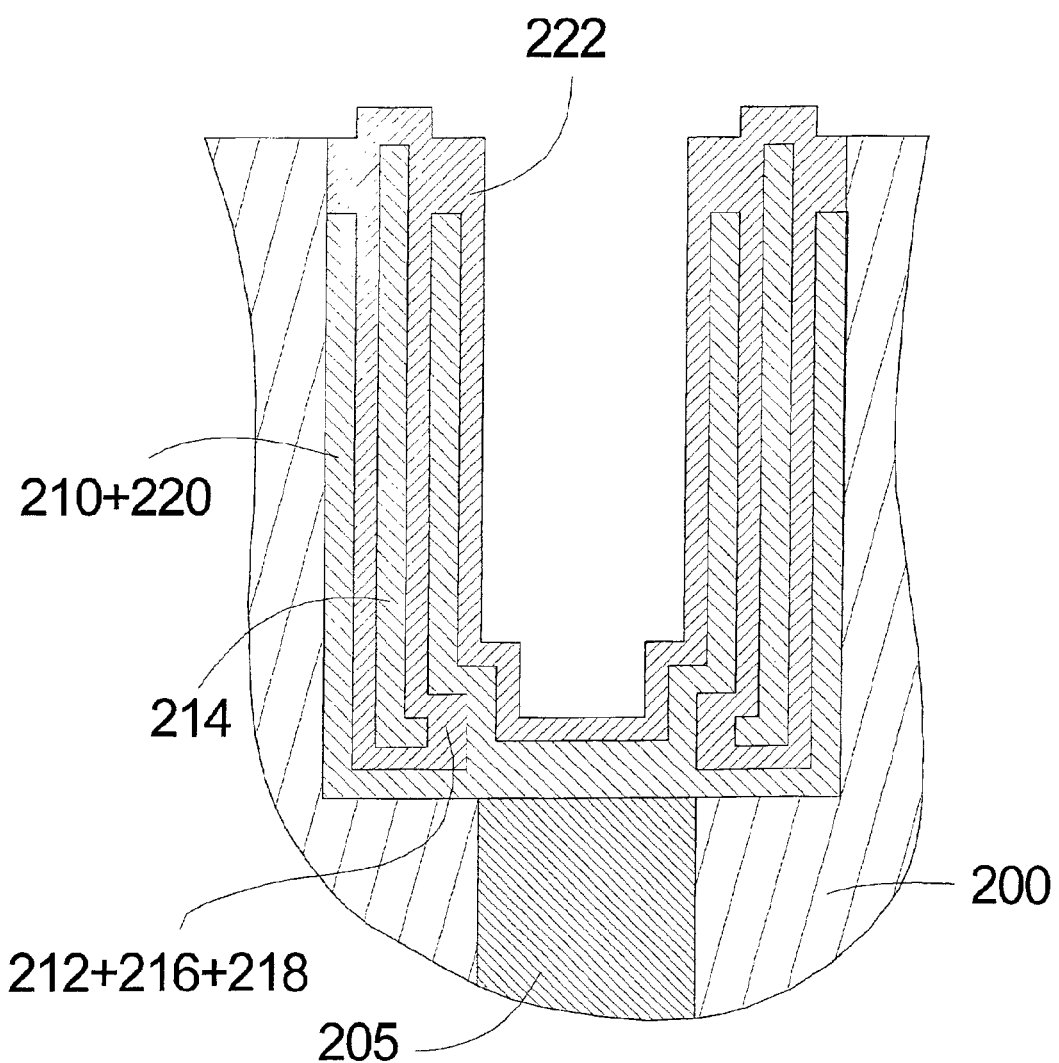

As shown in FIG. 39, in the next steps, conductive layers 210 and 220 are insulated using processes described above with regard to FIGS. 8–11. Alternatively, the capacitor structure displayed in FIG. 39 can be fabricated using process steps similar to the embodiment described above with respect to FIGS. 18–24 or FIGS. 25–30 or FIGS. 31–33.

Figure 40:
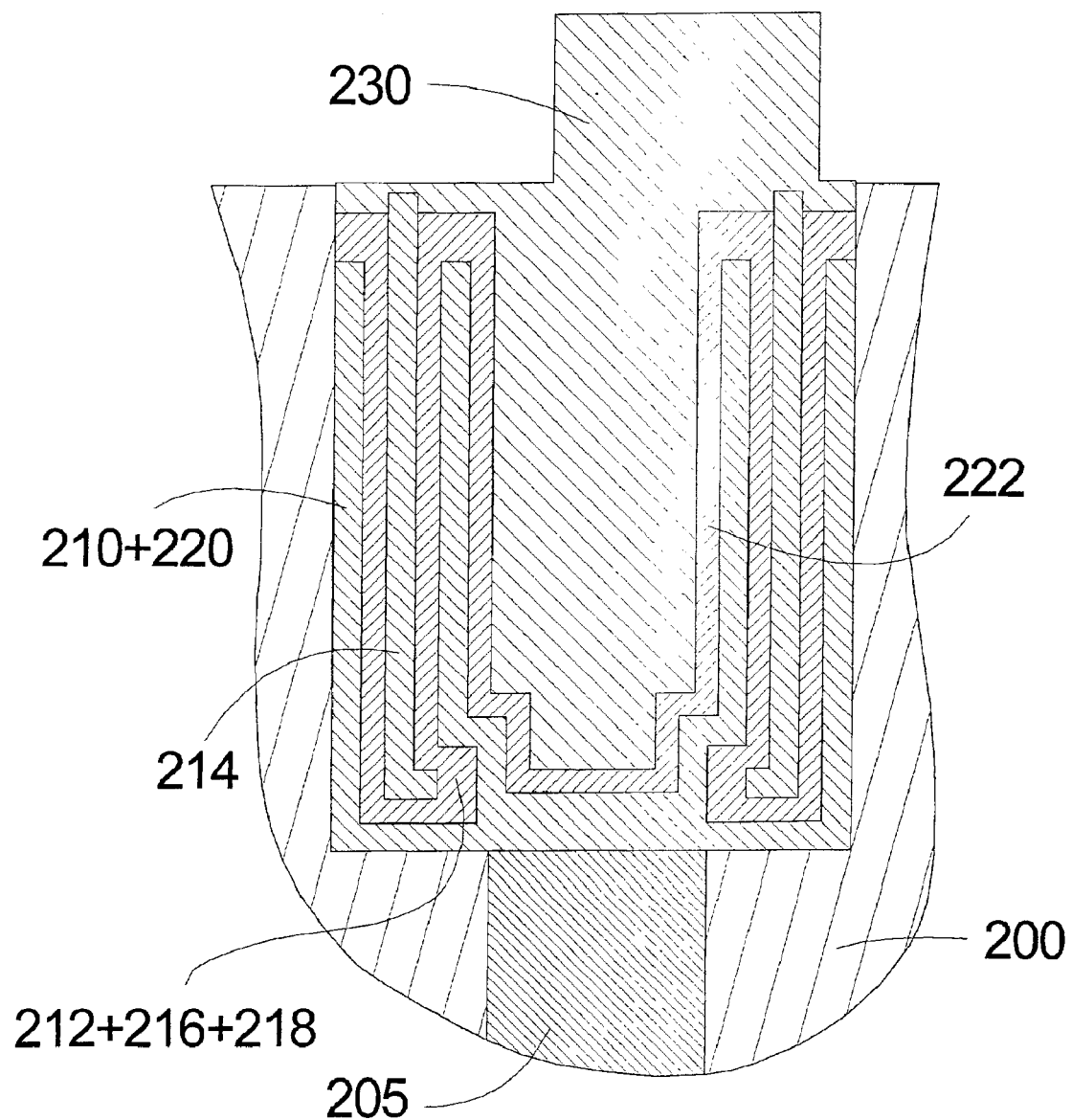

FIG. 40 illustrates the complete CLASS$^3$ of the present embodiment with a metallic contact 230 formed to interface with the interconnect layers of the capacitor. The process steps used to fabricate the CLASS$^3$ shown in FIG. 40 are similar to those steps described above with regard to FIGS. 12–14, with the exception that compatibility with silicon is not an issue in this embodiment, and the thermal budget is substantially lower in this particular back end of the line application. Accordingly, layer 230 is preferably implemented with metals or metal nitrides to produce the top contact and interconnect to conductive layer 214.

Figure 41:
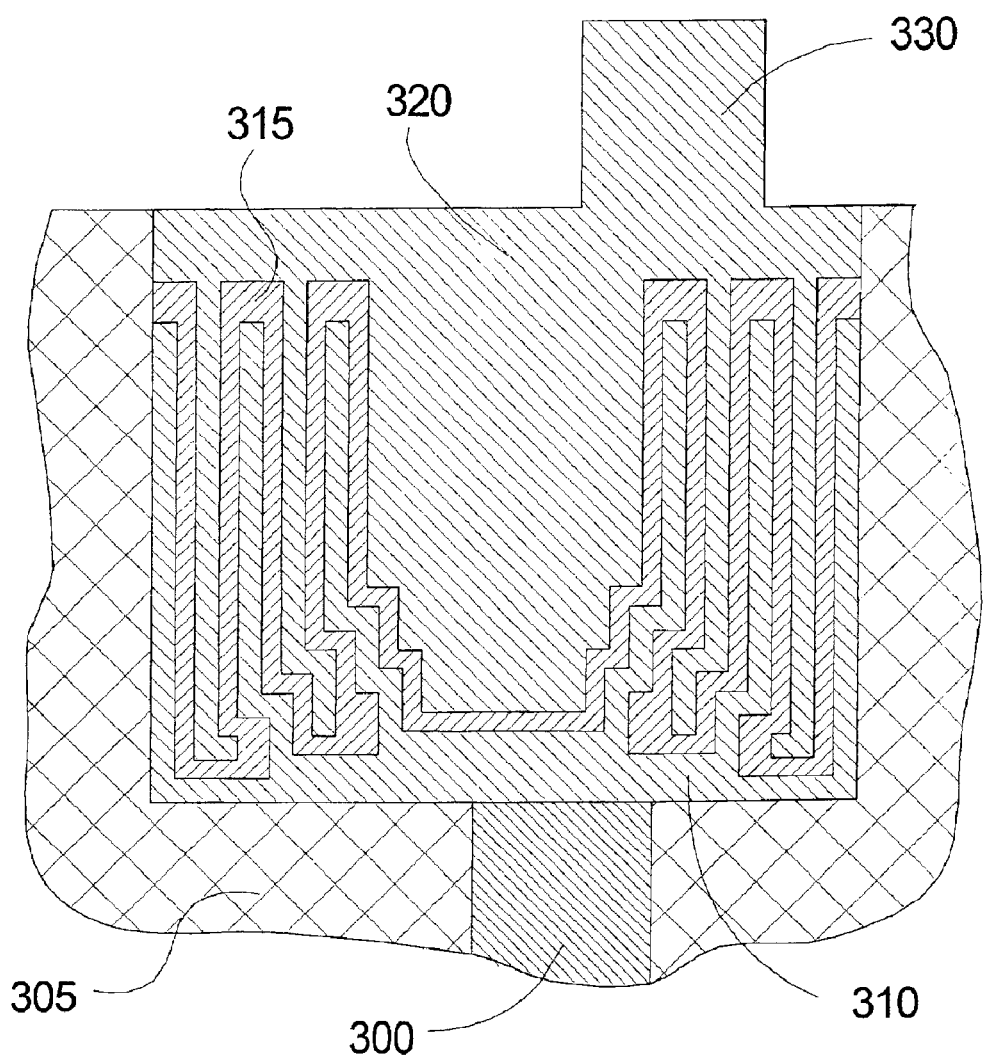

In a further embodiment of the present invention, a CLASS$^5$ capacitor is illustrated in FIG. 41. It will be appreciated by one of average skill in the art that the CLASS$^5$ capacitor shown in FIG. 41 is an extension of the CLASS$^3$ capacitor that is illustrated in FIGS. 19–24. The additional two capacitors of the CLASS$^5$ capacitor are manufactured by additional steps comprising: completing steps to the point represented in FIG. 37, removing sacrificial layer 250, opening a contact hole in dielectric layer 212, and proceeding with process steps described below with regard to a generic embodiment for CLASS fabrication, to process the additional two capacitors. Per the generic embodiment that is given below, steps 13–24 are iterated once to fabricate the CLASS$^5$ capacitor that is shown in FIG. 41. As shown in FIG. 41, the process fabricates the capacitor with bottom contact 310 to a via conductor 300 and top contact 330. Dielectric layer 315 is continuously running between bottom electrode 310 and top electrode 320.

Based on the above, a generic CLASS fabrication embodiment can be seen to comprise:

1. A first interleaved five-layer stack is fabricated into a trench or a cavity. This stack may include: a silicon substrate, a conventional dielectric layer, conductive layer $M_2$, dielectric layer $D_2$, and sacrificial layer. Alternatively, the stack may include: $M_1$, $D_1$, $M_2$, $D_2$, sacrificial layer. All deposited layers are produced with exceptional conformality using ALD or equivalent techniques.
2. A sacrificial layer is removed from the bottom and the top of the trench by anisotropic etch.
3. A selective etch is used to remove the $D_2$ layer from the bottom and top of the trench.
4. A selective etch is used to remove the $M_2$ layer from the bottom and top of the trench. Over-etch is applied to create recesses at the top and at the bottom of the trench.
5. A conformal insulating layer is deposited by ALD to a thickness that equals or exceeds half the thickness of the recessed $M_2$ layer to seamlessly enclose the recess. This film is subsequently etched and removed from the trench leaving insulating plugs inside the recessed gaps in the $M_2$ layer, therefore encapsulating the $M_2$ layer with insulation at the bottom and at the top of the trench or cavity, for example, as described with respect to FIGS. 5 and 6.
6. The $D_1$ layer is selectively etched from the bottom and the top to expose the M1 layer. Alternatively, the conventional dielectric layer that is implemented when the bottom electrode is made of silicon, is etched at the bottom of the trench and the exposed silicon substrate is processed to create a thermally stable contact.
7. The sacrificial layer is removed and a stack comprising $M_3$ and $D_3$ are conformally deposited into the trench. The $M_3$ layer makes contact with the $M_1$ layer or the silicon contact at the bottom of the trench or cavity. An additional sacrificial layer may be deposited over $D_3$.
8. The trench or cavity is filled with a protective layer, such as photoresist or polymer, to protect the layers inside the trench from etching, and the protective layer is recessed below the top.
9. The $D_3$ layer is selectively etched at the area that is not protected by the protective layer at the top of the trench to expose layers $M_1$ and $M_3$.
10. Layers $M_1$ and $M_3$ are selectively etched at the area that is not protected. Over-etch is applied to layers $M_1$ and $M_3$ to create recesses.
11. The protective layer is removed.
12. An insulating layer is deposited to a thickness that equals or exceeds half the thickness of $M_1$ and $M_3$ by ALD to seamlessly close the recesses and create insulating plugs after a selective etch step that removes the insulating layer from all the area with the exception of the insulating plugs, for example, as described above with regards to FIGS. 21 and 22.
13. At this point, three additional layers $M_i$ and $D_i$ (i=4, 6, 8 . . . ) and a sacrificial layer may be deposited over the $D_{i-1}$ layer if a super-stack of more than three capacitors is fabricated.
14. The sacrificial layer is removed from the bottom and the top of the trench by anisotropic etch.
15. A selective etch is used to remove the $D_i$ layer from the bottom and top of the trench.

16. A selective etch is used to remove the $M_i$ layer from the bottom and top of the trench. Over-etch is applied to create recesses at the top and at the bottom of the trench.
17. A conformal insulating layer is deposited by ALD to a thickness that equals or exceeds half the thickness of the recessed $M_i$ layer to seamlessly fill the recess. This film is subsequently etched and removed from the trench leaving insulating plugs inside the recesses in the $M_i$ layer, therefore encapsulating the $M_i$ layer with insulation at the bottom and at the top of the trench or cavity.
18. The $D_{i-1}$ layer is selectively etched from the bottom and the top to expose the $M_{i-1}$ layer.
19. The sacrificial layer is removed and a stack comprising a conductive layer, $M_{i+1}$, and a dielectric layer, $D_{i+1}$, are conformally deposited into the trench. The $M_{i+1}$ layer makes contact with the $M_{i-1}$ layer at the bottom of the trench or cavity. An additional sacrificial layer may be deposited over $D_{i+1}$.
20. The trench or cavity is filled with a protective layer, such as photoresist or polymer, to protect the layers inside the trench from etching, and the protective layer is recessed below the top level.
21. The $D_{i+1}$ layer is selectively etched at the area that is not protected by the protective layer at the top of the trench to expose layer $M_{i+1}$.
22. Layer $M_{i+1}$ is selectively etched at the area that is not protected. Over-etch is applied to layer $M_{i+j}$ to create recesses.
23. The protective layer is removed.
24. An insulating layer is deposited by ALD to a thickness that equals or exceeds half the thickness of $M_{i+1}$ to seamlessly close the recesses, and a selective etch removes the insulating layer from all the area with the exception of the recesses to create insulating plugs.
25. Processes 13–24 are repeated to add more capacitors to the stack. A sacrificial layer, if applied in process 19, is removed prior to the next iteration. Each iteration of processes 13–24 adds two additional capacitors that are subsequently completed in processes 26–29 with parallel interconnection. For example, CLASS³ is fabricated with 0 (zero) iterations of sequences 13–24, CLASS⁵ is fabricated with one iteration, CLASS⁹ is fabricated with three iterations, etc.
26. A protective layer, such as a photoresist or polymer, is applied and recessed to protect the films inside the trench to a level higher than the level that was protected before at process 8 and iterated process 20.
27. The top insulation over conductive layer $M_2$ is selectively etched to expose $M_2$ while the other conductive layers are protected by the plugs and protective photoresist or polymer layer. In case of a large capacitor superstack, improved electrode resistance may be accomplished by exposing additional even numbered electrode(s) such as $M_4$, $M_6$, etc. Typically, all even numbered layers can be exposed at the top with a single etch step.
28. The protective layer is removed and the sacrificial layer, if applied in lastly iterated process 19, is removed.
29. A conductive layer $M_{i+2}$ (where i+1 is the lastly deposited conductive layer) is deposited to complete the stack of i+1 capacitors interconnected in parallel by creating an additional capacitor over $D_{i+1}$ and contacting $M_2$ (or $M_2$, $M_4$, etc., if other even numbered conductive layers are exposed at the top during step 27). This $M_{i+2}$ layer, together with the even numbered conductive layers, serves as one capacitor electrode while the stack of odd numbered conductive layers serve as the other capacitor electrode.

Based on the foregoing description, it will be appreciated that the CLASS capacitor technology of the present invention may be implemented with a combination of $Al_2O_3$ dielectric layers and a W conductive layer. By way of example, a capacitor stack of four nm $Al_2O_3$ layers and five nm of W layers in the configuration Si/ONO/W/$Al_2O_3$/W/$Al_2O_3$/W may be implemented. Such a configuration is seen to provide an approximated capacitance gain of 150 fF added to the 35 fF of the first conventional ONO capacitor when constructed over a DT with 0.13 $\mu$m feature size. By way of further example, when 5 nm of $Al_2O_3$ is used, an additional 120 fF capacitance increase is exhibited. Further, structures with four nm to five nm of $Al_2O_3$ have demonstrated leakage current densities that are substantially lower than the limit of $10^{-8}$ A/cm² that was set equivalent to ~1 fA/cell leakage current specifications. In addition, interfacing W with silicon over a small contact area with refractory metal-silicide or nitridized silicide was proven to integrate well with existing DT DRAM technology. Reasonable implementations of the CLASS capacitor technology of the present invention thus can achieve ×4.4–5.3 of capacitance enhancement with high-K and conductive layer combinations that are proven to be compatible with conventional memory fabrication process flows.

Accordingly, using Si/ONO/W/$Al_2O_3$ CLASS capacitors provides for a smooth evolution from 512 Mb DT technology into 8 Gb technology and beyond. By way of example, in the case that the electrode formed by conductive layer 22 (FIG. 17) is a 5 nm electrode formed from W, the resistance of electrode 22 is given by Equation 8 below:

$$R = \zeta \frac{L}{2(a+b)t} \quad (8)$$

where $\zeta$ is the resistivity of the conductive film, L is the DT depth, a and b are the trench small and large rectangular dimensions, respectively, and t is the thickness of the conductive film. Accordingly, the resistance of conductive layer 22 is estimated to be approximately one KΩ for a five nm layer with conservatively assumed $\zeta$~100 $\mu$Ωcm resistivity when constructed into a DT with 0.13 $\mu$m feature size. This resistance is at the low end of the specifications as detailed in the description of prior art set forth above. Therefore, according to Equation 4, conductive layers 16 and 22 may be further reduced in thickness down to two nm and possibly even below, if necessary, without straying outside of the specifications. Such capacity for size reduction creates the ability to stack a CLASS capacitor of the present invention into the ever increasingly narrow DTs called for by future designs. Continuity of the ALD films employed by the present invention is unique at this thickness range and key feature that allows CLASS capacitors of the present invention to be operable in the DTs called for by such further designs. In addition, since bulk resistivity of W is approximately five $\mu$Ωcm, further CLASS technology supports reduction of W layer resistivity down to the ten $\mu$Ωcm to twenty $\mu$Ωcm range, and thus enables CLASS designs with 2 nm to 2.5 nm thickness of conductive layers deposited into 0.045 $\mu$m DT features. By way of example, the resistance of conductive layer 22 (FIG. 17) is estimated at approximately five KΩ and one KΩ for a two nm conductive layer 22 in a CLASS capacitor fabricated into a 0.045 $\mu$m (the year 2010) DT for $\zeta$~100 $\mu$Ωcm and ~20 $\mu$Ωcm, respectively.

As DRAM technology progresses, it becomes necessary to stack the CLASS capacitors of the present invention into increasingly narrow DT features. For example, a 8 Gb capacitor is projected to have a 0.045 $\mu$m node size and to use a DT that is only 0.092 μm at the narrow axis of the bottle. Further, a 64 GB capacitor is projected to have a node size of 0.022 μm and will be based on a 0.044 μm narrow axis size. The process flow of the embodiments of the CLASS³ capacitor of the present invention described above is based on initial stacking of one conductive layer, one dielectric layer and one sacrificial layer into the DT. By way of continuing example, assuming a dielectric layer of approximately four nm thick, a conductive layer of approximately two nm thick and a sacrificial layer of approximately five nm thick, the DT must initially accommodate twenty-two nm of thin film. Accordingly, the 0.044 μm DT of the 64 Gb capacitor will be over fifty percent full at its narrow axis in FIG. 3 above. Accordingly, to enable stacking of further layers within the DT, the present invention further provides for the deposition of layers below collar level to avoid completely filling the narrow axis of the DT and the collar which is the narrowest point of the DT.

Figure 42:
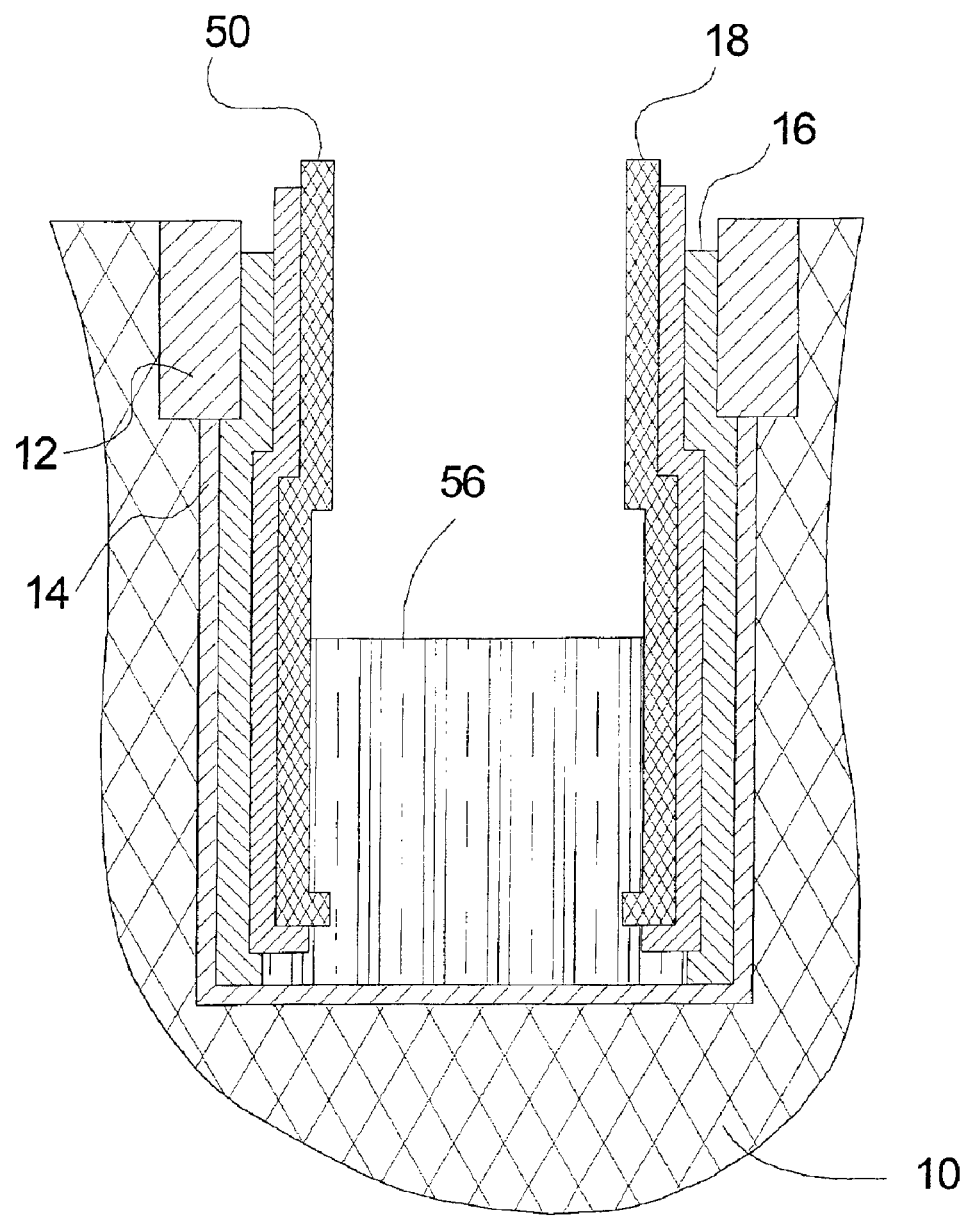
FIGS. 42–44 illustrate another preferred embodiment of the invention in which a multilayer capacitor is fabricated below the collar level in the trench of FIG. 1.
Figure 43:
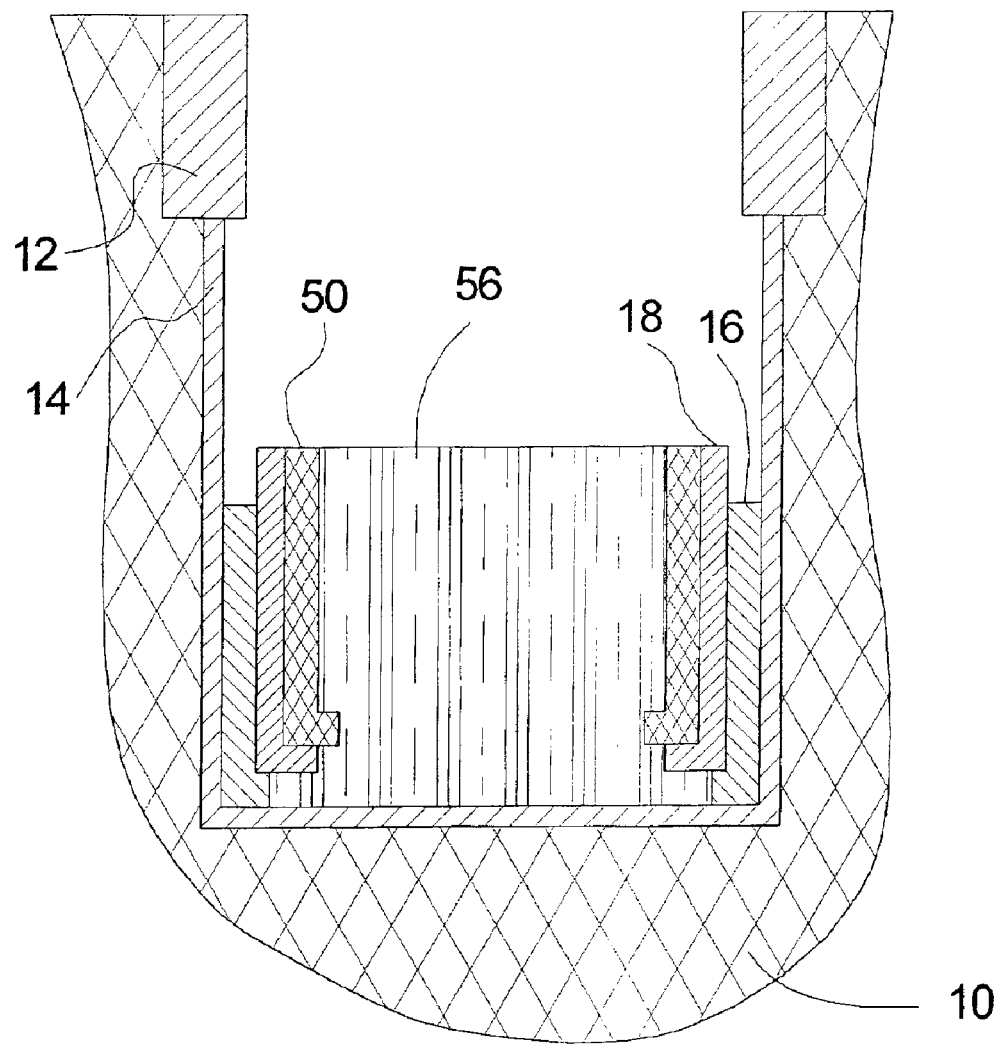
Figure 44:
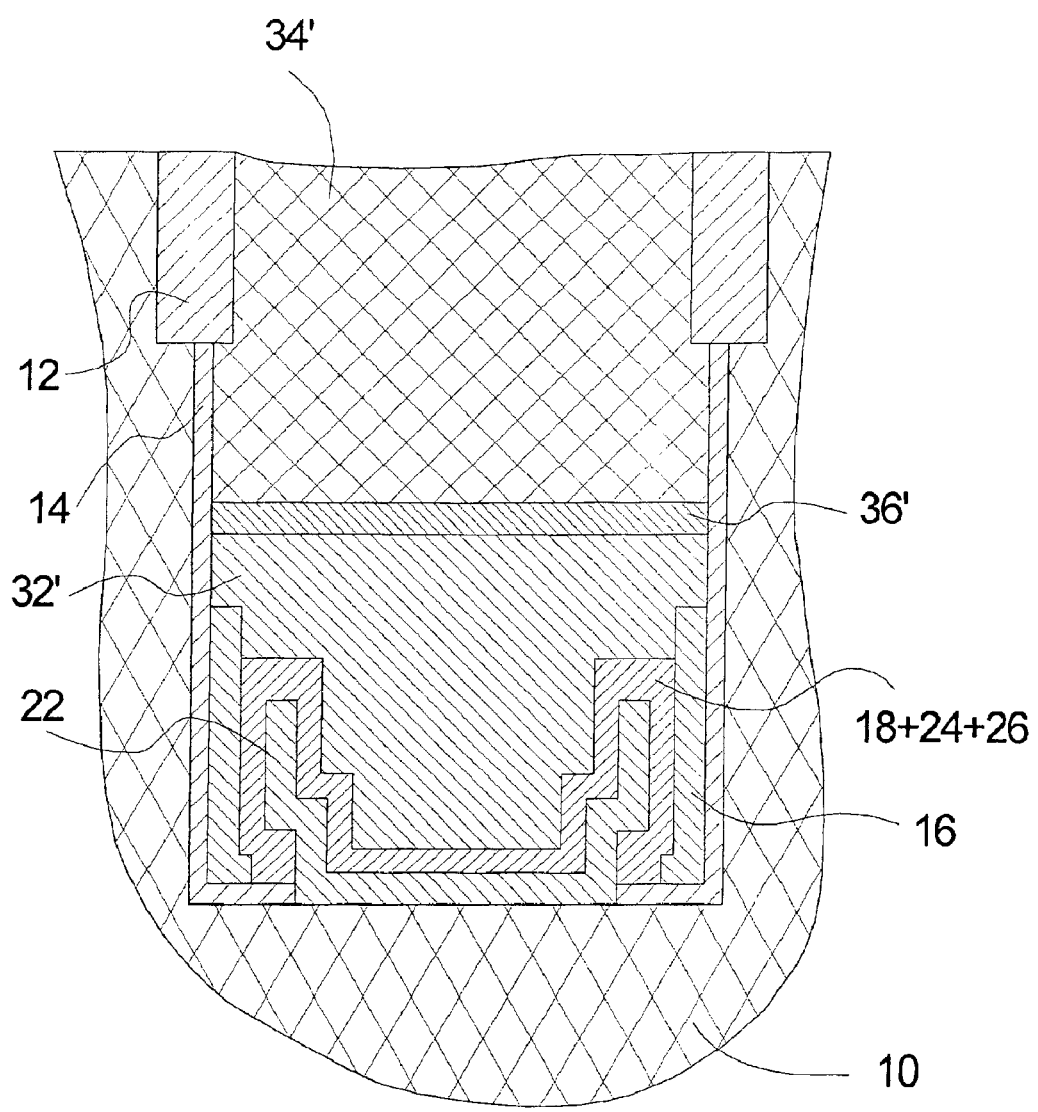

In particular, the present invention provides for process steps, illustrated in FIGS. 42–44, used to recess the initial layers down below the collar. As shown in FIG. 42, a CLASS³ capacitor has been processed to the point described above with regard to FIG. 4. At that point, a layer 56 of photoresist or polymer material is applied to fill into the DT down to below the level of the top of collar 12. Subsequently, layer 56 is recessed down to below the level of the bottom of collar 12 using conventional techniques. As shown in FIG. 43, conductive layer 16, dielectric layer 18 and sacrificial 50 are then etched down below the level of the bottom of collar 12 using conventional techniques. Following this act, and as shown in FIG. 44, in the next act, layer 56 is removed through conventional methods and the process flow is continued similarly to the process flow that is described above with regard to FIGS. 5–16. The final construction of the capacitor is confined to below the level of the bottom of collar 12. As shown in FIG. 44, mediation layer 36' and capacitor layer 34' are used to make contact with the active area of the memory cell as described above with regard to FIG. 16. In an alternative embodiment, the confinement to the area below the collar can be similarly carried out earlier in the process flow, for example, in connection with the processes described above with regard to FIGS. 2 and 3, to further reduce the risk of plugging the collar area. By way of example, the final layout of the CLASS³ capacitor shown in FIG. 44 occupies a minimum of 0.026 μm out of the 0.044 μm of the trench's narrowest dimension in the bottle area but confined to below the narrower 0.026 μm collar 12. The 0.026 μm wide collar does not pose any projected obstacle for reliable implementation of such a CLASS³ capacitor when the CLASS³ capacitor is kept below collar level.

As described above, capacitors of the present invention are formed by a process in which conductive films are recessed and then plugged with an insulating dielectric layer to form a conformal, seamless insulating layer of dielectric material around the conductive layer of the capacitor. As noted above, the layers of dielectric material are preferably deposited using ALD, or another equivalent deposition method, that is capable of seamlessly filling the recesses in the conductive electrode layer.

Figure 45:
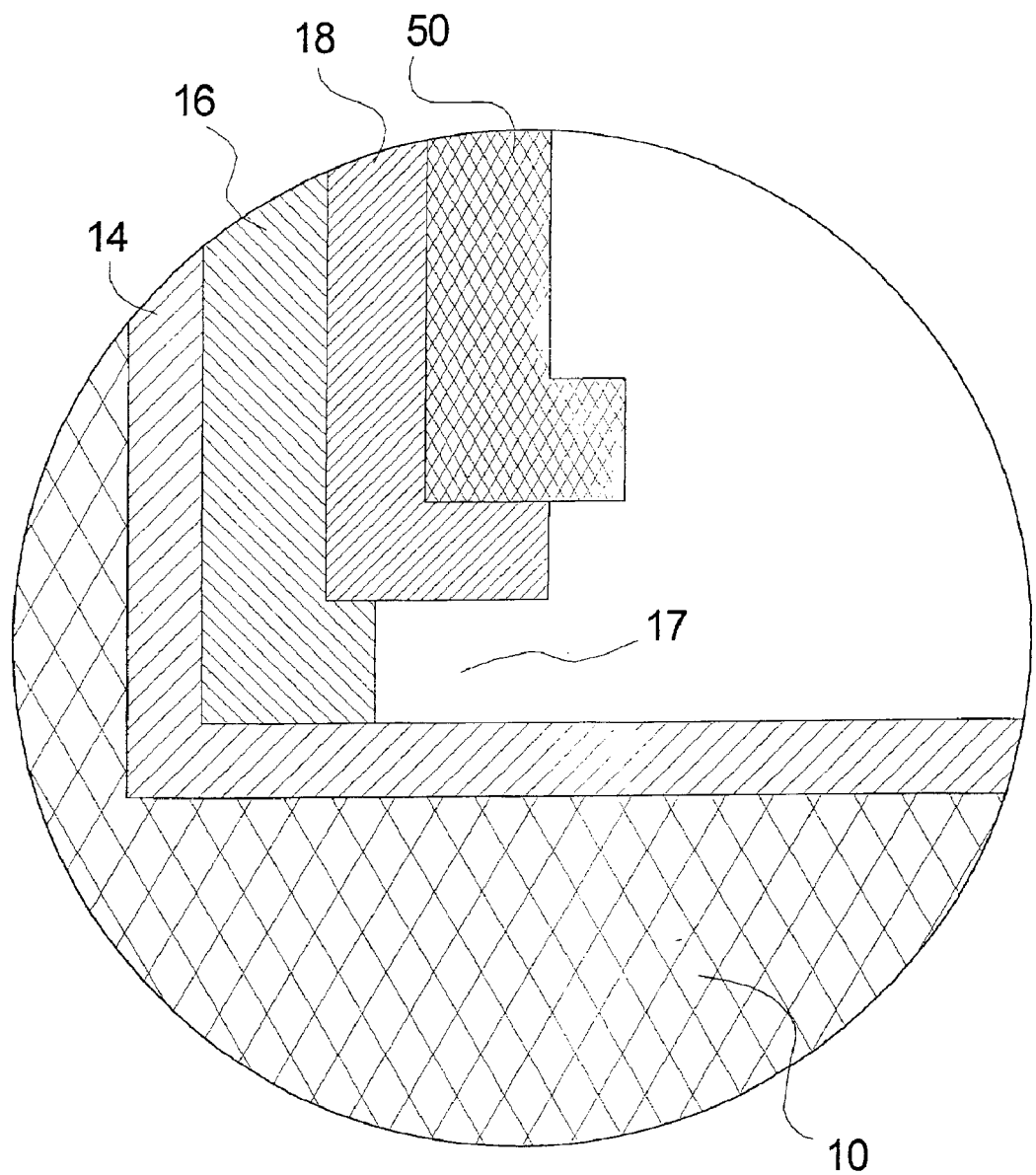
FIGS. 45–50 illustrate the preferred process of FIGS. 4–6 in more detail, illustrating how atomic layer deposition is extraordinarily effective in plugging a recess formed in an integrated circuit.
Figure 46:
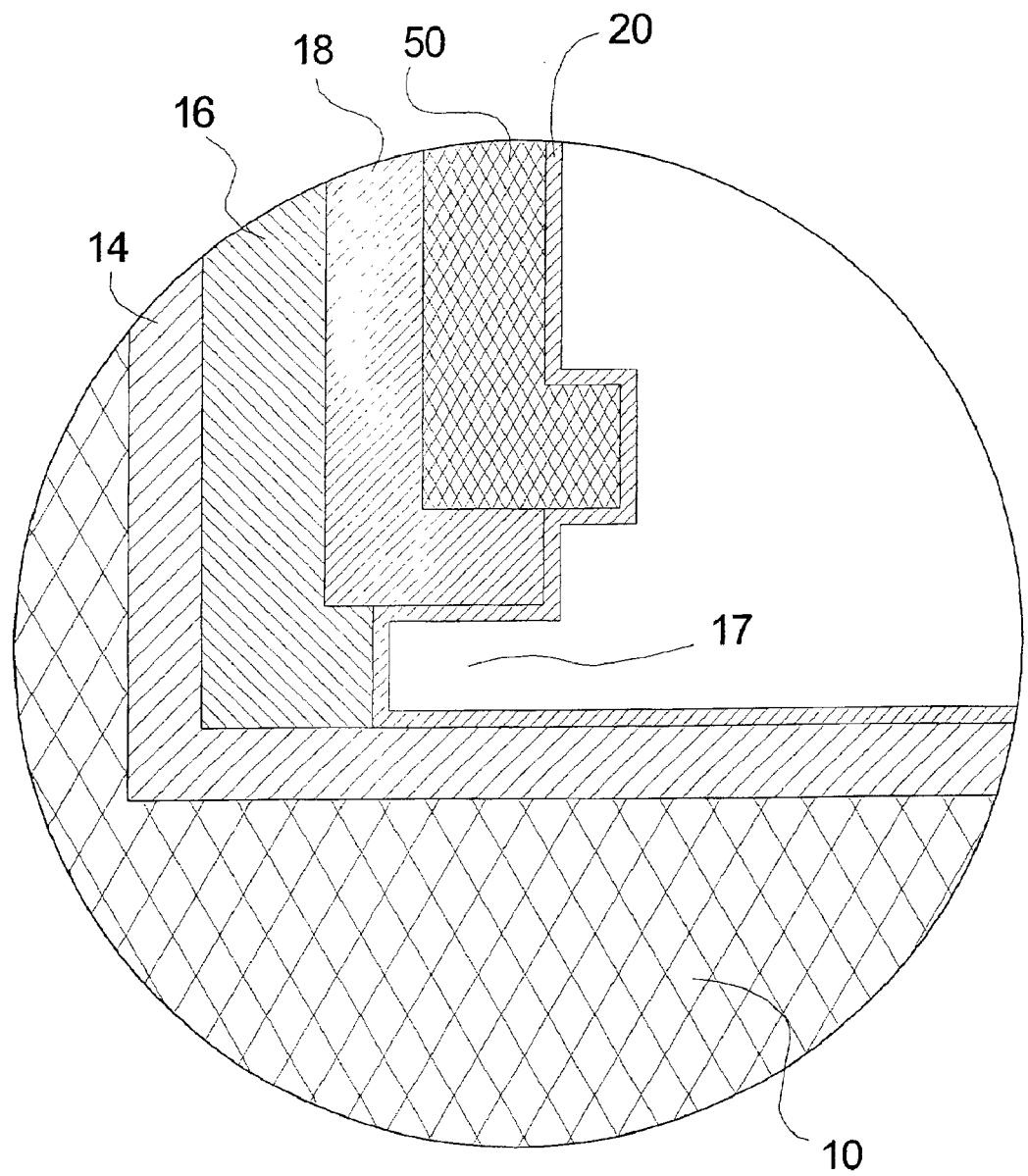
Figure 47:
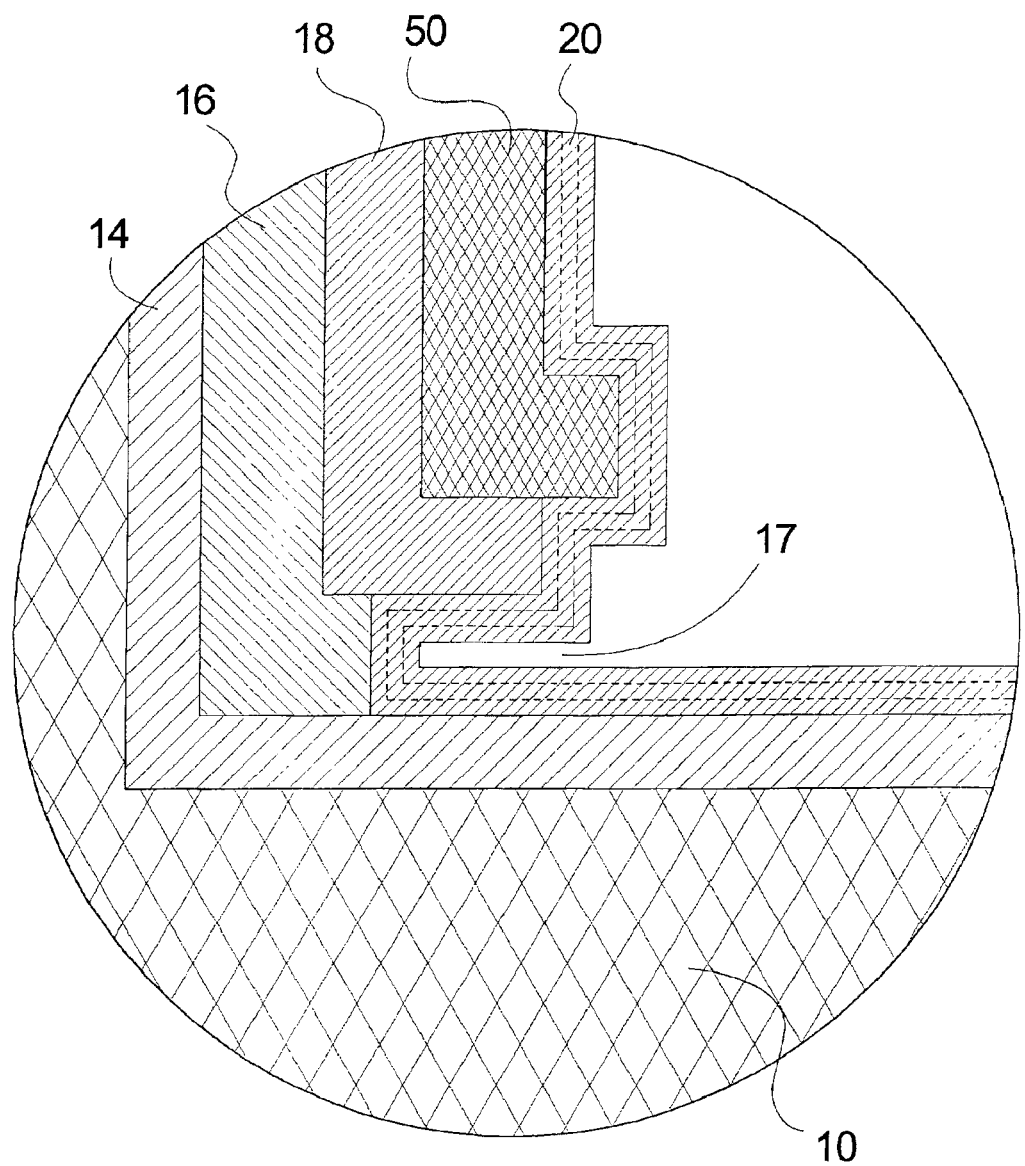

In the case of ALD, thin film layers are individually deposited into the recess. Together, these layers serve to form a highly conformal seamless layer that caps the recess and completes an insulating layer of dielectric material surrounding the conductive layers of the capacitor. An enlargement of a detail of FIGS. 4–6 is shown in FIGS. 45–51, including figures detailing certain processes which were not illustrated fully in the earlier figures. As illustrated in FIG. 45, a recess 17 has been formed in conductive layer 16. As shown in FIG. 46, an initial layer of dielectric film 20 is grown over the entire surface area of the capacitor by ALD. The use of ALD enables a layer of dielectric film 20 to completely cover the surface area of the existing structure, including recess 17. The thickness of dielectric film 20 is grown through the successive deposition of additional layers of dielectric film. As shown schematically in FIG. 47, dielectric film 20 is grown to a thickness of slightly less than the width of recess 17. It will be appreciated by one of average skill in the art that the layer-by-layer deposition of dielectric film 20 is schematically illustrated in the figures by the dashed lines that separate dielectric film 20 into a layered structure. However, it will further be appreciated that, due to the conformal nature of ALD films, in practice dielectric film 20 forms a single seamless, conformal film, regardless of the number of discrete layers of dielectric material deposited to form dielectric film 20.

Figure 48:
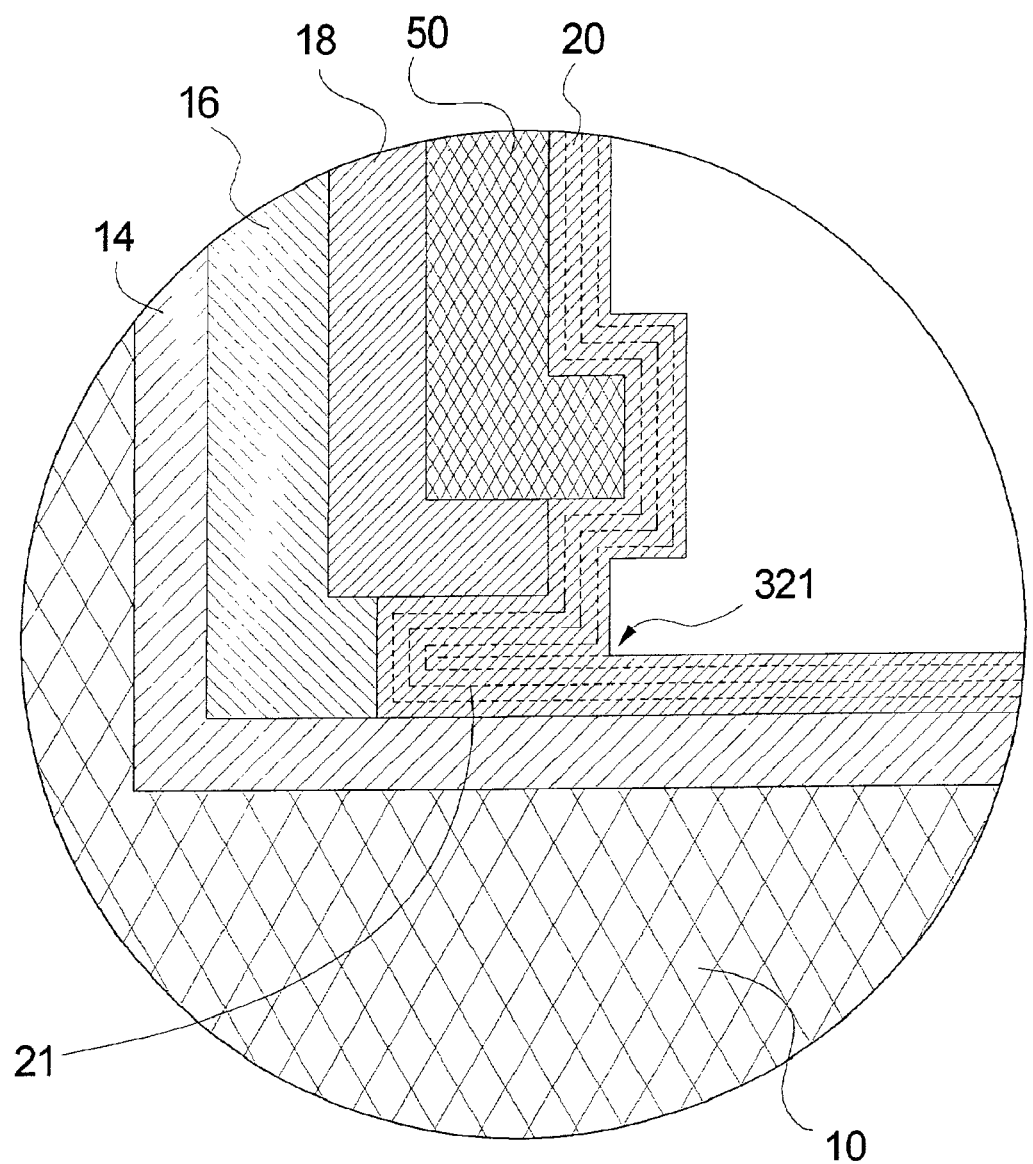
Figure 49:
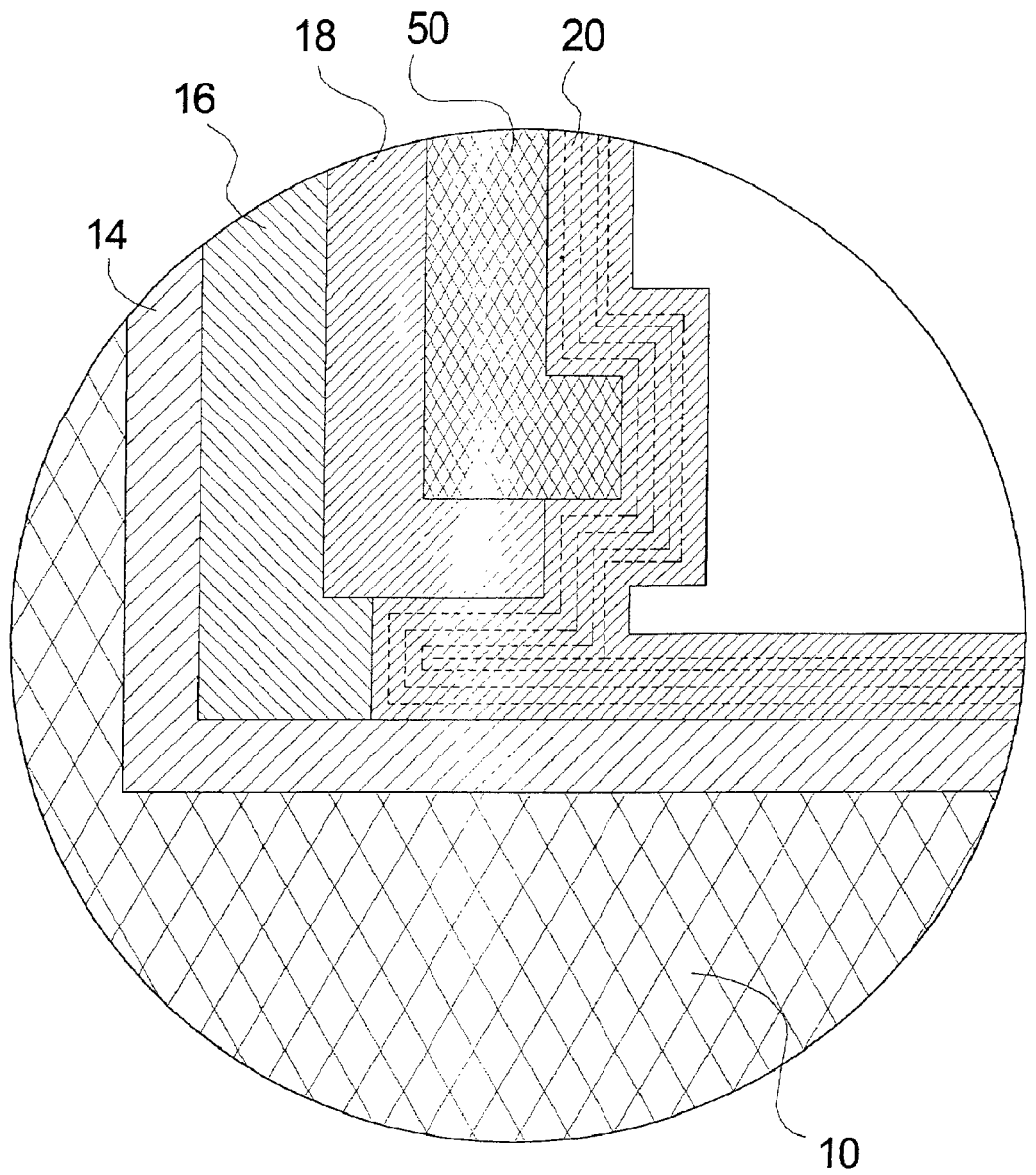
Figure 50:
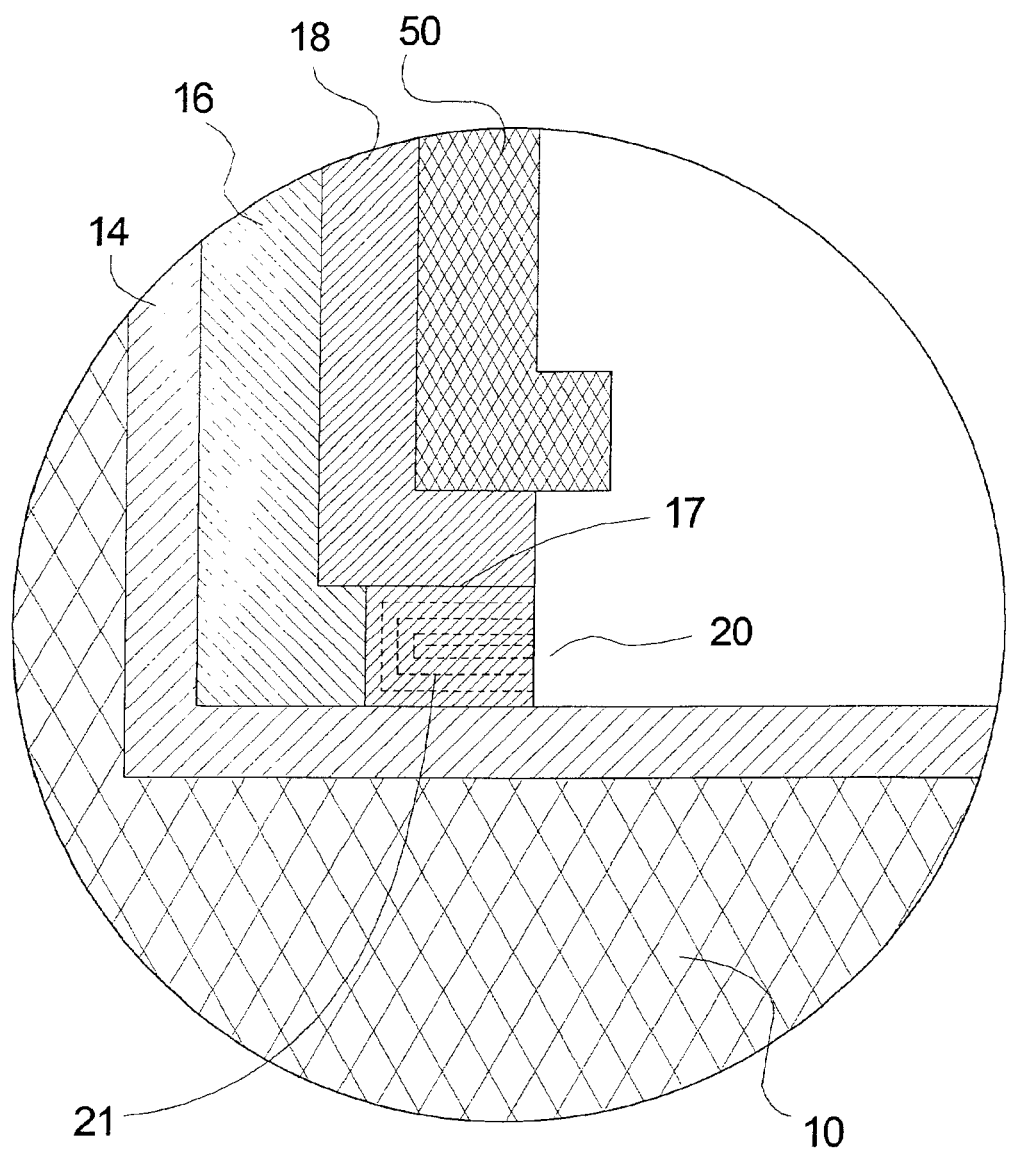

As shown in FIG. 48, dielectric film 20 is eventually grown to a thickness that seamlessly closes recess 17. Accordingly, it will be appreciated that dielectric film 20 is grown to a thickness that is equal to approximately half the width of the recess, or approximately half the thickness of conductive layer 16 to form plug 21. A closure therefore forms between the portions of dielectric film 20 that covers each side of the recess. The position of the closure is represented by arrow 321. Subsequent layers of dielectric material may be further deposited on the surface of dielectric film 20. After recess 17 has been filled, each such successive layer will be conformally deposited to form an additional thickness over the entire area of the existing dielectric film 20, as shown in FIG. 49.

Figure 51:
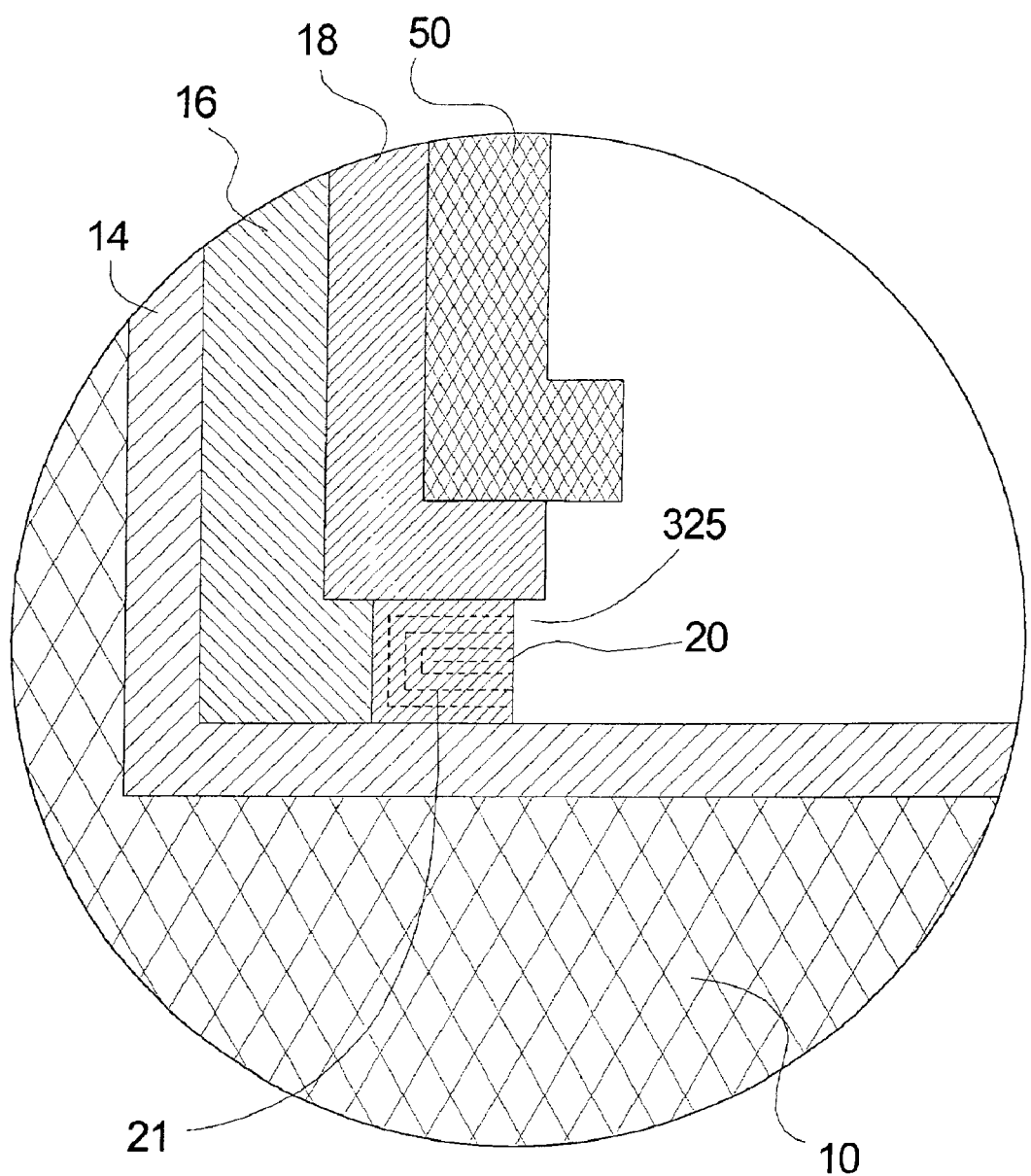
FIG. 51 illustrates another embodiment of the etch process of FIG. 50, including an over-etch.

As further described above, and as shown in FIG. 50, dielectric film 20 is etched to remove the full thickness of dielectric film 20. In particular, dielectric film 20 is removed from the entire area of the wafer with the exception of portions 21 of dielectric layer 20 lying within and plugging recess 17, where the thickness of dielectric layer 20 is substantially greater than in the surrounding areas. As illustrated in FIG. 51, over-etch is applied to remove a portion 325 of dielectric layer 20 within the recess, forming a slight overhang by layer 18. This process may be necessary to ensure complete removal of dielectric layer 20 from all the area with the exception of plug 21, since some etch rate variability must be assumed.

One of ordinary skill in the art will appreciate that in the sequence illustrated in FIGS. 45–51, dielectric layer 20 is represented as being divided into layers. For the sake of simplification and illustration, each layer is shown to be significantly thicker than the single atomic layers deposited by ALD. In actuality, the thickness of conductive layer 16 is on the order of 5 nm. In the embodiment illustrated in the figures, dielectric layer 20 is recessed to approximately twice its thickness (approximately ten nm) to create a robust process flow. In such an embodiment, recess 17 in conductive layer 16 has a rectangular shape with dimensions ranging between 200×400 nm to 40×80 nm (folded around the trench walls). Accordingly, one of average skill in the art will appreciate that the conductance of recess 17 is given by Equation 9 below:

$$C = 19.4 \left(\frac{T}{M}\right)^{1/2} \left(\frac{A^2}{BL}\right) \tag{9}$$

where T~600° K is the temperature; M~100 gm./mole is the molecular mass of the ALD precursor; A is the cross-sectional area of the recess opening, and B is the periphery of the recess; L is the depth; C is the conductance; and where C is given in liter/sec, A, B and L are given in cm.

One of average skill in the art will further appreciate that an important indicator of the ability of ALD precursors to penetrate into the recess formed by conductive layer 16 is the ratio between the ALD dose time and the time delay needed to transport the precursor into the recess. The time delay for precursor arrival to the end of the recess is over-estimated by the ratio between the recess volume and the conductance of the precursor gas, deep into the end of the recess. The volume of the recess (in liters) is given by Equation 10 below:

$$V = AL/1000 \tag{10}$$

Accordingly, in the example of a 200×400 nm DT, where A~$6 \times 10^{-11}$ cm$^2$ and B~$2.4 \times 10^{-4}$ cm at the initial stages of dielectric layer 20 deposition, the delay time is given by Equation 11 below:

$$\tau = \frac{BL^2}{19400A}\left(\frac{M}{T}\right)^{1/2} \tag{11}$$

Accordingly, an insignificant precursor delivery delay is calculated at approximately eighty-two psec. It will be appreciated by one of average skill in the art that, as the recess is approaching closure, the growth of dielectric layer 20 will be observed to narrow the width of the recess down to approximately 0.2 nm. At such a width, A~$2.4 \times 10^{-12}$ cm$^2$ and B~$2.4 \times 10^{-4}$ cm are estimated values and precursor delay is extended up to approximately two nsec.

Even in the event that the precursor delivery delay is extended to approximately two nsec., such an extended delay time is still considerably short compared to a typical chemical dose time of approximately one hundred msec. Similarly, precursor delivery delay time will extend from eighty-two psec into approximately two nsec upon closing the recess from five nm down to 0.2 nm for the case of a 40×80 nm DT, since, to first approximation, the delay time is not dependent on the dimensions of the DT.

Chemical delivery into narrow features depends also on the total exposure of the feature openings to the ALD precursors. Accordingly, the exposure is given by Equation 12 below:

$$\Gamma_1 = \phi A \Delta t \tag{12}$$

where $\phi$ is the flux of ALD precursor molecules impinging on the surface of the substrate and $\Delta t$ is the chemical dose time.

Inside the narrow features, the exposure is given by Equation 13 below:

$$\Gamma_2 = \phi(A+BL)\Delta t \approx \phi BL \Delta t \tag{13}$$

In most cases, the area contribution from the bottom end of the feature (trench or recess) is negligible, especially when the feature is approaching closure. As shown above, under all relevant cases, delay of ALD precursor delivery into the recesses that are formed during the process flow of the present invention is insignificant. Therefore, it is approximated that the concentration of ALD precursor inside the recess is depth independent during the chemical dose.

Under a typical ALD chemical dose, the flux of precursor chemicals is $\phi \sim 10^{19}$ molecules/cm$^2$. The number density of active sites on typical ALD intermediate surfaces is ~$10^{14}$/cm$^2$. Thus, in such an example, the number of active sites on the internal area of the recess is given by Equation 14 below:

$$N = 10^{14}(A+BL) \approx 10^{14} BL \tag{14}$$

When the recess approaches closure, the area opening, A, is given approximately by A~$10^{-8}$B (with ~0.2 nm recess). Accordingly, the integrated number of impinging ALD precursor molecules ($\Gamma_1$) decreases. However, the total number of active sites (N) decreases only slightly and to first approximation can be assumed independent of the reduction of A. Using the values of B determined for the two extreme DT cases discussed above, the $\Gamma_1$ values at the last ALD cycle that is necessary to close the recesses are $2.6 \times 10^6$ and $4.8 \times 10^5$ for the 200×400 nm and 40×80 nm DTs, respectively. Similarly, the N values are $2.4 \times 10^4$ and 4800 for the 200×400 nm and 40×80 nm DTs, respectively. The large $\Gamma_1/N \sim 100$ ratio indicates that the ALD reaction during the seam closure cycle of the recess is far from depletion and therefore does not require extended ALD exposures.

The ALD reaction rates depend on the reactive sticking coefficient, $\sigma$. ALD reactions typically have $\sigma$ values in the range from 0.001–0.03. Accordingly, during chemical dose, the reaction eliminates the reactive sites according to Equation 15 below:

$$N_t = N \exp-\left(\frac{\sigma \phi BL}{N}t\right) \tag{15}$$

Thus, at the end of a one hundred msec chemical dose, the ALD reactions that are necessary to close up the recessed gap are executed to >99.995% completion in the cases of 200×400 nm and 40×80 nm DTs even with the smallest $\sigma \sim 0.001$.

Based on the foregoing description of the ALD reactions within the recess, one of average skill in the art will appreciate that, considering the possibilities of precursor delivery delay, depletion and chemical kinetics, seamless closure of the recesses formed in conductive layer 16 is well within the capabilities of high throughput ALD processes.

As discussed above, an implementation of a CLASS$^3$ capacitor of the present invention with, for example, a Si/ONO/W/Al$_2$O$_3$/W/Al$_2$O$_3$/W stack, can extend memory technology for up to at least the 8 Gb technology node. Likewise, implementation of a CLASS$^3$ capacitor of the present invention into a 0.092×0.184 $\mu$m rectangular DT with a 0.054×0.108 $\mu$m elliptical collar poses no significant challenge for the ALD deposition methods employed by the present invention. Accordingly, CLASS$^3$ capacitors of the present invention offer a DRAM capacitor design with projected ×16 extension of memory density. Further extendibility of simple CLASS$^3$ capacitor design into the 32 Gb and 64 Gb generations is likewise projected given progress in a DRAM cell architecture to improve area utilization efficiency and further development of high-K dielectrics able to be deposited by ALD which provide further capacitance enhancement. An example of improved area utilization includes VERI BEST architecture, which may moderate capacitor area shrinkage by 20%–90%. Examples of ALD materials include the substitution of ZrO$_2$ or HfO$_2$ for Al$_2$O$_3$ which may extend the capacitance enhancement of CLASS$^3$ capacitors of the present invention from ~×5 to the ×10–15 range.

Overall, the implementation of the CLASS technology of the present invention into DT capacitors enables a smooth extension of memory technology. Preferably, the present invention enables the implementation of new layers without introducing new elements into the fab environment. Likewise, the present invention limits the need for significant changes in process flow by avoiding the need to have direct Si-high-K contact. Alignment difficulties are also circumvented by a self-aligned process. Layers are deposited with ALD that ultimately conforms to most challenging aspect ratios and narrow features. Accordingly, the CLASS technology of the present invention offers an evolutionary path from 512 Mb to 8 Gb and a possible moderate change of dielectric material upon further extension up to 64 Gb and beyond.

Low power DRAM is advantageous for portable electronics. It will be appreciated by one of ordinary skill in the art that the CLASS capacitor of the present invention can be implemented to increase capacitance density of low power DRAM, and thus retention time, by increasing the thickness of the layers used to construct the capacitor. In particular, thicker layers of ONO and high-K dielectric may be used in the stack to trade capacitance density enhancement for much suppression of capacitor leakage current. By way of example, 512 Mb low power DRAM devices with a 256 msec refresh interval or even longer refresh intervals can be fabricated using $Si/ONO/W/Al_2O_3/W/Al_2O_3/W$ $CLASS^3$ capacitor designs with 6 nm ONO and 7 $\mu$m $Al_2O_3$ dielectric layers in 0.17 nm design DTs.

It will further be appreciated that low power memory represents another application where the ability of the CLASS design of the present invention provides a significant capacitance density enhancement that is transparent to memory fabrication process flow.

There has been described a method and structure for fabricating integrated circuits with capacitors having greatly enhanced capacitance per unit area. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, the methods may be used to form capacitors in other circuits than those mentioned. It is also evident that many of the processes, such as the method of filling recesses, may be used in integrated circuit components other than capacitors. Also it is evident that the processes recited may in some instances be performed in a different order. Or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

I claim:

1. A method of fabricating an integrated circuit, said method comprising:
   forming a multilayer capacitor comprising a stack of N+1 conductive thin film electrodes interleaved with N thin film dielectric layers, wherein N is an integer equal to two or greater;
   wherein said forming comprises:
   etching one of said thin film layers to form a recess having a width substantially equal to the film thickness of said one of said thin film layers; and
   filling said recess using atomic layer deposition.

2. A method as in claim 1 wherein said forming comprises forming one of said dielectic layers utilizing said atomic layer deposition.

3. A method as in claim 1 wherein said etching further comprises;
   etching one of said conductive thin film electrode layers to form a recess having a depth substantially equal to the film thickness of said one of said conductive thin film electrode layers.

4. A method as in claim 1 wherein said atomic layer deposition comprises depositing a filling layer having a thickness equal to one-half the width of said recess, while filling said recess.

5. A method as in claim 4, wherein said forming further comprises etching said filing layer to substantially remove it from all of said integrated circuit except said recess.

6. A method as in claim 1 wherein said forming comprises fabricating each of said N+1 conductive electrode layers and each of said N dielectric layers using a self-aligned process.

7. A method as in claim 1 wherein said forming comprises fabricating said N+1 conductive electrode layers and said N dielectric layers without using a photolithographic process.

8. A method as in claim 1 wherein said method further comprises forming a chamber having an open end, said chamber having a width substantially equal to the width of said open end and a depth extending away from said open end, wherein the ratio of said depth to said width is equal to four or greater, and
   said step of forming comprises forming said multilayer capacitor in said chamber.

9. A method as in claim 8 wherein said ratio is 25 or more.

10. A method as in claim 8 wherein said ratio is 50 or more.

11. A method as in claim 8 wherein said chamber is a trench formed in said integrated circuit.

12. A method as in claim 11 wherein said method further comprises providing a semiconductor substrate, and said forming comprises forming said trench in said semiconductor substrate.

13. A method as in claim 12 wherein said substrate is silicon and said forming comprises fabricating a silicon dielectric comprising silicon in contact with said silicon semiconductor substrate.

14. A method as in claim 13 wherein said silicon dielectric comprises an oxide/nitride/oxide (ONO) structure.

15. A method as in claim 13 wherein the only dielectric in contact with said silicon substrate is said silicon dielectric.

16. A method as in claim 13 wherein at least one of said N dielectric layers comprises a high dielectric constant material.

17. A method as in claim 16 wherein said one of said N dielectric layers comprises an oxide selected from the group consisting of $Al_2O_3$, $ZrO_2$, and $HfO_2$.

18. A method as in claim 13 wherein said forming comprises fabricating a first of said N+1 conductive electrodes in contact with silicon only in the horizontal area at the bottom of said trench.

19. A method as in claim 18 wherein said method further comprises forming an ohmic contact between said first conductive electrode and said silicon semiconductor substrate.

20. A method as in claim 13 wherein said method further comprises fabricating a polysilicon element in electrical contact with a second of said conducting electrode layers, and wherein said contact area between said polysilicon layer and said second conducting electrode is limited to a horizontal area near the top of said trench.

21. A method as in claim 20 wherein said method further comprises fabricating a transistor and said polysilicon element connects said second conductive electrode with said transistor.

22. A method as in claim 1 wherein said forming comprises forming said multilayer capacitor in a sufficiently small area of said integrated circuit such that the value of C/∈ is greater than or equal to 500 femtoFarads per square micron, where C is the capacitance of said multilayer capacitor and ∈ is the effective dielectric constant of said dielectric layers.

23. A method as in claim 22 wherein C/∈ is greater than or equal to 1000 femtoFarads per square micron.

24. A method as in claim 22 wherein C/∈ is greater than or equal to 1500 femtoFarsds per square micron.

25. A method as in claim 1 wherein said forming a stacked structure comprising the following layers in sequence: silicon/silicon-oxide/metal/insulator/metal/insulator/metal, wherein said N+1 conductive electrodes comprise said metal layers and said N dielectric layers comprise said insulator layers.

26. A method as in claim 25 wherein said forming a stacked structure comprises forming a stacked structure comprising the following layers in sequence: silicon/silicon-oxide/metal/insulator/metal/insulator/metal/insulator/metal/insulator/metal.

27. A method as in claim 1 wherein said forming comprises electrically connecting the odd numbered ones of said N+1 conductive electrodes and electrically connecting the even numbered ones of said N+1 conductive electrodes.

28. A method as in claim 1 wherein at least one of said N dielectric layers comprises a high dielectric constant material.

29. A method as in claim 28 wherein said one of said N dielectric layers comprises an oxide selected from the group consisting of $Al_2O_3$, $ZrO_2$, and $HfO_2$.

30. A method as in claim 1 wherein said forming comprises depositing each of said N dielectric layers over the preceding conductive electrode layer without exposing said preceding conductive electrode layer to atmosphere.

31. A method as in claim 1 wherein one of said N+1 conductive electrodes comprises tungsten.

32. An integrated circuit as in claim 31 wherein all of said N+1 conductive electrodes comprise tungsten.

33. A method as in claim 31 wherein one of said N dielectric layers comprises an oxide selected from the group consisting of $Al_2O_3$, $ZrO_2$, and $HfO_2$.

34. A method as in claim 1 wherein said forming comprises depositing each of said N dielectric layers over the preceding metal electrode layer without exposing said preceding conductive electrode layer to atmosphere.

35. A method of fabricating an integrated circuit comprising:
   forming a thin film conducting layer;
   removing an exposed end of said thin film conducting layer to form a recess having an open end and having a width substantially equal to the film thickness of said thin film conducting layer; and
   filling said recess using atomic layer deposition.

36. A method as in claim 35 wherein said step of forming comprises forming said recess with said open end facing upwards.

37. A method as in claim 35 wherein said step of forming comprises forming said recess with said open end facing in a horizontal direction.

38. A method as in claim 35 wherein said recess has a width across said open end and said atomic layer deposition comprises depositing a filling layer having a thickness equal to one-half of said width of said recess, while filling said recess.

39. A method as in claim 38 and further comprising etching said filling layer to substantially remove it from all of said integrated circuit except said recess.

40. A method as in claim 39 wherein said etching comprises an isotropic etch.

41. A method as in claim 35 wherein said forming comprises depositing a second layer over said thin film conducting layer; exposing a portion of said thin film conducting layer; and etching said thin film conducting layer to form said recess having a depth and width substantially equal to the thickness of said thin film conducting layer.

42. A method of fabricating an integrated circuit as in claim 15, wherein said filling said recess comprises:
   depositing atomic layers in said recess until the thickness of said atomic layers is substantially one-half of the width of said recess.

43. A method of fabricating an integrated circuit, said method comprising:
   providing a substrate;
   creating a trench in said substrate;
   forming in said trench a multilayer capacitor comprising a stack of N+1 conductive electrodes interleaved with N dielectric layers, wherein N is an integer equal to two or greater, wherein said forming is a self-aligned process comprising:
   depositing one or more of said conductive electrode and dielectric layers in said trench while leaving a portion of said trench unfilled;
   plugging said unfilled portion of said trench with a protective sacrificial material;
   etching said sacrificial material and the upper portion of said deposited one or more layers; and
   removing said sacrificial material while leaving the unetched portion of said deposited one or more layers on the walls of said trench.

44. A method as in claim 43 wherein at least one of said N dielectric layers comprises a high dielectric constant material.

45. A method as in claim 43 wherein said plugging comprises filling said unfilled portion of said trench with said protective sacrificial material.

46. A method as in claim 43 wherein said deposited one or more layers comprises a first conductive electrode and a second conductive electrode and said method further comprises encapsulating said first conductive electrode to protect it from said etch.

47. A method as in claim 43 wherein said etching comprises:
   anistropically etching a horizontal portion of said sacrificial material to expose a horizontal portion of said one or more deposited layers while leaving a vertical portion on the walls of said trench protected.

48. A method of fabricating an integrated circuit including a multilayer capacitor comprising a stack of N+1 metal electrodes interleaved with N dielectric layers, wherein N is an integer equal to two or greater, said method comprising:
   providing a substrate;
   creating a trench in said substrate;
   forming in said trench a stacked structure comprising the following layers in sequence: silicon/silicon-oxide/metal/insulator/metal/insulator/metal, wherein said N+1 metal electrodes comprise said metal layers and said N dielectric layers comprise said insulator layers.

49. A method as in claim 48 wherein said forming a stacked structure comprises forming a stacked structure comprising the following layers in sequence: silicon/silicon-oxide/metal/insulator/metal/insulator/metal/insulator/metal/insulator/metal.

50. A method as in claim 48, and further comprising electrically connecting one of said metal electrodes and said silicon with an ohmic contact.

51. A method of fabricating an integrated circuit having a multilayer capacitor, said method comprising:
providing a silicon substrate;
preparing a trench in said silicon substrate;
with a substantially conformal technique such as atomic layer deposition (ALD), fabricating a four layer stack comprising a silicon based dielectric layer $D_1$, a conductive layer $M_1$, a dielectric layer $D_2$, and a sacrificial layer;
anisotropically etching said sacrificial layer from the bottom and the top of said trench, but not from a portion of the sides of the trench, to create openings to said $D_2$ layer;
selectively etching said $D_2$ layer and said M1 layer at said openings to create recesses; and
filling said recesses using a substantially conformal technique.

52. A method as claim 51 wherein filling comprises depositing said insulator to a thickness that exceeds half the thickness of said recesses.

53. A method as in claim 52 further comprising removing said insulator from all areas except said recesses leaving insulating plugs inside said recesses, thereby encapsulating said $M_1$ layer.

54. A method as in claim 53 and further comprising selectively removing said $D_1$ layer from bottom of said trench to expose said silicon substrate and forming a thermally stable contact layer on said silicon.

55. A method as in claim 54 and further comprising:
using a substantially conformal technique, forming a conductive layer $M_2$ and a dielectric layer $D_3$, with said conductive layer $M_2$ electrically connected to said contact layer;
depositing a second sacrificial layer and recessing it below the top of said trench to a level $L_1$;
selectively etching said layers $D_3$ and $M_2$ to create a second recess; and
removing said second sacrificial layer.

56. A method as in claim 55 and further comprising applying a second insulating layer using a substantially conformal technique to fill said second recess.

57. A method as in claim 56 and further comprising:
depositing a third sacrificial layer and recessing it below the top of said trench to a level $L_2$ that is higher than said $L_1$ level;
performing a selective etch to expose layer $M_1$; and
depositing a conductive layer $M_3$ to form an integrated capacitor with conductive layers $M_1$ and $M_3$ interconnected and layer $M_2$ connected to said substrate contact.

58. A method as in claim 57, and further comprising:
fabricating a metal/polysilicon mediation layer; and
forming a polysilicon layer in contact with mediation layer.

59. A method as in claim 58 wherein said trench includes a collar and said multilayer capacitor and said mediation layer are formed below said collar.

60. A method as in claim 51 further comprising, prior to formation of said $D_1$ layer, processing said silicon substrate to serve as a capacitor common plate, whereby the stack of silicon/$D_1$/$M_1$ forms a first integrated capacitor.

61. A method of fabricating an integrated circuit having a trench formed in a silicon substrate and a first electrical component formed in said trench, said electrical component including a metal electrode, said method comprising:
fabricating a mediation layer in contact with said metal electrode;
depositing a polysilicon layer in contact with said mediation layer; and
completing said integrated circuit to form a second electrical integrated circuit
component in contact with said polysilicon layer.

62. A method as in claim 61 wherein said fabricating a mediation layer comprises forming a material selected from the group consisting of a suicide and a metal nitride.

63. A method as in claim 61 wherein said metal electrode comprises a tungsten plug.

64. A method of fabricating an integrated circuit, said method comprising:
providing a partially completed integrated circuit wafer having a three-dimensional structure formed on it, said three-dimensional structure having horizontal surfaces and vertical surfaces;
depositing a sacrificial layer;
etching said sacrificial layer from said horizontal surfaces;
patterning said horizontal surfaces while said vertical surfaces remain protected by said sacrificial layer; and
removing said sacrificial layer.

65. A method as in claim 64 wherein said three-dimensional structure comprises a cavity and said horizontal surfaces include lower horizontal surfaces within said cavity and upper horizontal surfaces not within said cavity, and wherein
said depositing a sacrificial layer comprises filling said structure with a sacrificial material;
said etching comprises etching said sacrificial material from said upper horizontal surfaces while leaving said lower horizontal surfaces covered by said sacrificial layer; and
said patterning comprises patterning only said upper horizontal surfaces.

* * * * *

UNITED STATES PATENT AND TRADEMARK OFFICE
CERTIFICATE OF CORRECTION

PATENT NO. : 6,897,508 B2
DATED : May 24, 2005
INVENTOR(S) : Ofer Sneh

It is certified that error appears in the above-identified patent and that said Letters Patent is hereby corrected as shown below:

Title page,
Item [22], PCT Filed, delete "Aug. 23, 2002" and insert -- May 1, 2002 --.

Signed and Sealed this

Thirty-first Day of January, 2006

JON W. DUDAS
*Director of the United States Patent and Trademark Office*